(12) United States Patent
Shinohara et al.

(10) Patent No.: US 10,320,416 B2
(45) Date of Patent: Jun. 11, 2019

(54) DATA PROCESSING DEVICE AND DATA PROCESSING METHOD

(71) Applicant: SATURN LICENSING LLC, New York, NY (US)

(72) Inventors: Yuji Shinohara, Kanagawa (JP); Makiko Yamamoto, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 15/935,951

(22) Filed: Mar. 26, 2018

(65) Prior Publication Data

US 2018/0287633 A1 Oct. 4, 2018

Related U.S. Application Data

(63) Continuation of application No. 14/913,727, filed as application No. PCT/JP2014/073468 on Sep. 5, 2014, now abandoned.

(30) Foreign Application Priority Data

Sep. 20, 2013 (JP) ................................ 2013-196141

(51) Int. Cl.
*H03M 13/00* (2006.01)
*H03M 13/11* (2006.01)
(Continued)

(52) U.S. Cl.
CPC ..... *H03M 13/1102* (2013.01); *H03M 13/036* (2013.01); *H03M 13/1165* (2013.01);
(Continued)

(58) Field of Classification Search
CPC ..... H04L 1/0041; H04L 27/20; H04L 1/0068; H04L 1/0071; H04L 27/36;
(Continued)

(56) References Cited

U.S. PATENT DOCUMENTS

2004/0246888 A1 12/2004 Peron
2010/0275100 A1 10/2010 Yokokawa et al.
(Continued)

FOREIGN PATENT DOCUMENTS

EP 2 536 030 A1 12/2012
EP 3 017 575 A1 5/2016
(Continued)

OTHER PUBLICATIONS

International Search Report dated Nov. 18, 2014 in PCT/JP2014/073468.

(Continued)

*Primary Examiner* — Guerrier Merant
(74) *Attorney, Agent, or Firm* — Oblon, McClelland, Maier & Neustadt, L.L.P.

(57) ABSTRACT

The present technology relates to a data processing device and a data processing method so that an LDPC code with a good bit error rate is provided.

An LDPC encoder encodes by an LDPC code whose code length is 16200 bits and code rate is 8/15. The LDPC code includes information bits and parity bits. A parity check matrix H includes an information matrix part corresponding to the information bits of the LDPC code and a parity matrix part corresponding to the parity bits. The information matrix part of the parity check matrix H is represented by a parity check matrix initial value table that indicates a position of an element 1 of the information matrix part for each 360 columns. The present technology is applicable to a case in which LDPC encoding and LDPC decoding are performed.

20 Claims, 53 Drawing Sheets

(51) Int. Cl.
*H03M 13/03* (2006.01)
*H03M 13/25* (2006.01)
*H03M 13/27* (2006.01)
*H03M 13/29* (2006.01)
*H04L 1/00* (2006.01)
*H03M 13/15* (2006.01)

(52) U.S. Cl.
CPC ....... *H03M 13/255* (2013.01); *H03M 13/271* (2013.01); *H03M 13/2906* (2013.01); *H03M 13/616* (2013.01); *H04L 1/00* (2013.01); *H03M 13/152* (2013.01)

(58) Field of Classification Search
CPC .......... H03M 13/1165; H03M 13/255; H03M 13/6362; H03M 13/2906; H03M 13/3761; H03M 13/3769; H03M 13/6356; H03M 13/2778; H03M 13/152; H03M 13/2707; H03M 13/2792; H03M 13/1102
See application file for complete search history.

(56) References Cited

U.S. PATENT DOCUMENTS

| | | |
|---|---|---|
| 2013/0216001 A1 | 8/2013 | Petrov |
| 2014/0082452 A1 | 3/2014 | Shinohara et al. |
| 2015/0039973 A1 | 2/2015 | Jeong et al. |
| 2015/0082131 A1 | 3/2015 | Jeong et al. |
| 2016/0149589 A1* | 5/2016 | Ikegaya ............. H03M 13/1105 714/758 |
| 2016/0261288 A1* | 9/2016 | Shinohara .......... H03M 13/1165 |
| 2016/0315636 A1* | 10/2016 | Shinohara .......... H03M 13/1165 |
| 2016/0380726 A1 | 12/2016 | Jeong et al. |
| 2017/0093430 A1* | 3/2017 | Ikegaya .................. G06F 11/10 |

FOREIGN PATENT DOCUMENTS

| | | |
|---|---|---|
| EP | 3 051 703 A1 | 8/2016 |
| JP | 2008-263566 A | 10/2008 |
| JP | 2011-176645 | 9/2011 |
| JP | 2011-176783 | 9/2011 |
| JP | 2012-235269 A | 11/2012 |
| JP | 2013-005124 A | 1/2013 |
| KR | 10-2010-0096098 | 9/2010 |
| KR | 10-2010-0096102 | 9/2010 |
| KR | 10-1481854 | 9/2010 |
| KR | 10-1474050 | 12/2014 |
| WO | 2013/024584 A1 | 2/2013 |

OTHER PUBLICATIONS

"Digital Video Broadcasting (DVB); Next Generation broadcasting system to Handheld, physical layer specification (DVB-NGH)" DVB Document A160, Draft ETSI EN 303 105 V1.1.1, Nov. 2012, pp. 65-66, 220-225, 247-248, 261-262 and Cover Pages.

"Digital Video Broadcasting (DVB); Second generation framing structure, channel coding and modulation systems for Broadcasting, Interactive Services, News Gathering and other broadband sate lite applications" Part II: S2- Extensions (DVB-S2X)—(Optional), DVB Document A83-2, Mar. 2014, pp. 45-83 and Cover Page.

"Digital Video Broadcasting (DVB); Second generation framing structure, channel coding and modulation systems for Broadcasting, Interactive Services, News Gathering and other broadband satellite applications (DVB-S2)" ETSI EN 302 307 V1.2.1, Reference REN/JTC-DVB-238, Aug. 2009, pp. 1-78.

Extended European Search Report dated Apr. 26, 2017 in Patent Application No. 14846028.0.

"Digital Video Broadcasting (DVB); Frame Structure Channel Coding and Modulation for a Second Generation Digital Terrestrial Television Broadcasting System (DVB-T2)" Draft ETSI EN 302 755 V1.3.1, XP017839127, Apr. 19, 2012, pp. 1-278.

Makiko Kan, "Updated Data for New 16k LDPC Codes" DVB-NGH, Sony Corporation, XP017834323, Feb. 16, 2011, 6 Pages.

Notice of Allowance issued Mar. 22, 2017 in Korean Patent Application No. 10-2016-7002597.

* cited by examiner $$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 0 & 0 & 1 & 0 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

FIG.3

Transmission system

| Nominal code rate | N=64800 | | | | | | N=16200 | | | | | |
|---|---|---|---|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

Number of columns of each column weight

FIG.13

| Required number of memory columns mb | b=1 (First to third interchanging schemes) | b=2 (Fourth interchanging scheme) | Writing start position of each of mb columns | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 27 | 28 | 32 | | | | | | | | |
| 20 | | 1024QAM | 0 | 1 | 3 | 4 | 5 | 6 | 6 | 9 | 13 | 14 | 14 | 16 | 21 | 21 | 23 | 25 | 25 | 26 | 28 | 30 | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG.29

| Required number of memory columns mb | b=1 (First to third interchanging schemes) | b=2 (Fourth interchanging scheme) | Writing start position of each of mb columns | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

FIG.30

Indicate row number of parity check matrix (information matrix $H_A$)
from 1st column for each 360 columns
Row numbers of parity check matrix

```
0  2084 1613 1548 1286 1460 3196 4297 2481 3369 3451 4620 2622
1  122  1516 3448 2880 1407 1847 3799 3529 373  971  4358 3108
2  259  3399 929  2650 864  3996 3833 107  5287 164  3125 2350
                      └─ $h_{3,5}$
3  342  3529
4  4198 2147
5  1880 4836
6  3864 4910
7  243  1542
8  3011 1436
9  2167 2512
10 4606 1003
11 2835 705
12 3426 2365
13 3848 2474
14 1360 1743
0  163  2536
1  2583 1180
2  1542 509
3  4418 1005
4  5212 5117
5  2155 2922
6  347  2696
7  226  4296
8  1560 487
9  3926 1640
10 149  2928
11 2364 563
12 635  688
13 231  1684
14 1129 3894
```

↑ 1st row of $H_A$
↑ 361st row of $H_A$
↑ 721st row of $H_A$
↑ 1081st row of $H_A$ Parity check matrix initial value table

FIG.38

```
N=16200, rate=8/15
  5  519  825 1871 2098 2478 2659 2820 3200 3294 3650 3804 3949 4426 4460 4503 4568 4590 4949
5219 5662 5738 5905 5911 6160 6404 6637 6708 6737 6814 7263 7412
  81  391 1272 1633 2062 2882 3443 3503 3535 3908 4033 4163 4490 4929 5262 5399 5576 5768 5910
6331 6430 6844 6867 7201 7274 7290 7343 7350 7378 7387 7440 7554
  105  975 3421 3480 4120 4444 5957 5971 6119 6617 6761 6810 7067 7353
  6  138  485 1444 1512 2615 2990 3109 5604 6435 6513 6632 6704 7507
  20  858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018
1285 1863 5324
3075 6005 6466
  5 6020 7551
2121 3751 7507
4027 5488 7542
  2 6012 7011
3823 5531 5687
1379 2262 5297
1882 7498 7551
3749 4806 7227
  2 2074 6898
 17  616 7482
  9 6823 7480
5195 5880 7559
```

FIG.39

| X1 | KX1 | X2 | KX2 | Y1 | KY1 | Y2 | KY2 | M |
|---|---|---|---|---|---|---|---|---|
| 32 | 720 | 14 | 1080 | 4 | 1440 | 3 | 5400 | 7560 |

DATA PROCESSING DEVICE AND DATA PROCESSING METHOD

CROSS-REFERENCE TO RELATED APPLICATIONS

This application is a continuation of U.S. application Ser. No. 14/913,727, filed Feb. 23, 2016, which is a National Stage application of International Application No. PCT/JP2014/073468, filed Sep. 5, 2014, and claims priority to Japanese Application No. 2013-196141, filed Sep. 20, 2013, the entire contents of which are incorporated herein by reference.

TECHNICAL FIELD

The present technology relates to a data processing device and a data processing method. In particularly, the present technology relates to a data processing device and a data processing method capable of providing an excellent communication quality in data transmission using an LDPC code.

An LDPC (low density parity check) code has high error correcting capability and is used widely as a transmission scheme including digital broadcasting such as DVB (digital video broadcasting)-S.2, DVB-T.2, DVB-C.2, ATSC (Advanced Television Systems Committee) 3.0 used in Europe, for example (for example, see Non-Patent Document 1) in recent years.

Through recent studies, the LDPC code may obtain performance close to Shannon limit as a code length thereof is made longer as well as a turbo code and the like. The LDPC code characteristically has an advantage that a block error probability characteristic thereof is excellent and that a so-called error floor phenomenon observed in a decoding characteristic of the turbo code and the like scarcely occurs by its feature that a minimum distance is proportional to the code length.

Non-Patent Document 1: DVB-S.2: ETSI EN 302 307 V1.2.1 (2009-08)

SUMMARY OF INVENTION

Problem to be Solved by the Invention

In the data transmission using the LDPC code, the LDPC code is made a symbol of orthogonal modulation (digital modulation) such as QPSK (quadrature phase shift keying) (symbolized), and the symbol is mapped onto a signal point of the orthogonal modulation to be transmitted.

The data transmission using the LDPC code as described above is spreading worldwide. It urges to provide an excellent communication quality.

The present technology is made in view of such a condition and for providing an excellent communication quality in data transmission using an LDPC code.

Means for Solving the Problem

First data processing device/data processing method according to the present technology includes an encoder/a step of encoding, which encodes information bits into an LDPC (low density parity check) code whose code length is 16200 bits and code rate is 8/15 based on a parity check matrix of the LDPC code, the LDPC code including information bits and parity bits, the parity check matrix including an information matrix part corresponding to the information bits and a parity matrix part corresponding to the parity bits, the information matrix part being represented by a parity check matrix initial value table, and the parity check matrix initial value table being a table indicating a position of an element 1 of the information matrix part for each 360 columns as 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412
81 391 1272 1633 2062 2882 3443 3503 3535 3908 4033 4163 4490 4929 5262 5399 5576
5768 5910 6331 6430 6844 6867 7201 7274 7290 7343 7350 7378 7387 7440 7554
105 975 3421 3480 4120 4444 5957 5971 6119 6617 6761 6810 7067 7353
6 138 485 1444 1512 2615 2990 3109 5604 6435 6513 6632 6704 7507
20 858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

In the first data processing device/data processing method, information bits are encoded into an LDPC (low density parity check) code whose code length is 12600 bits and code rate is 8/15 based on a parity check matrix of the LDPC code. The LDPC code includes information bits and parity bits. The parity check matrix includes an information matrix part corresponding to the information bits and a parity matrix part corresponding to the parity bits. The information matrix part is represented by a parity check matrix initial value table. The parity check matrix initial value table is a table indicating a position of an element 1 of the information matrix part for each 360 columns as 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412
81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554
105 975 3421 3480 4120 4444 5957 5971 6119 6617 6761 6810 7067 7353
6 138 485 1444 1512 2615 2990 3109 5604 6435 6513 6632 6704 7507
20 858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018

1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

Second data processing device/data processing method according to the present technology includes an decoder/a step of decoding, which decodes an LDPC (low density parity check) code provided from data transmitted from a transmitting device, which includes an encoder, which encodes information bits into an LDPC (low density parity check) code whose code length is 16200 bits and code rate is 8/15 based on a parity check matrix of the LDPC code, the LDPC code including information bits and parity bits, the parity check matrix including an information matrix part corresponding to the information bits and a parity matrix part corresponding to the parity bits, the information matrix part being represented by a parity check matrix initial value table, and the parity check matrix initial value table being a table indicating a position of an element 1 of the information matrix part for each 360 columns as 5 519 825 1871 2098 2478 2659 2820 3200 3294 3650 3804
3949 4426 4460 4503 4568 4590 4949 5219 5662 5738 5905
5911 6160 6404 6637 6708 6737 6814 7263 7412
81 391 1272 1633 2062 2882 3443 3503 3535 3908 4033
4163 4490 4929 5262 5399 5576 5768 5910 6331 6430 6844
6867 7201 7274 7290 7343 7350 7378 7387 7440 7554
105 975 3421 3480 4120 4444 5957 5971 6119 6617 6761
6810 7067 7353
6 138 485 1444 1512 2615 2990 3109 5604 6435 6513 6632
6704 7507
20 858 1051 2539 3049 5162 5308 6158 6391 6604 6744
7071 7195 7238
1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

In the second data processing device/data processing method, an LDPC (low density parity check) code provided from data transmitted from a transmitting device being decoded, includes an encoder, which encodes information bits into the LDPC code whose code length is 16200 bits and code rate is 8/15 based on a parity check matrix of the LDPC code. The LDPC code includes information bits and parity bits. The parity check matrix includes an information matrix part corresponding to the information bits and a parity matrix part corresponding to the parity bits. The information matrix part is represented by a parity check matrix initial value table. The parity check matrix initial value table is a table indicating a position of an element 1 of the information matrix part for each 360 columns as 5 519 825 1871 2098 2478 2659 2820 3200 3294 3650 3804
3949 4426 4460 4503 4568 4590 4949 5219 5662 5738 5905
5911 6160 6404 6637 6708 6737 6814 7263 7412
81 391 1272 1633 2062 2882 3443 3503 3535 3908 4033
4163 4490 4929 5262 5399 5576 5768 5910 6331 6430 6844
6867 7201 7274 7290 7343 7350 7378 7387 7440 7554
105 975 3421 3480 4120 4444 5957 5971 6119 6617 6761
6810 7067 7353
6 138 485 1444 1512 2615 2990 3109 5604 6435 6513 6632
6704 7507
20 858 1051 2539 3049 5162 5308 6158 6391 6604 6744
7071 7195 7238
1140 5838 6203 6748
6282 6466 6481 663 8
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

Note that the data processing device may be an independent device or an internal block configuring one device.

Effects of the Invention

According to the present technology, it is possible to provide an excellent communication quality in data transmission using an LDPC code.

Effects described herein are not limited only to be illustrative, there may be effects other than those described herein.

BRIEF DESCRIPTION OF DRAWINGS

FIG. 3 A view showing an example of a parity check matrix of the LDPC code.

FIG. 13 A view illustrating the parity check matrix of the LDPC code specified in the DVB-S.2 standard.

FIG. 29 A view showing the number of columns of a memory 31 required for column twist interleave and an address of a writing start position.

FIG. 30 A view showing the number of columns of the memory 31 required for the column twist interleave and the address of the writing start position.

FIG. 38 A view illustrating a method of obtaining the parity check matrix H from the parity check matrix initial value table.

FIG. 39 A view showing an example of the parity check matrix initial value table in which r=8/15 and 16 k code.

FIG. 44 A view illustrating the parity check matrix of the 16 k code whose r=8/15.

FIG. 49 A view showing an example of the parity check matrix of the LDPC code.

FIG. 50 A view illustrating a matrix (conversion parity check matrix) obtained by applying row permutation and column permutation to the parity check matrix.

FIG. 51 A view illustrating the conversion parity check matrix divided into 5×5 units.

MODES FOR CARRYING OUT THE INVENTION

Hereinafter, embodiments of the present technology will be described. Before that, an LDPC code will be described.
<Ldpc Code>

The LDPC code is a linear code and is not necessarily required to be a binary code; however, it is herein described supposing that this is the binary code.

The greatest characteristic of the LDPC code is that a parity check matrix defining the LDPC code is sparse. Herein, the sparse matrix is the matrix in which the number of elements "1" of the matrix is very small (most of elements are 0).

Figures 1, 2:
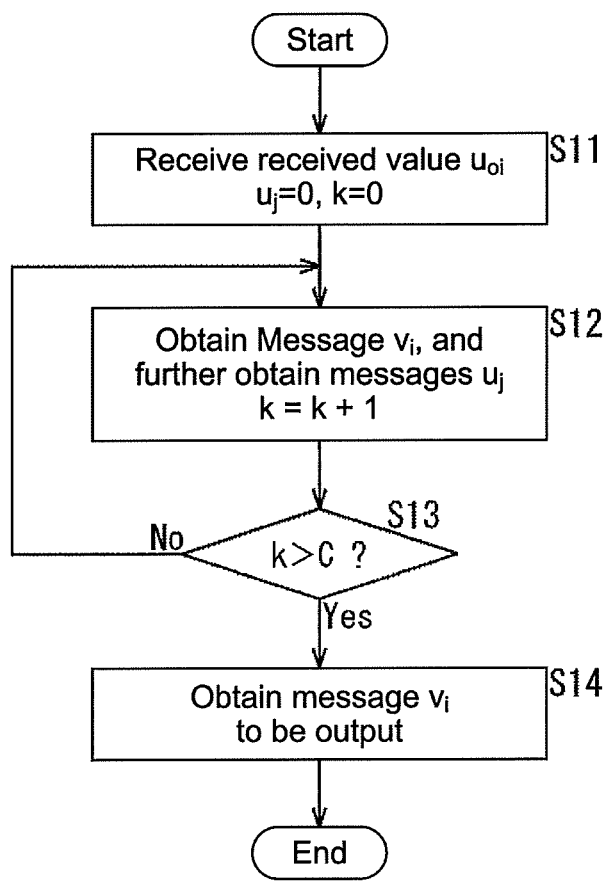
FIG. 1 A view illustrating a parity check matrix H of an LDPC code.
FIG. 2 A flowchart illustrating a decoding procedure of the LDPC code.

FIG. 1 is a view showing an example of a parity check matrix H of the LDPC code.

In the parity check matrix H in FIG. 1, a weight of each column (column weight) (the number of "1") is "3" and the weight of each row (row weight) is "6".

In encoding by the LDPC code (LDPC encoding), a codeword (LDPC code) is generated by generation of a generator matrix G based on the parity check matrix H and multiplication of the generator matrix G by a binary information bit, for example.

Specifically, an encoding device, which performs the LDPC encoding, first calculates the generator matrix G satisfying an equation $GH^T=0$ between the same and a transposed matrix $H_T$ of the parity check matrix H. Herein, when the generator matrix G is a K×N matrix, the encoding device multiplies a bit column (vector u) of K bits by the generator matrix G to generate a codeword c (=uG) configured of N bits. The codeword (LDPC code) generated by the encoding device is received on a receiving side through a predetermined communication channel.

Decoding of the LDPC code may be performed by an algorithm suggested by Gallager as probabilistic decoding being a message passing algorithm by belief propagation on a so-called Tanner graph configured of a variable node (also referred to as a message node) and a check node. Hereinafter, the variable node and the check node are appropriately and simply referred to as a node.

FIG. 2 is a flowchart showing a procedure of the decoding of the LDPC code.

A real value (received LLR) representing likelihood of a value to be "0" of an i-th code bit of the LDPC code (one codeword) received on the receiving side by a log likelihood ratio is hereinafter appropriately referred to as a received value $u_{0i}$. A message output from the check node is set to $u_j$ and the message output from the variable node is set to $v_i$.

First, in the decoding of the LDPC code, as shown in FIG. 2, the LDPC code is received, the message (check node message) $u_j$ is initialized to "0", and a variable k being an integer as a counter of a repetitive process is initialized to "0" at step S11 and the procedure shifts to step S12. At step S12, the message (variable node message) $v_i$ is obtained by an operation (variable node operation) represented in equation (1) based on the received value $u_{0i}$ obtained by receiving the LDPC code and the message $u_j$ is obtained by an operation (check node operation) represented in equation (2) based on the message $v_i$.

[Equation 1]

$$v_i = u_{0i} + \sum_{j=1}^{d_v-1} u_j \qquad (1)$$

[Equation 2]

$$\tanh\left(\frac{u_j}{2}\right) = \prod_{i=1}^{d_c-1} \tanh\left(\frac{v_i}{2}\right) \qquad (2)$$

Herein, $d_v$ and $d_c$ in equations (1) and (2) are parameters indicating the numbers of "1" in a vertical direction (column) and a horizontal direction (row) of the parity check matrix H, which may be optionally selected. For example, it is set that $d_v=3$ and =6 in the case of the LDPC code ((3, 6) LDPC code) for the parity check matrix H in which the column weight is 3 and the row weight is 6 as shown in FIG. 1.

In the variable node operation in equation (1) and the check node operation in equation (2), the message input from an edge (line connecting the variable node and the check node to each other) from which the message is to be output is not a target of the operation, so that a range of the operation is 1 to $d_v-1$ or 1 to $d_c-1$. Also, a table of a function $R(v_1, v_2)$ represented in equation (3) defined by one output with respect to two inputs $v_1$ and $v_2$ is created in advance and this is continuously (recursively) used as represented in equation (4) for actually performing the check node operation in equation (2).

[Equation 3]

$$x = 2\tan h^{-1}\{\tan h(v_1/2)\tan h(v_2/2)\} = R(v_1, v_2) \qquad (3)$$

$$u_j = R(v_1, R(v_2, R(v_3, \ldots R(v_{d_c-2}, v_{d_c-1})))) \qquad (4)$$

At step S12, the variable k is incremented by 1 and the procedure shifts to step S13. At step S13, it is judged whether the variable k is larger than a predetermined number of times of repetitive decoding C. When it is judged that the variable k is not larger than C at step S13, the procedure returns to step S12 and a similar process is hereinafter repeatedly performed.

Also, when it is judged that the variable k is larger than C at step S13, the procedure shifts to step S14 to perform an operation represented in equation (5), so that the message $v_i$ as a decoding result to be finally output is obtained to be output and a decoding process of the LDPC code is finished.

[Equation 5]

$$v_i = u_{0i} + \sum_{j=1}^{d_v} u_j \qquad (5)$$

Herein, different from the variable node operation in equation (1), the operation in equation (5) is performed using the messages $u_j$ from all the edges connected to the variable node.

FIG. 3 is a view showing an example of the parity check matrix H of the (3, 6) LDPC code (code rate 1/2 and code length 12).

In the parity check matrix H in FIG. 3, the weight of the column is 3 and the weight of the row is 6 as in FIG. 1.

Figure 4:
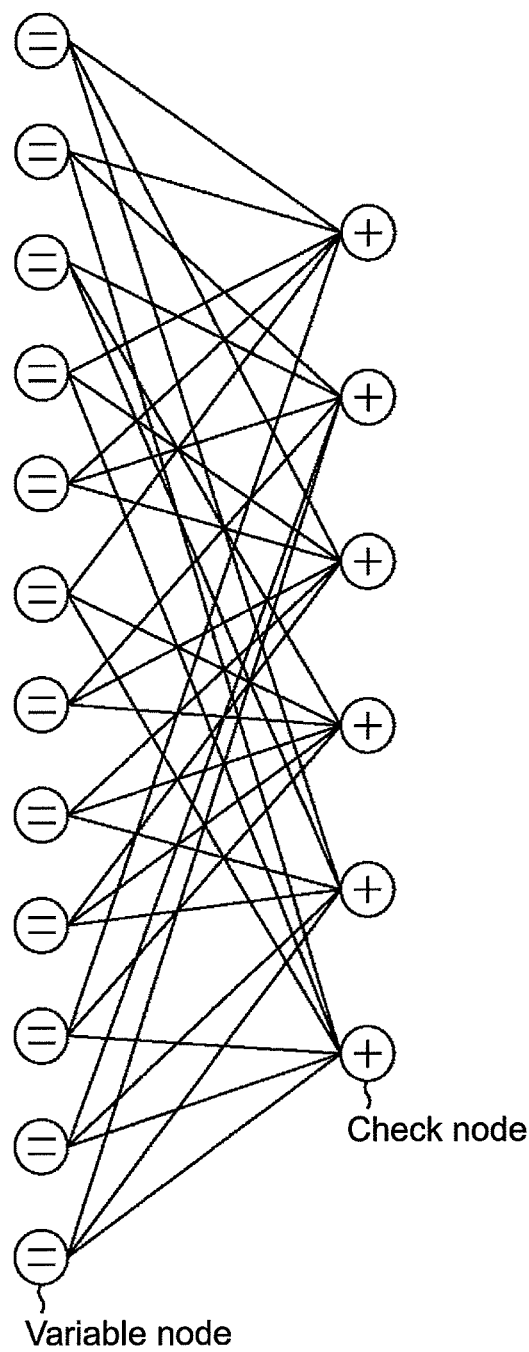
FIG. 4 A view showing a Tanner graph of the parity check matrix.

FIG. 4 is a view showing the Tanner graph of the parity check matrix H in FIG. 3.

Herein, in FIG. 4, the check node is represented by plus "+" and the variable node is represented by equal "=". The check node and the variable node correspond to the row and the column of the parity check matrix H, respectively. A connection between the check node and the variable node is the edge, which corresponds to the element "1" of the parity check matrix.

That is to say, when a j-th row i-th column element of the parity check matrix is 1, in FIG. 4, an i-th variable node (node of "=") from the top and a j-th check node (node of "+") from the top are connected to each other by the edge. The edge indicates that the code bit corresponding to the variable node has a constraint condition corresponding to the check node.

In a sum product algorithm being the decoding method of the LDPC code, the variable node operation and the check node operation are repeatedly performed.

Figure 5:
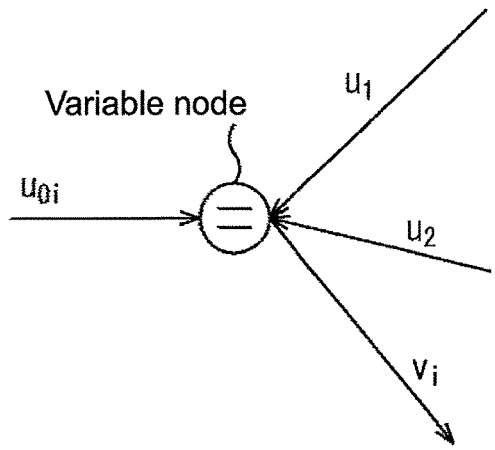
FIG. 5 A view showing a variable node.

FIG. 5 is a view showing the variable node operation performed in the variable node.

In the variable node, the message $v_i$ corresponding to the edge to be calculated is obtained by the variable node operation in equation (1) using the messages $u_1$ and $u_2$ from other edges connected to the variable node and the received value $u_{0i}$. The message corresponding to another edge is similarly obtained.

Figure 6:
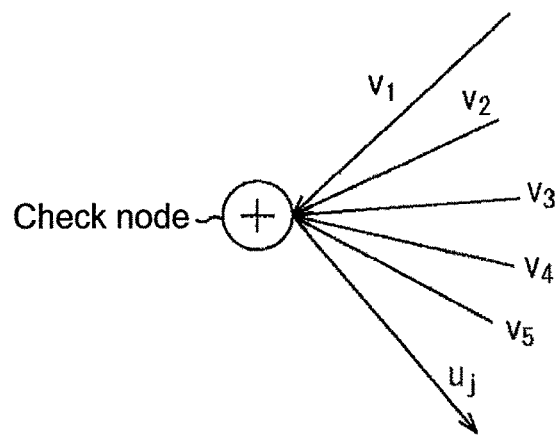
FIG. 6 A view showing a check node.

FIG. 6 illustrates the check node operation performed in the check node.

Herein, the check node operation in equation (2) may be rewritten as equation (6) using relationship of an equation $a \times b = \exp\{ \ln(|a|) + \ln(|b|) \} \times \text{sign}(a) \times \text{sign}(b)$. Sign(x) is 1 when $x \Rightarrow 0$ is satisfied and $-1$ when $x < 0$ is satisfied.

[Equation 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \text{sign}(v_i).$$

When a function $(\varphi)(x)$ is defined by an equation $\varphi(x) = \ln(\tan h(x/2))$ when $x \Rightarrow 0$ is satisfied, an equation $\varphi^{-1}(x) = 2 \tan h^{-1}(e^{-x})$ is satisfied, so that equation (6) may be deformed to equation (7).

[Equation 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, the check node operation in equation (2) is performed according to equation (7).

That is to say, in the check node, the message $u_j$ corresponding to the edge to be calculated is obtained by the check node operation in equation (7) using messages $v_1$, $v_2$, $v_3$, $v_4$, and $v_5$ from other edges connected to the check node as illustrated in FIG. 6. The message corresponding to another edge is similarly obtained.

The function $\varphi(x)$ in equation (7) may be represented by an equation $\varphi(x) = \ln((e^x+1)/(e^x-1))$ and $\varphi(x) = \varphi^{-1}(x)$ when $x > 0$ is satisfied. When the functions $\varphi(x)$ and $\varphi^{-1}(x)$ are implemented in hardware, there is a case in which they are implemented using LUT (look up table), and the same LUT is used for both of them.

<Configuration Example of Transmission System to which the Present Technology is Applied>

Figure 7:
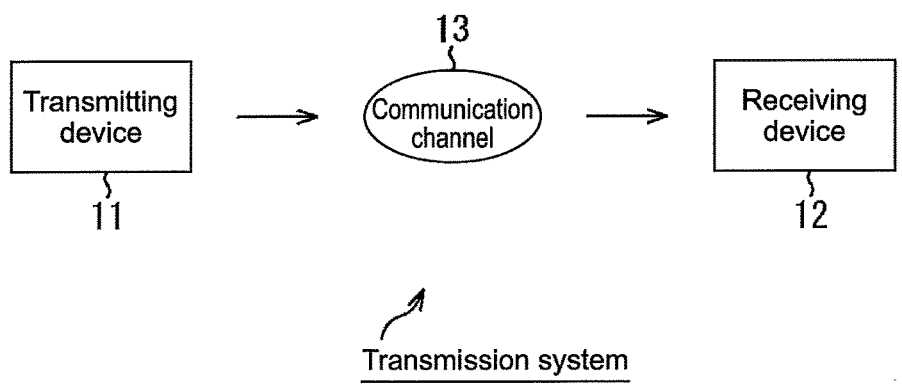
FIG. 7 A view showing a configuration example of one embodiment of a transmission system to which the present technology is applied.

FIG. 7 illustrates a configuration example of one embodiment of a transmission system (the term "system" is intended to mean a logical assembly of a plurality of devices and it does not matter whether the devices of each configuration are in the same housing) to which the present technology is applied.

In FIG. 7, the transmission system is configured of a transmitting device 11 and a receiving device 12.

The transmitting device 11 transmits (broadcasts) (transmits) a program of television broadcasting. That is to say, the transmitting device 11 encodes target data to be transmitted such as image data and audio data as the program, for example, into an LDPC code and transmits the same through a communication channel 13 such as a satellite circuit, a terrestrial wave, and a cable (wire circuit).

The receiving device 12 receives the LDPC code transmitted from the transmitting device 11 through the communication channel 13 and decodes the same to the target data to output.

Herein, it is known that the LDPC code used in the transmission system in FIG. 7 exhibits an extremely high ability in an AWGN (additive white Gaussian noise) communication channel.

However, a burst error and erasure might occur in the communication channel 13 such as the terrestrial wave. For example, especially when the communication channel 13 is a terrestrial wave, in an OFDM (orthogonal frequency division multiplexing) system, there is a case in which power of a specific symbol reaches 0 (erasure) according to delay of an echo (a path other than a main path) in a multipath environment in which a D/U (desired to undesired ratio) is 0 dB (power of undesired (=echo) is equal to power of desired (=main path)).

There is a case in which the power of all the symbols of the OFDM at a specific time reaches 0 (erasure) by a Doppler frequency when the D/U is 0 dB also in a flutter (communication channel in which a Doppler frequency-shifted echo whose delay is 0 is added).

Further, the burst error might occur due to a wiring status from a receiver (not shown) such as an antenna, which receives a signal from the transmitting device 11, to the receiving device 12 and instability of a power supply of the receiving device 12 on a side of the receiving device 12.

On the other hand, in decoding of the LDPC code, a variable node operation in equation (1) including addition of (a received value $u_{0i}$ of) a code bit of the LDPC code is performed as illustrated above in FIG. 5 in a variable node corresponding to a column of a parity check matrix H and eventually the code bit of the LDPC code, so that, when the error occurs in the code bit used in the variable node operation, accuracy of an obtained message is deteriorated.

In the decoding of the LDPC code, a check node operation in equation (7) is performed in the check node using the message obtained in the variable node connected to the check node, so that decoding performance is deteriorated when the number of check nodes, in which (the code bits of the LDPC code corresponding to) a plurality of variable nodes connected thereto have the error (including the erasure) at the same time, increases.

That is to say, when the erasure occurs in two or more of the variable nodes connected to the check node at the same time, the check node returns the message indicating that probability that the value is 0 and the probability that the value is 1 are equal to all the variable nodes, for example. In this case, the check node, which returns the message of the equal probability, does not contribute to a single decoding process (one set of the variable node operation and the check node operation), and as a result, this requires a large number of repetitions of the decoding process, so that the decoding performance is deteriorated and further, power consumption of the receiving device 12, which decodes the LDPC code, increases.

Therefore, the transmission system in FIG. 7 is configured to improve resistance to burst error and erasure while maintaining performance in the AWGN communication channel (AWGN channel).

[Configuration Example of Transmitting Device 11]

Figure 8:
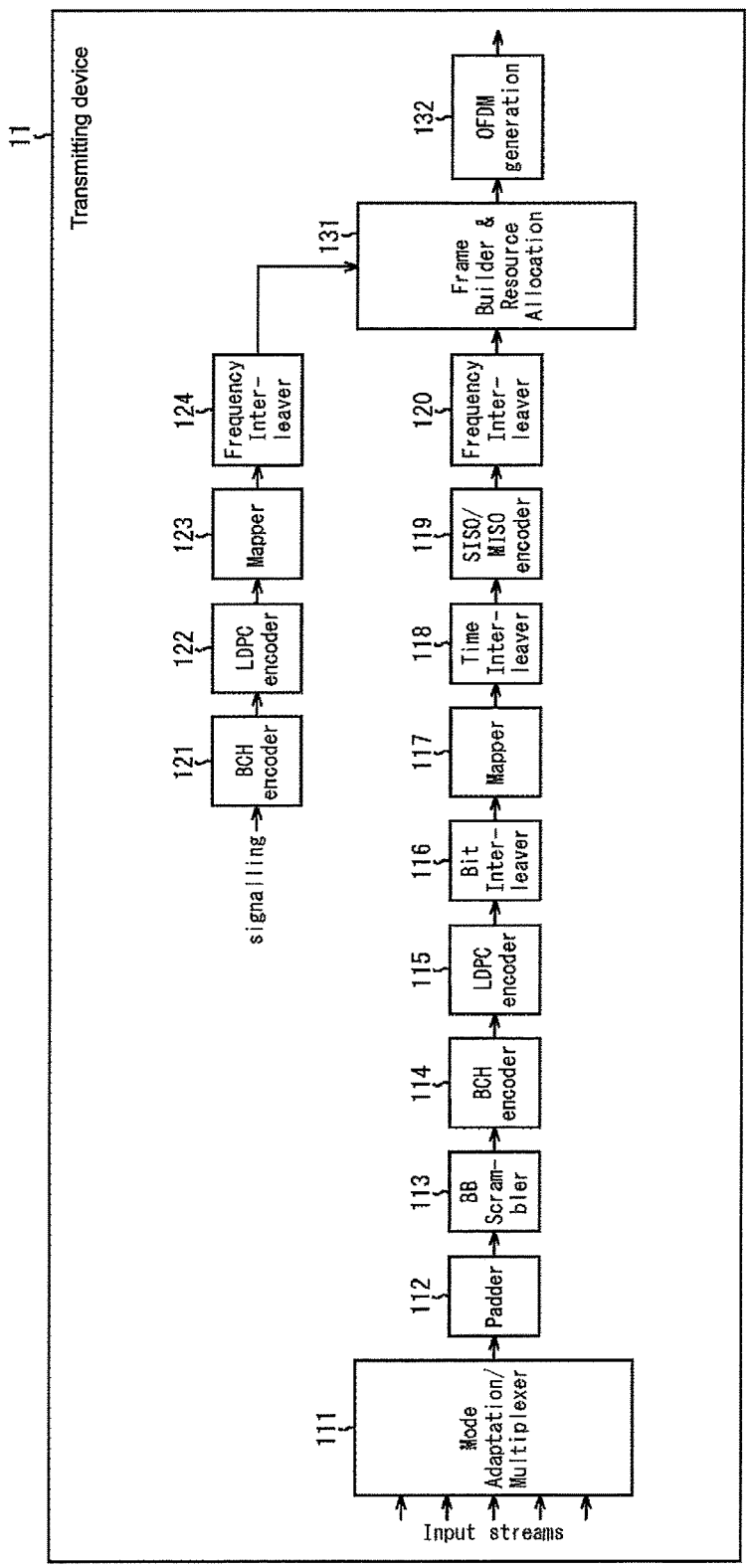
FIG. 8 A block diagram showing a configuration example of a transmitting device 11.

FIG. 8 is a block diagram showing a configuration example of the transmitting device 11 in FIG. 7.

In the transmitting device 11, one or more input streams as the target data are supplied to a mode adaptation/multiplexer 111.

The mode adaptation/multiplexer 111 selects a mode, multiplexes the one or more input streams supplied thereto, and supplies the data obtained as a result to a padder 112.

The padder 112 performs necessary zero padding (null insertion) to the data from the mode adaptation/multiplexer 111 and supplies the data obtained as a result to a BB scrambler 113.

The BB scrambler 113 applies BB scramble (Base-Band Scrambling) to the data from the padder 112 and supplies the data obtained as a result to a BCH encoder 114.

The BCH encoder 114 performs BCH encoding of the data from the BB scrambler 113 and supplies the data obtained as a result to an LDPC encoder 115 as LDPC target data being a target of LDPC encoding.

The LDPC encoder 115 performs the LDPC encoding of the LDPC target data from the BCH encoder 114 according to a parity check matrix in which a parity matrix being a part corresponding to the parity bits of the LDPC code has a stepwise structure and outputs the LDPC code in which the information bits are the LDPC target data.

That is to say, the LDPC encoder 115 performs the LDPC encoding to encode the LDPC target data into the LDPC code (corresponding to the parity check matrix) such as the LDPC code specified in a predetermined standard such as a DVB-S.2 standard, a DVB-T.2 standard and a DVB-C.2 standard or the predetermined LDPC code (corresponding to the parity check matrix), for example, and outputs the LDPC code obtained as a result.

In the LDPC code specified in a DVB-S.2 standard, the DVB-T.2 standard, or the DVB-C.2 standard is an IRA (irregular repeat-accumulate) code and the parity matrix in the parity check matrix of the LDPC code has the stepwise structure. The parity matrix and the stepwise structure are described later. The IRA code is described in "Irregular Repeat-Accumulate Codes," H. Jin, A. Khandekar, and R. J. McEliece, in Proceedings of 2nd International Symposium on Turbo Codes and Related Topics, pp. 1-8, September 2000, for example.

The LDPC code output by the LDPC encoder 115 is supplied to a bit interleaver 116.

The bit interleaver 116 performs bit interleave to be described later of the LDPC code from the LDPC encoder 115 and supplies the LDPC code after the bit interleave to a mapper 117.

The mapper 117 maps the LDPC code from the bit interleaver 116 onto a signal point indicating one symbol of orthogonal modulation in units of one or more code bits of the LDPC code (symbol unit) to perform the orthogonal modulation (multilevel modulation).

That is to say, the mapper 117 maps the LDPC code from the bit interleaver 116 onto the signal point defined by a modulation scheme for performing the orthogonal modulation of the LDPC code on an IQ plane (IQ constellation) defined by an I axis representing an I component in phase with a carrier wave and a Q axis representing a Q component orthogonal to the carrier wave and performs the orthogonal modulation.

Herein, the modulation scheme of the orthogonal modulation performed by the mapper 117 includes the modulation scheme including the modulation scheme specified in the DVB-S.2, DVB-T.2 and DVB-C.2 standards, for example, and other modulation schemes, that is to say, BPSK (Binary Phase Shift Keying), QPSK (quadrature phase shift keying), 8PSK (Phase-Shift Keying), 16APSK (Amplitude Phase-Shift Keying), 32APSK, 16QAM (quadrature amplitude modulation), 64QAM, 256QAM, 1024QAM, 4096QAM, 4PAM (Pulse Amplitude Modulation) and the like, for example. The modulation scheme with which the orthogonal modulation is performed by the mapper 117 is set in advance according to operation of an operator of the transmitting device 11, for example.

The data (symbol mapped onto the signal point) obtained by the process by the mapper 117 is supplied to a time interleaver 118.

The time interleaver 118 performs time interleave (interleave in a time direction) in the symbol unit of the data (symbol) from the mapper 117 and supplies the data obtained as a result to a SISO/MISO (Single Input Single Output/Multiple Input Single Output) encoder 119.

The SISO/MISO encoder 119 applies time-space encoding to the data (symbol) from the time interleaver 118 to supply to a frequency interleaver 120.

The frequency interleaver 120 performs frequency interleave (interleave in a frequency direction) in the unit of the data (symbol) from the SISO/MISO encoder 119 to supply to a frame builder & resource allocation 131.

On the other hand, control data for transmission control (signaling) such as Base Band Signaling, BB Header and the like is supplied to the BCH encoder 121, for example.

The BCH encoder 121 performs the BCH encoding of the control data supplied thereto in the same manner as the BCH encoder 114 and supplies the data obtained as a result to an LDPC encoder 122.

The LDPC encoder 122 performs the LDPC encoding of the data from the BCH encoder 121 as the LDPC target data in the same manner as the LDPC encoder 115 and supplies the LDPC code obtained as a result to a mapper 123.

The mapper 123 maps the LDPC code from the LDPC encoder 122 onto the signal point indicating one symbol of the orthogonal modulation in units of one or more code bits of the LDPC code (symbol unit) to perform the orthogonal modulation and supplies the data (symbol) obtained as a result to a frequency interleaver 124 in the same manner as the mapper 117.

The frequency interleaver 124 performs the frequency interleave of the data (symbol) from the mapper 123 in the symbol unit to supply to the frame builder & resource allocation 131 in the same manner as the frequency interleaver 120.

The frame builder & resource allocation 131 inserts a pilot symbol into a required position of the data (symbol) from the frequency interleavers 120 and 124 and constitutes a frame configured of a predetermined number of symbols (for example, a PL (Physical Layer) frame, a T2 frame, a C2 frame and the like) from the data (symbol) obtained as a result to supply to an OFDM generation 132.

The OFDM generation 132 generates an OFDM signal corresponding to the frame from the frame from the frame builder & resource allocation 131 and transmits the same through the communication channel 13 (FIG. 7).

The transmitting device 11 may be configured without including some of the blocks shown in FIG. 8, e.g., the time interleaver 118, the SISO/MISO encoder 119, the frequency interleaver 120, and frequency interleaver 124.

Figure 9:
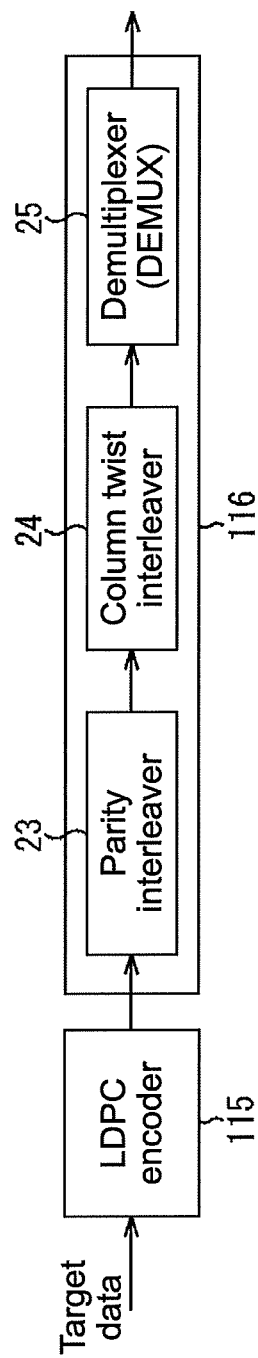
FIG. 9 A block diagram showing a configuration example of a bit interleaver 116.

FIG. 9 shows a configuration example of the bit interleaver 116 in FIG. 8.

The bit interleaver 116 has a function to interleave the data, and is configured of a parity interleaver 23, a column twist interleaver 24, and a demultiplexer (DEMUX) 25. The bit interleaver 116 may be configured without one or both of the parity interleaver 23 and the column twist interleaver 24.

The parity interleaver 23 performs parity interleave to interleave the parity bit of the LDPC code from the LDPC encoder 115 to a position of another parity bit and supplies the LDPC code after the parity interleave to the column twist interleaver 24.

The column twist interleaver 24 performs column twist interleave of the LDPC code from the parity interleaver 23 and supplies the LDPC code after the column twist interleave to the demultiplexer 25.

That is to say, the mapper 117 in FIG. 8 maps one or more code bits of the LDPC code onto the signal point indicating one symbol of the orthogonal modulation to transmit the LDPC code.

The column twist interleaver 24 performs the column twist interleave to be described later, for example, as a rearranging process to rearrange the code bits of the LDPC code from the parity interleaver 23 such that a plurality of code bits of the LDPC code corresponding to 1 in an optional row of the parity check matrix used by the LDPC encoder 115 is not included in one symbol.

The demultiplexer 25 obtains the LDPC code whose resistance to AWGN is reinforced by performing an interchanging process to interchange positions of two or more code bits of the LDPC code being the symbol for the LDPC code from the column twist interleaver 24. Then, the demultiplexer 25 supplies the two or more code bits of the LDPC code obtained by the interchanging process to the mapper 117 (FIG. 8) as the symbol.

Figure 10:
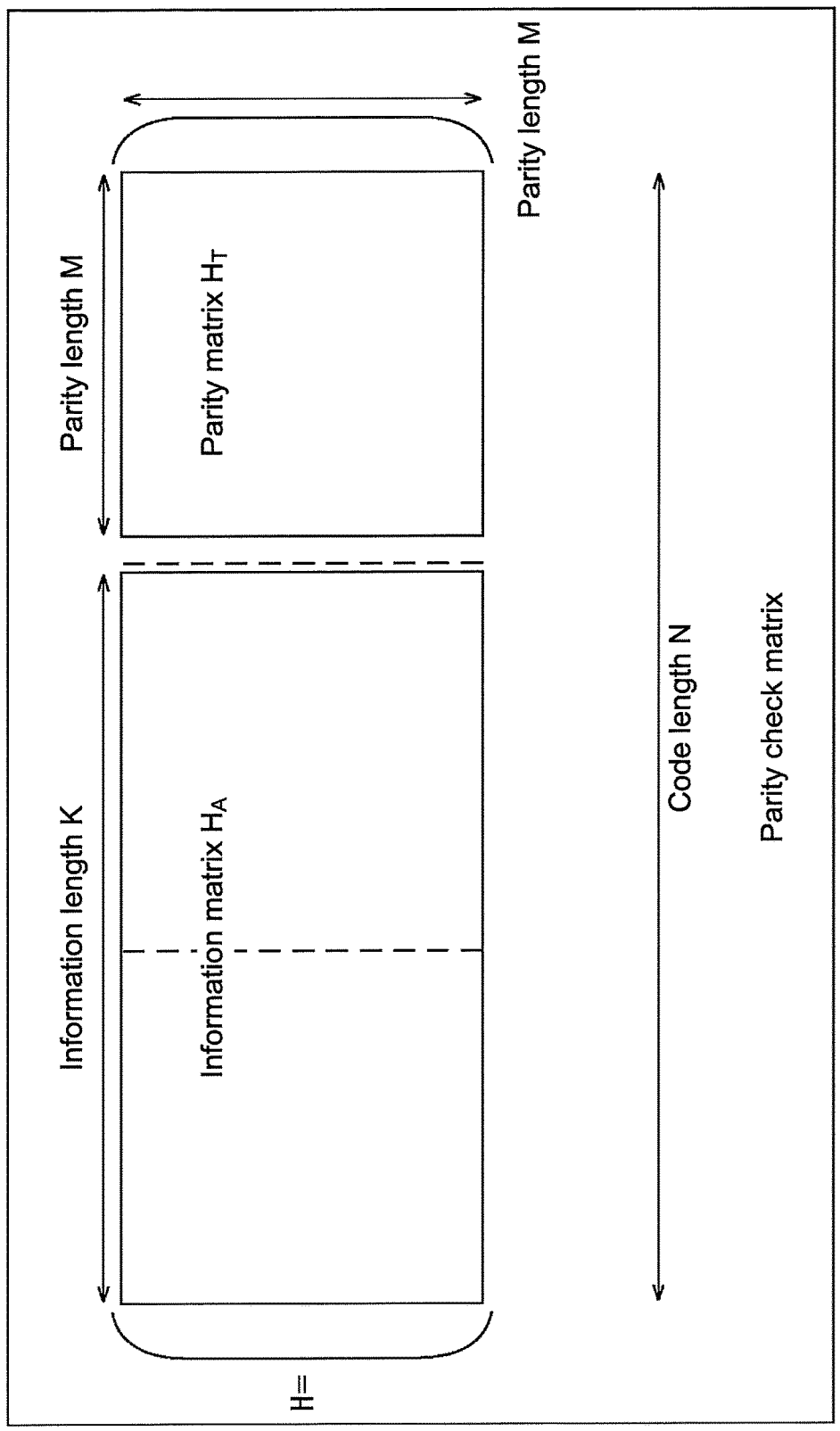
FIG. 10 A view showing the parity check matrix.

FIG. 10 shows the parity check matrix H used by the LDPC encoder 115 in FIG. 8 in the LDPC encoding.

The parity check matrix H has an LDGM (low-density generation matrix) structure and this may be represented by an equation $H=[H_A|H_T]$ (a matrix in which a left element is an element of an information matrix $H_A$ and a right element is an element of a parity matrix $H_T$) by the information matrix $H_A$ of a part corresponding to the information bits and the parity matrix $H_T$ corresponding to the parity bits out of the code bits of the LDPC code.

Herein, the number of information bits and the number of parity bits out of the code bits of one LDPC code (one codeword) are referred to as an information length K and a parity length M, respectively, and the number of code bits of one LDPC code is referred to as a code length N (=K+M).

The information length K and the parity length M of the LDPC code of a certain code length N are determined according to the code rate. The parity check matrix H is an M×N (row×column) matrix. The information matrix $H_A$ is an M×K matrix and the parity matrix $H_T$ is an M×M matrix.

Figure 11:
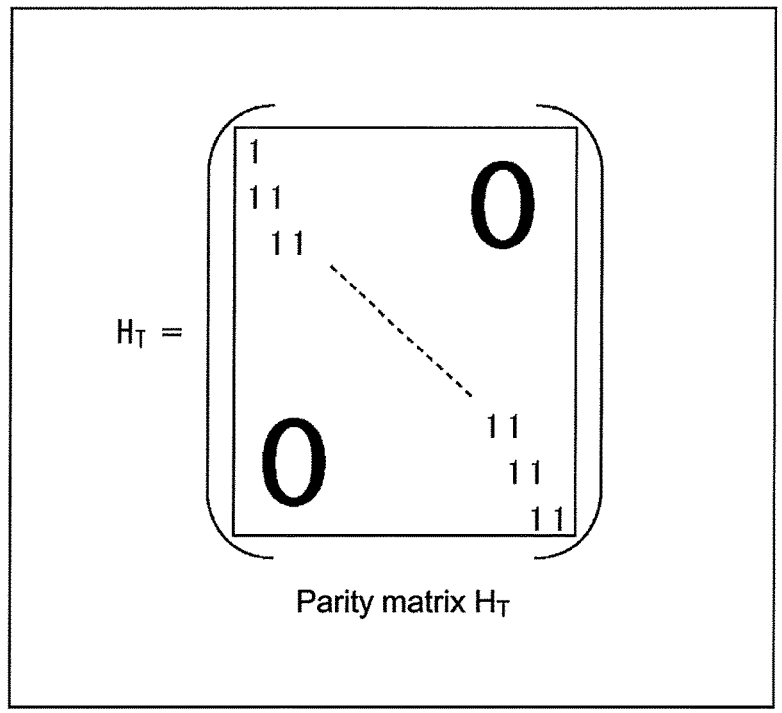
FIG. 11 A view showing a parity matrix.

FIG. 11 shows the parity matrix $H_T$ of the parity check matrix H of the LDPC code specified in the DVB-S.2, DVB-T.2 and DVB-C.2 standards.

The parity matrix $H_T$ of the parity check matrix H of the LDPC code specified in the DVB-T.2 standard has a lower bidiagonal matrix in which elements of 1 are arranged in a so-called stepwise manner as shown in FIG. 11. A row weight of the parity matrix $H_T$ is 1 for a first row and 2 for all other rows. A column weight is 1 for a last column and 2 for all other columns.

As described above, the LDPC code of the parity check matrix H in which the parity matrix $H_T$ has the stepwise structure may be easily generated using the parity check matrix H.

That is to say, the LDPC code (one codeword) is represented by a row vector c and a column vector obtained by transposing the row vector is represented as $c^T$. A part of the information bits of the row vector c, which is the LDPC code, is represented by a row vector A and a part of the parity bits is represented by a row vector T.

In this case, the row vector c may be represented by an equation c=[A|T] (row vector in which a left element is an element of the row vector A and a right element is an element of the row vector T) by the row vector A as the information bits and the row vector T as the parity bits.

The parity check matrix H and the row vector c=[A|T] as the LDPC code are required to satisfy an equation $Hc^T=0$ and it is possible to sequentially obtain (in order) the row vector T as the parity bits configuring the row vector c=[A T] satisfying such equation $Hc^T=0$ by setting the element of each row to 0 in order from the element of a first row of the column vector $Hc^T$ in the equation $Hc^T=0$ when the parity matrix $H_T$ of the parity check matrix $H=[H_A|H_T]$ has the stepwise structure illustrated in FIG. 11.

Figure 12:
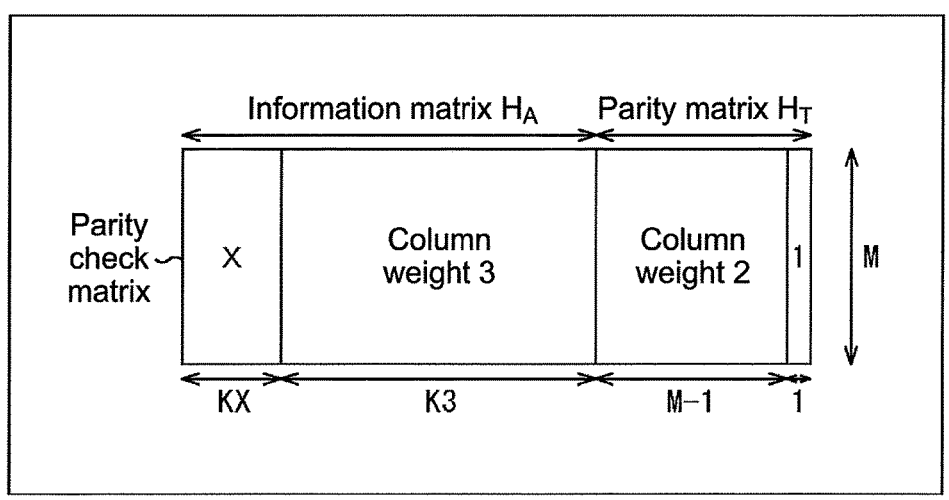
FIG. 12 A view illustrating the parity check matrix of the LDPC code specified in a DVB-S.2 standard.

FIG. 12 is a view illustrating the parity check matrix H of the LDPC code specified in the DVB-T.2 standard.

The column weight is X for first to KX-th columns, the column weight is 3 for next K3 columns, the column weight is 2 for next M−1 columns, and the column weight is 1 for a last column in the parity check matrix H of the LDPC code specified in the DVB-T.2 standard.

Herein, KX+K3+M−1+1 equals to the code length N.

FIG. 13 is a view showing the numbers of columns KX, K3, and M and the column weight X for each code rate r of the LDPC code specified in the DVB-T.2 standard.

The LDPC codes whose code lengths N are 64800 bits and 16200 bits are specified in the DVB-T.2 standard.

For the LDPC code whose code length N is 64800 bits, 11 code rates (nominal rates) 1/4, 1/3, 2/5, 1/2, 3/5, 2/3, 3/4, 4/5, 5/6, 8/9, and 9/10 are specified, and for the LDPC code whose code length N is 16200 bits, 10 code rates 1/4, 1/3, 2/5, 1/2, 3/5, 2/3, 3/4, 4/5, 5/6, and 8/9 are specified.

The code length N of 64800 bits is hereinafter also referred to as 64 k bits and the code length of 16200 bits is also referred to as 16 k bits.

As for the LDPC code, it is known that a bit error rate of the code bits corresponding to the column whose column weight is larger of the parity check matrix H is lower.

In the parity check matrix H specified in the DVB-T.2 standard illustrated in FIGS. 12 and 13, the column weight of the column closer to a top (leftmost) column tends to be larger, therefore, as for the LDPC code corresponding to the parity check matrix H, the code bit closer to a top code bit tends to be more tolerant to error (resistant to error) and the code bit closer to a last code bit tends to be less tolerant to error.

Figure 14:
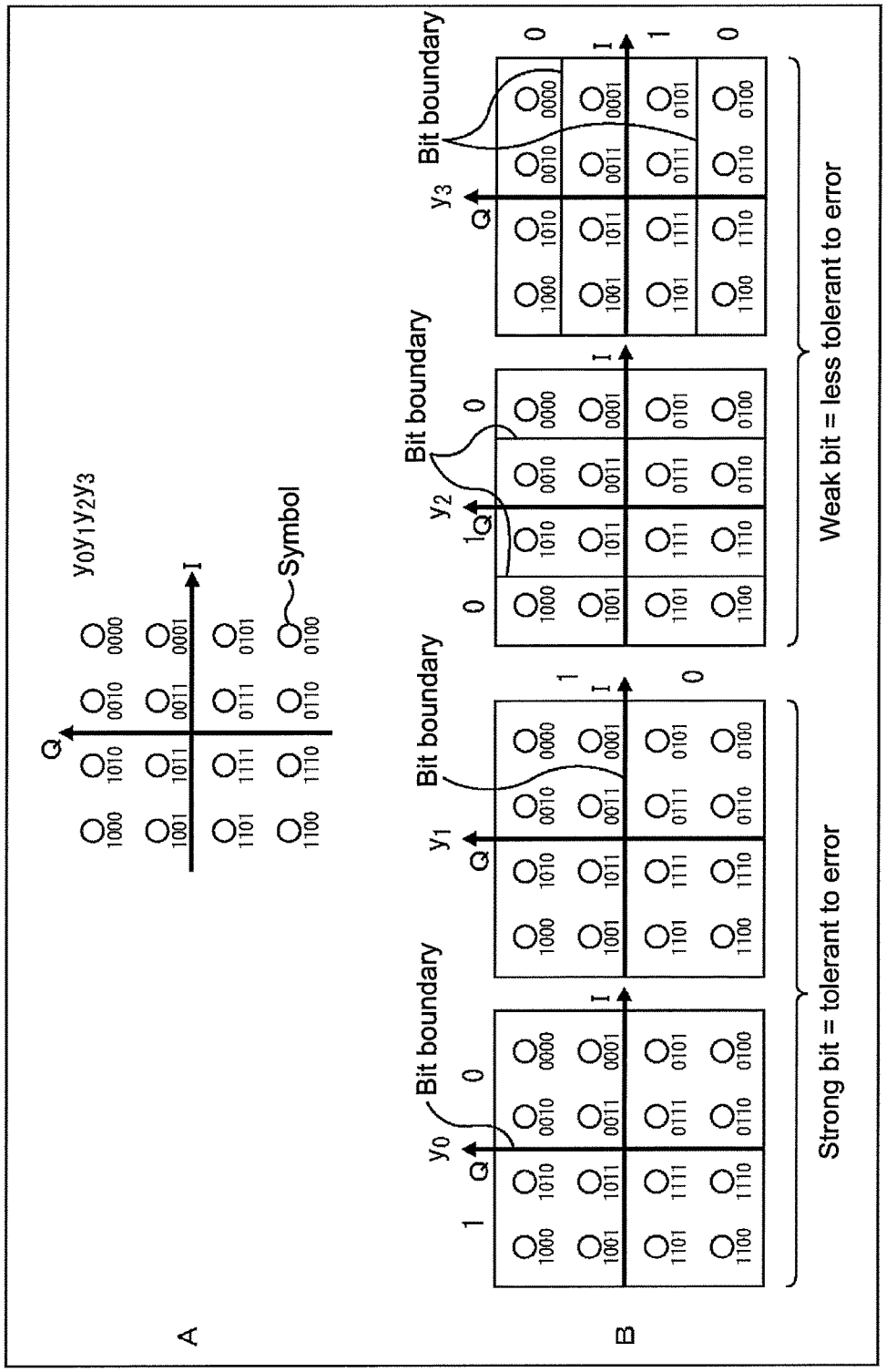
FIG. 14 A view showing a signal point constellation of 16QAM.

FIG. 14 illustrates arrangement on the IQ plane of (the signal points corresponding to) 16 symbols in a case in which the 16QAM is performed by the mapper 117 in FIG. 8.

That is to say, FIG. 14A shows the symbols of the 16QAM of DVB-T.2.

In the 16QAM, one symbol is represented by four bits and there are 16 ($=2^4$) symbols. The 16 symbols are arranged in a 4×4 square shape in I direction×Q direction around an origin of the IQ plane.

Supposing that an i+1-th bit from the highest-order bit of a bit column represented by one symbol is represented as a bit $y_i$, the four bits represented by the one symbol of the 16QAM may be sequentially represented as bits $y_0$, $y_1$, $y_2$, and $y_3$ in order from the highest-order bit. When the modulation scheme is the 16QAM, four code bits of the LDPC code are made the symbol (symbol value) of the four bits $y_0$ to $y_3$ (symbolized).

FIG. 14B illustrates a bit boundary of each of the four bits (hereinafter, also referred to as symbol bits) $y_0$ to $y_3$ represented by the symbol of the 16QAM.

Herein, the bit boundary of the symbol bit $y_i$ (i=0, 1, 2, 3 in FIG. 14) is intended to mean the boundary between the symbol whose symbol bit $y_i$ is 0 and the symbol whose symbol bit $y_i$ is 1.

As illustrated in FIG. 14B, as for the highest-order symbol bit $y_0$ out of the four symbol bits $y_0$ to $y_3$ represented by the symbol of the 16QAM, there is only one bit boundary on the Q axis of the IQ plane, and as for the second symbol bit $y_1$ (second highest-order bit), there is only one bit boundary on the I axis of the IQ plane.

As for the third symbol bit $y_2$, the bit boundaries are located on two portions, which are a portion between first and second columns from left and a portion between third and fourth columns from left of the 4×4 symbols.

Further, as for the fourth symbol bit $y_3$, the bit boundaries are located on two portions, which are a portion between first and second rows from the top and a portion between third and fourth rows from the top of the 4×4 symbols.

As the number of symbols away from the bit boundary is larger, the symbol bit $y_i$ represented by the symbol is less likely to have an error (error probability is lower), and as the number of symbols closer to the bit boundary is larger, this is likely to have an error (error probability is high).

If the bit, which is less likely to have an error (tolerant to error), is referred to as a "strong bit" and the bit, which is likely to have an error (less tolerant to error), is referred to as a "weak bit", as for the four symbol bits $y_0$ to $y_3$ of the symbol of the 16QAM, the highest-order symbol bit $y_0$ and the second symbol bit $y_1$ are the strong bits and the third symbol bit $y_2$ and the fourth symbol bit $y_3$ are the weak bits.

Figure 15:
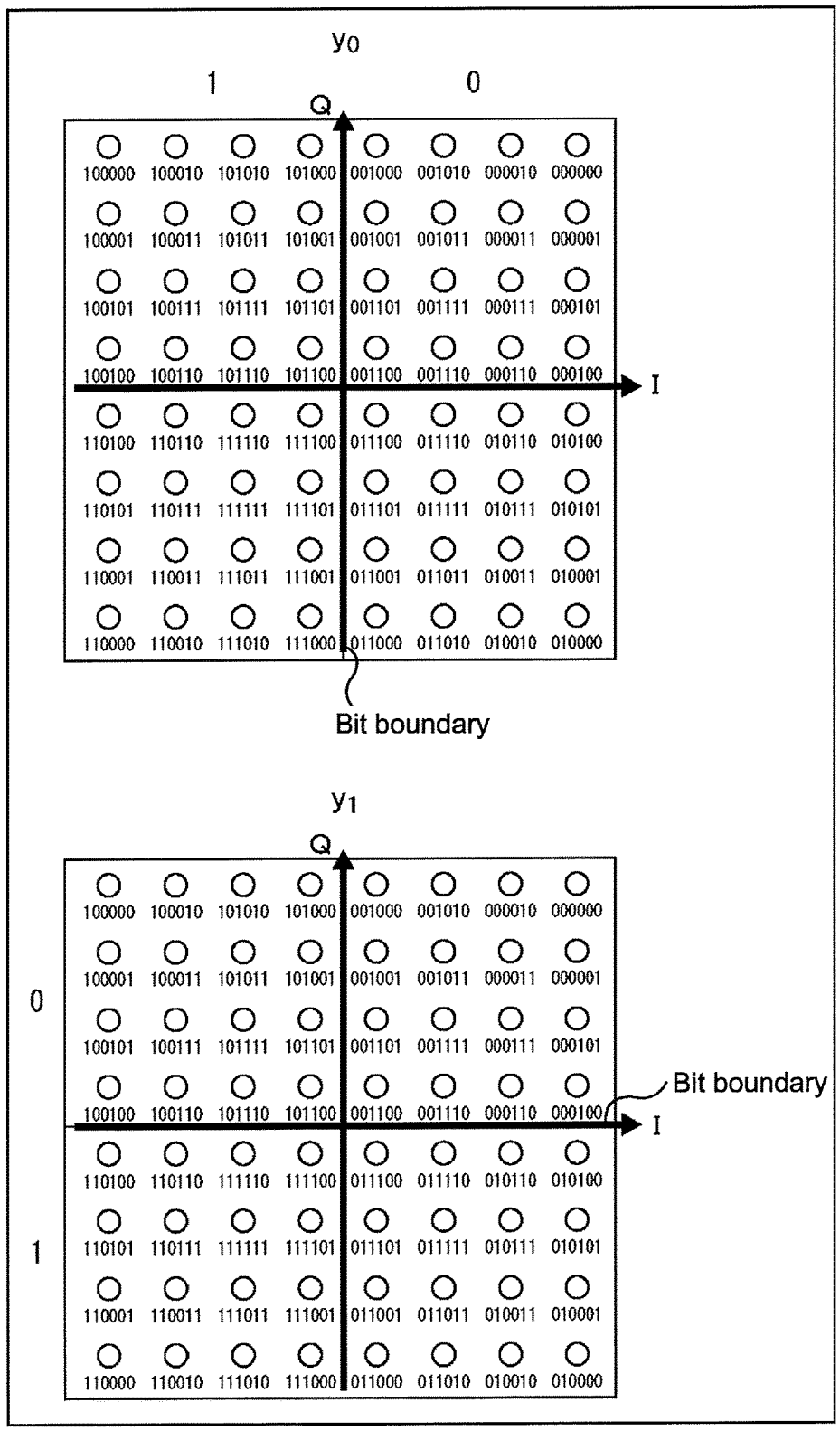
FIG. 15 A view showing the signal point constellation of 64QAM.
Figure 16:
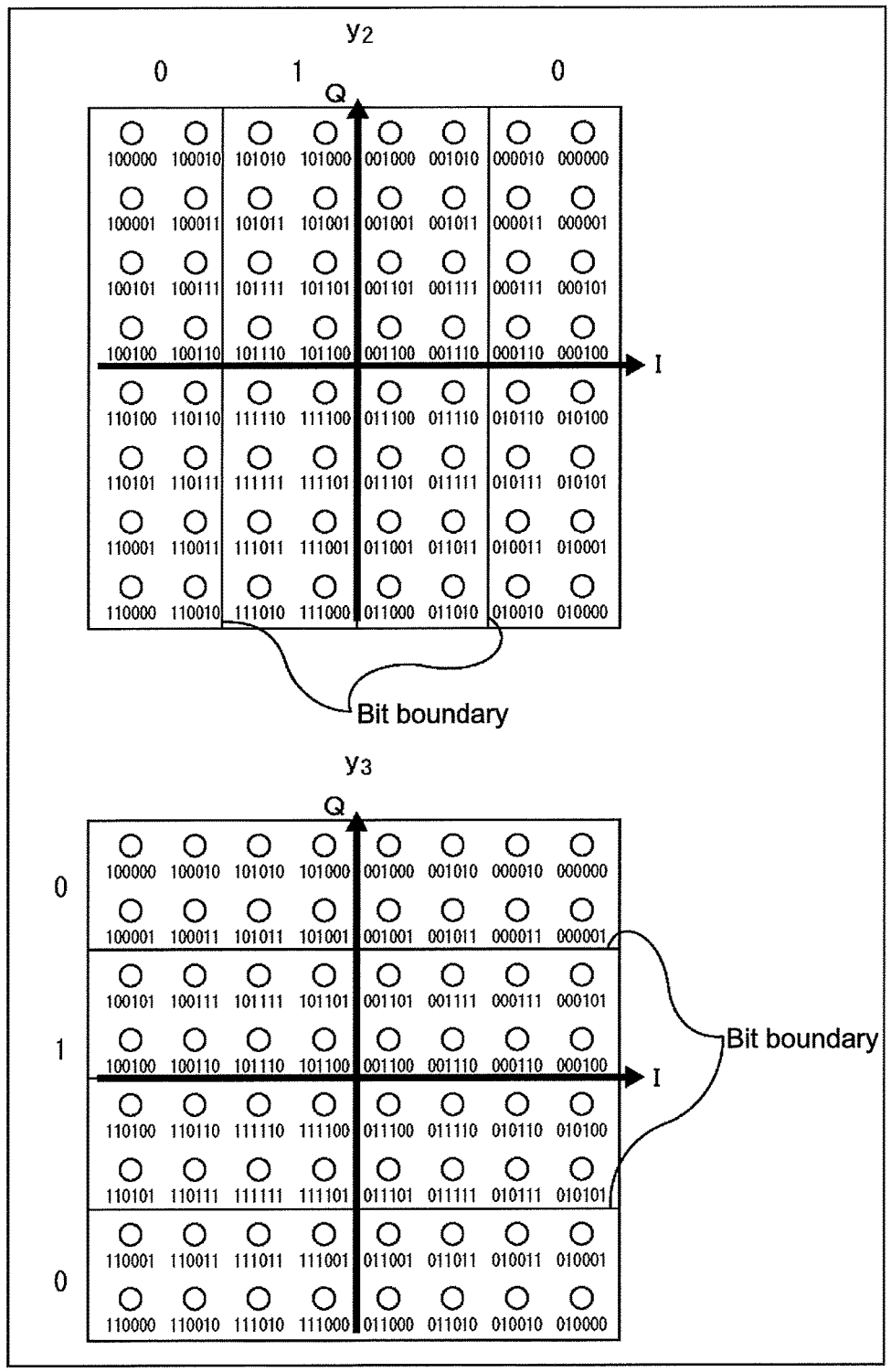
FIG. 16 A view showing the signal point constellation of the 64QAM.
Figure 17:
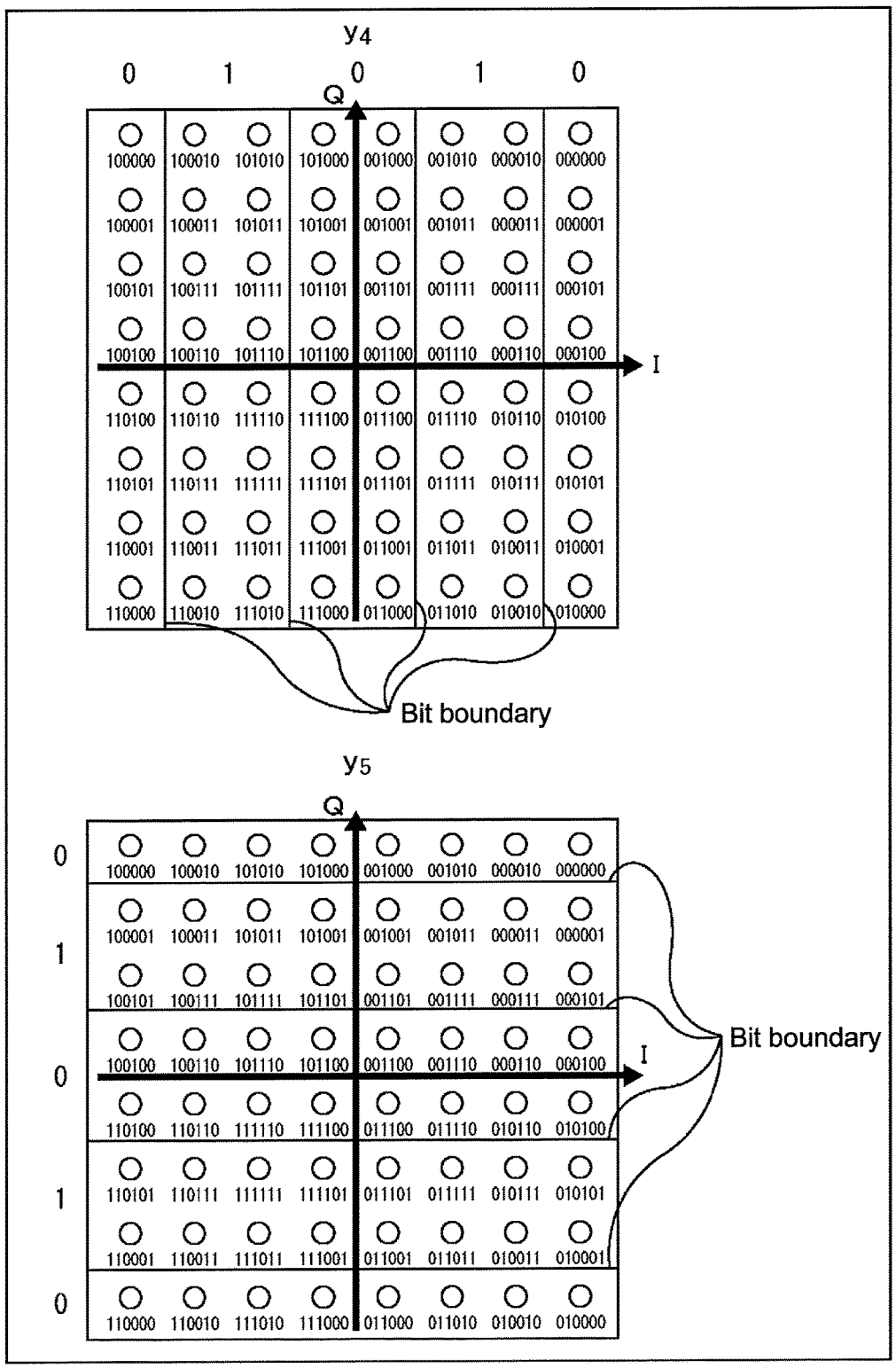
FIG. 17 A view showing the signal point constellation of the 64QAM.

FIGS. 15 to 17 illustrate the arrangement on the IQ plane of (the signal points corresponding to) 64 symbols when the 64QAM is performed by the mapper 117 in FIG. 8, that is to say, the symbols of the 16QAM in DVB-T.2.

In the 64QAM, 1 symbol represents six bits and there are 64 (=$2^6$) symbols. The 64 symbols are arranged in an 8×8 square shape in I direction×Q direction around the origin of the IQ plane.

The symbol bits of one symbol of the 64QAM may be represented as bits $y_0$, $y_1$, $y_2$, $y_3$, $y_4$, and $y_5$ in order from the highest-order bit. When the modulation scheme is the 64QAM, six code bits of the LDPC code are made the symbol of the six symbol bits $y_0$ to $y_5$.

Herein, FIG. 15 illustrates the bit boundary of each of the highest-order symbol bit $y_0$ and the second symbol bit $y_1$ out of the symbol bits $y_0$ to $y_5$ of the symbol of the 64QAM, FIG. 16 illustrates the bit boundary of each of the third symbol bit $y_2$ and the fourth symbol bit $y_3$, and FIG. 17 illustrates the bit boundary of each of the fifth symbol bit $y_4$ and the sixth symbol bit $y_5$, respectively.

As illustrated in FIG. 15, the bit boundary is located on one portion for the highest-order symbol bit $y_0$ and the second symbol bit $y_1$. Also, as illustrated in FIG. 16, the bit boundaries are located on two portions for the third symbol bit $y_2$ and the fourth symbol bit $y_3$, and as illustrated in FIG. 17, the bit boundaries are located on four portions for the fifth symbol bit $y_4$ and the sixth symbol bit $y_5$.

Therefore, as for the symbol bits $y_0$ to $y_5$ of the symbol of the 64QAM, the highest-order symbol bit $y_0$ and the second symbol bit $y_1$ are the strong bits and the third symbol bit $y_2$ and the fourth symbol bit $y_3$ are next strongest bits. The fifth symbol bit $y_4$ and the sixth symbol bit $y_5$ are the weak bits.

From FIG. 14 and further from FIGS. 15 to 17, it is understood that a high-order bit tends to be the strong bit and a low-order bit tends to be the weak bit as for the symbol bits of the symbol of the orthogonal modulation.

Figure 18:
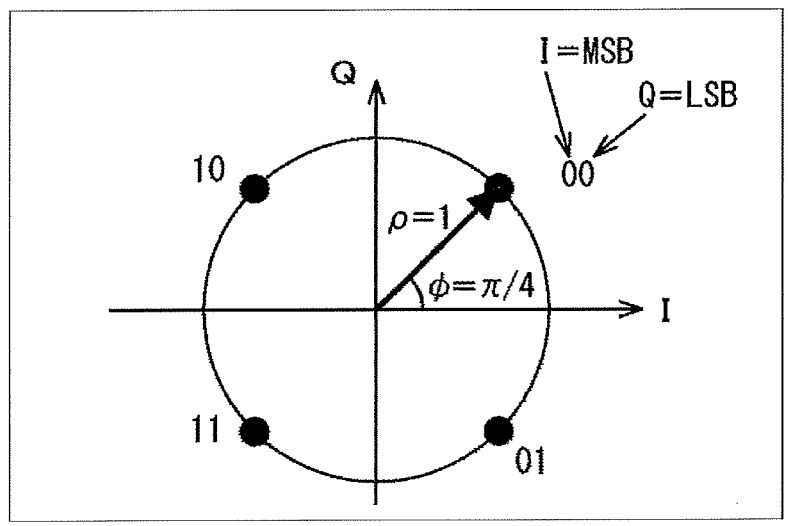
FIG. 18 A view showing the signal point constellation specified in the DVB-S.2 standard.

FIG. 18 is a view showing an example that four symbols (corresponding to signal points) are arranged on the IQ plane, i.e., the signal point constellation specified in the DVB-S.2, when a satellite circuit is adopted as the communication channel 13 (FIG. 7), and the QPSK is performed at the mapper 117 in FIG. 8.

In the QPSK by the DVB-S.2, the symbols are mapped to any of four signal points on a circumference of a circle where a radius p is 1 centered at an original point on the IQ plane.

Figure 19:
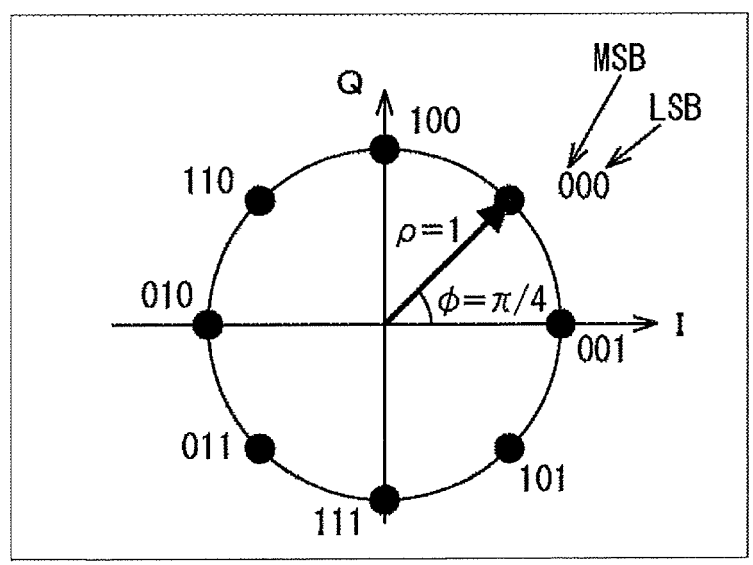
FIG. 19 A view showing the signal point constellation specified in the DVB-S.2 standard.

FIG. 19 is a view showing an example that eight symbols are arranged on the IQ plane, i.e., the signal point constellation of 8PSK by the DVB-S.2, when a satellite circuit is adopted as the communication channel 13 (FIG. 7), and the 8PSK is performed at the mapper 117 in FIG. 8.

In the 8PSK by the DVB-S.2, the symbols are mapped to any of eight signal points on a circumference of a circle where a radius p is 1 centered at an original point on the IQ plane.

Figure 20:
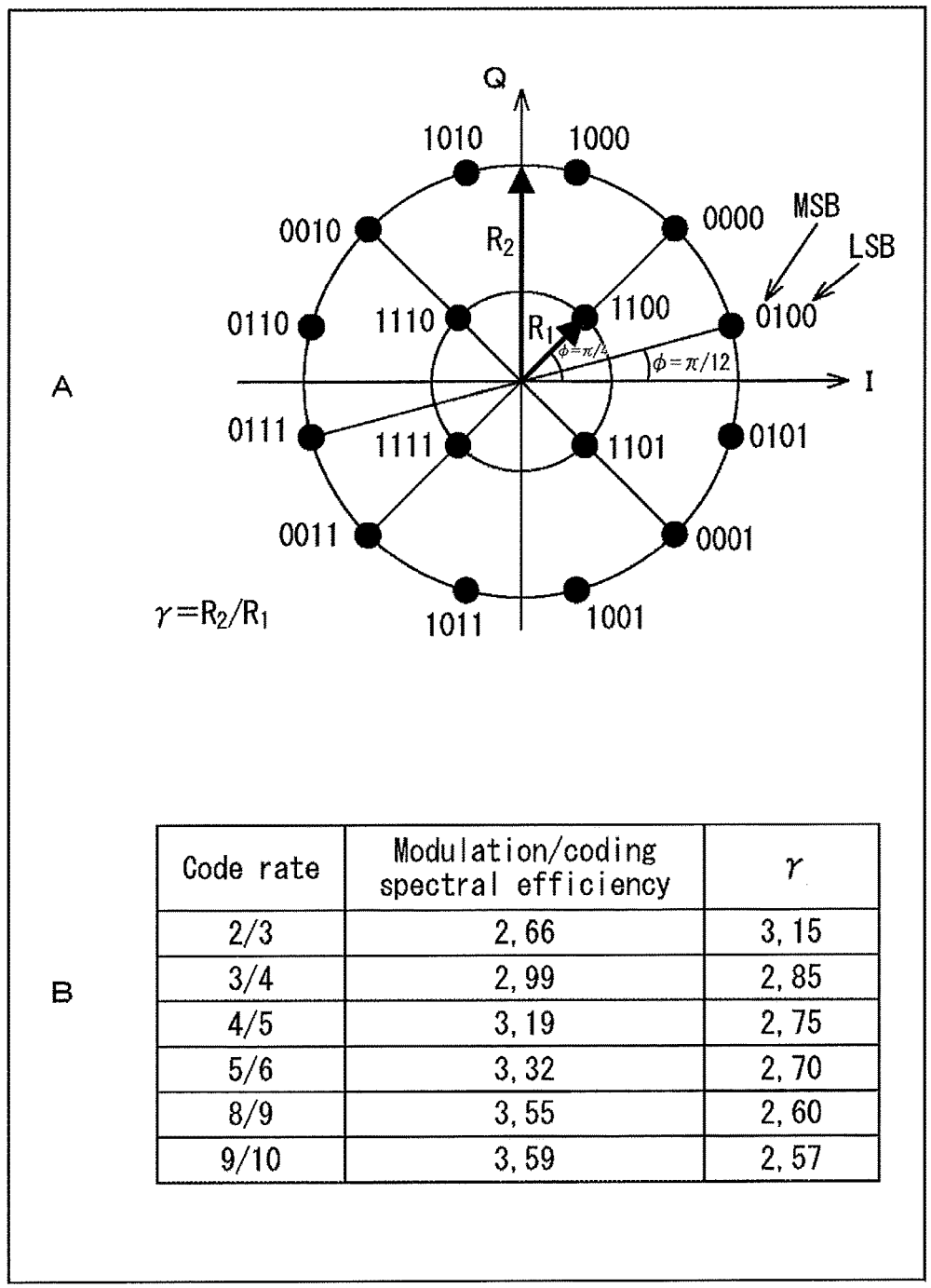
FIG. 20 A view showing the signal point constellation specified in the DVB-S.2 standard.

FIG. 20 is a view showing an example that 16 symbols are arranged on the IQ plane, i.e., the signal point constellation of 16APSK by the DVB-S.2, when a satellite circuit is adopted as the communication channel 13 (FIG. 7), and the 16APSK is performed at the mapper 117 in FIG. 8.

FIG. 20A shows constellation of 16APSK by the DVB-S.2.

In the 16APSK by the DVB-S.2, symbols are mapped to any of 16 signal points in total, i.e., four signal points on a circumference of a circle where a radius $R_1$ is centered at an original point on the IQ plane, and 12 signal points on a circumference of a circle where a radius is $R_2$ (>$R_1$).

FIG. 20B shows a radius ratio γ=radius $R_2$/radius $R_1$ in the constellation of the 16APSK by the DVB-S.2.

In the constellation of the 16APSK by the DVB-S.2, the radius ratio γ of the radius $R_2$ to the radius $R_1$ is different for the code rate.

Figure 21:
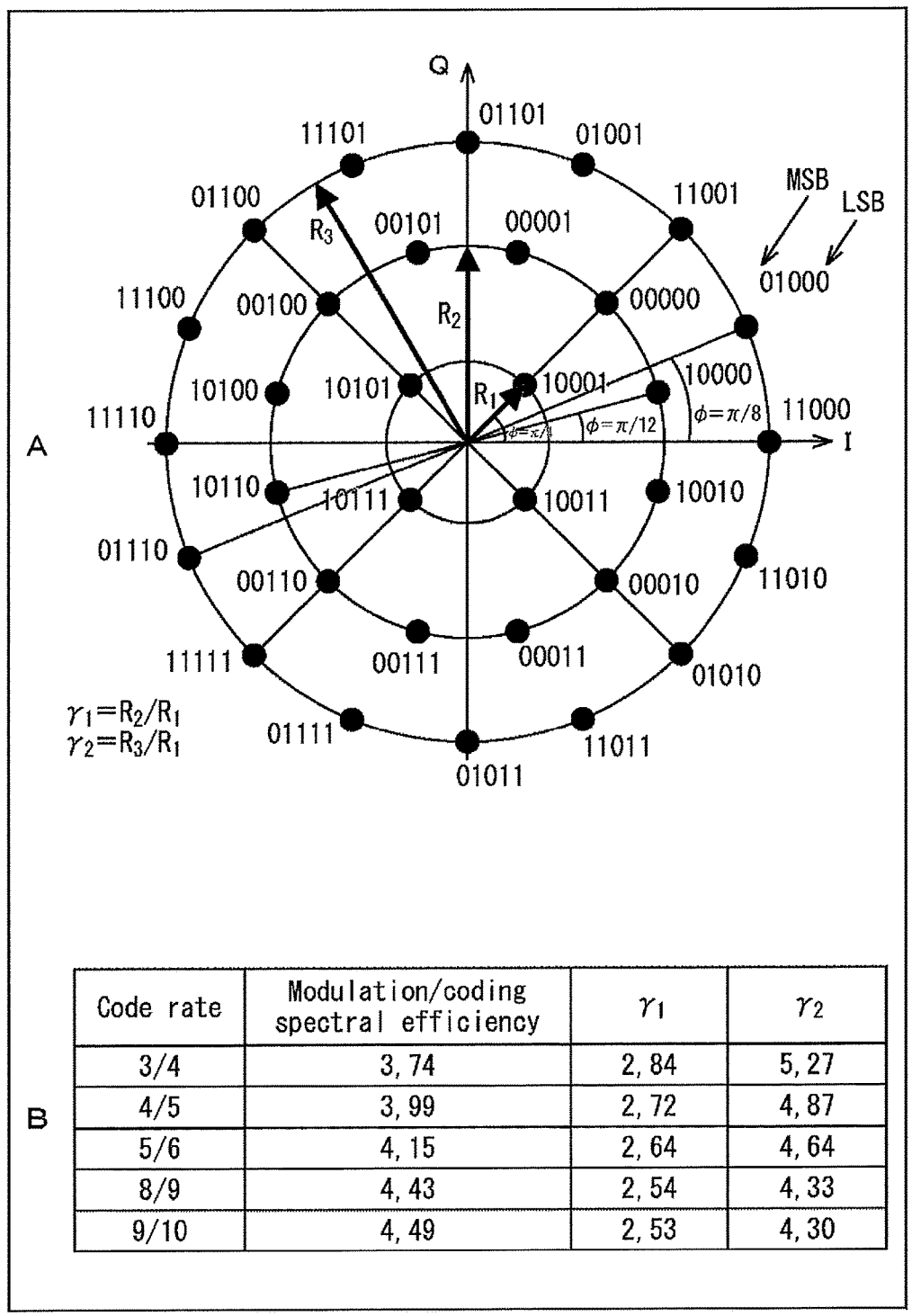
FIG. 21 A view showing the signal point constellation specified in the DVB-S.2 standard.

FIG. 21 is a view showing an example that 32 symbols are arranged on the IQ plane, i.e., the signal point constellation of 32APSK by the DVB-S.2, when a satellite circuit is adopted as the communication channel 13 (FIG. 7), and the 32APSK is performed at the mapper 117 in FIG. 8.

FIG. 21A shows constellation of 32APSK in the DVB-S.2.

In the 32APSK by the DVB-S.2, symbols are mapped to any of 32 signal points in total, i.e., four signal points on a circumference of a circle where a radius $R_1$ is centered at an original point on the IQ plane, 12 signal points on a circumference of a circle where a radius is $R_2$ (>$R_1$), and 16 signal points on a circumference of a circle where a radius is $R_3$ (>$R_2$).

FIG. 21B shows a radius ratio $γ_1$=radius $R_2$/radius $R_1$ and a radius ratio $γ_2$=radius $R_3$/radius $R_1$ in the constellation of the 32APSK by the DVB-S.2.

In the constellation of the 32APSK by the DVB-S.2, the radius ratio $γ_1$ of the radius $R_2$ to the radius $R_1$ and the radius ratio $γ_2$ of the radius $R_3$ to the radius $R_1$ are different for the code rate.

Also, as to the symbol bits of the orthogonal modulation symbols (QPSK, 8PSK, 16APSK, 32APSK) by the DVB-S.2 of which constellations are shown in FIG. 18 to FIG. 21, there are the strong bit and the weak bit, similar to the case shown in FIG. 14 to FIG. 17.

Herein, as illustrated in FIGS. 12 and 13, the LDPC code output from the LDPC encoder 115 (FIG. 8) includes the code bit tolerant to error and the code bit less tolerant to error.

Also, as illustrated in FIGS. 14 to 21, there are the strong bit and the weak bit as the symbol bit of the symbol of the orthogonal modulation performed by the mapper 117.

Therefore, when the code bit less tolerant to error of the LDPC code is allocated to the weak symbol bit of the symbol of the orthogonal modulation, the resistance to error is deteriorated as a whole.

Then, the interleaver, which interleaves the code bit of the LDPC code so as to allocate the code bit less tolerant to error of the LDPC code to the strong bit (symbol bit) of the symbol of the orthogonal modulation, is suggested.

The demultiplexer 25 in FIG. 9 may perform the process of the interleaver.

Figure 22:
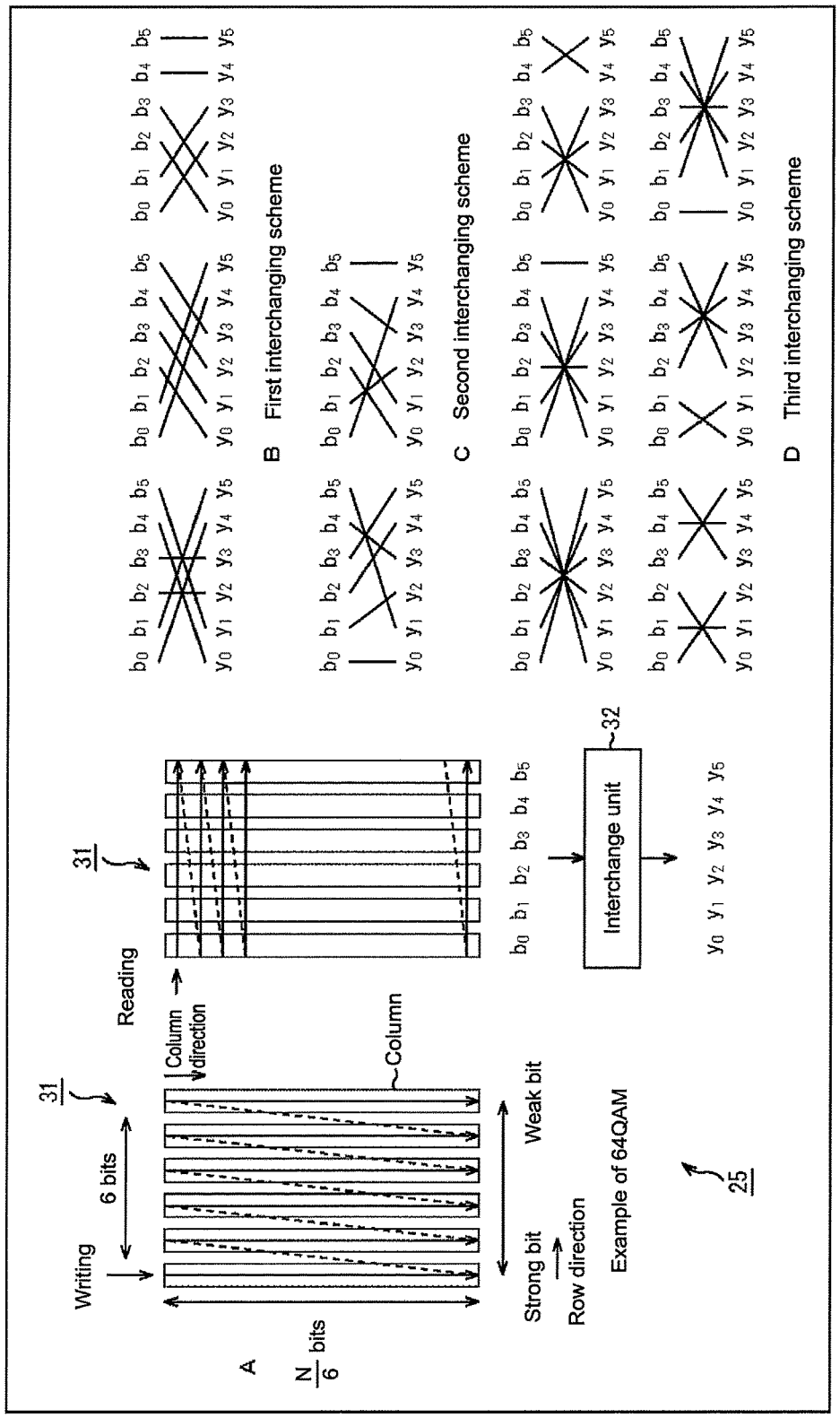
FIG. 22 A view showing a process of a demultiplexer 25.

FIG. 22 is a view illustrating the process of the demultiplexer 25 in FIG. 9.

That is to say, FIG. 22A shows a functional configuration example of the demultiplexer 25.

The demultiplexer 25 is configured of a memory 31 and an interchange unit 32.

The LDPC code from the LDPC encoder 115 is supplied to the memory 31.

The memory 31 has a storage capacity to store mb bits in a row (horizontal) direction and store N/(mb) bits in a column (vertical) direction and writes the code bits of the LDPC code supplied thereto in the column direction and reads the same in the row direction to supply to the interchange unit 32.

Herein, N (=information length K+parity length M) represents the code length of the LDPC code as described above.

Also, m represents the number of code bits of the LDPC code to be made one symbol and b being a predetermined positive integer is a multiple number used for obtaining an integral multiple of in. The demultiplexer 25 makes the code bit of the LDPC code the symbol (symbolizes) as described above; the multiple number b represents the number of symbols obtained by so-called single symbolization by the demultiplexer 25.

FIG. 22A shows the configuration example of the demultiplexer 25 in a case in which the modulation scheme is the 64QAM that maps the symbol to any of 64 signal points, so that the number of code bits m of the LDPC code to be made one symbol is six.

In FIG. 22A, the multiple number b is set to 1, so that the memory 31 has the storage capacity of N/(6×1)×(6×1) bits (in column direction×row direction).

A storage region extending in the column direction with one bit in the row direction of the memory 31 is hereinafter appropriately referred to as a column. In FIG. 22A, the memory 31 is configured of six (=6×1) columns.

The demultiplexer 25 writes the code bits of the LDPC code from the top of the column configuring the memory 31 downward (in the column direction) from a left column to a right column.

When the writing of the code bits is finished up to an undermost portion of a rightmost column, the code bits are read in units of six bits (mb bits) in the row direction from a first row of all the columns configuring the memory 31 to be supplied to the interchange unit 32.

The interchange unit 32 performs the interchanging process to interchange the positions of the six code bits from the memory 31 and outputs the six bits obtained as a result as the six symbol bits $y_0$, $y_1$, $y_2$, $y_3$, $y_4$, and $y_5$ representing one symbol of the 64QAM.

That is to say, the mb (herein, six) code bits are read from the memory 31 in the row direction, and when an i-th bit (i=0, 1, . . . , mb−1) from the highest-order bit of the mb code bits read from the memory 31 is represented as a bit $b_i$, the six code bits read from the memory 31 in the row direction may be represented as bits $b_0$, $b_1$, $b_2$, $b_3$, $b_4$, and $b_5$ in order from the highest-order bit.

According to relationship of the column weight as illustrated in FIGS. 12 and 13, the code bit in a direction of the bit $b_0$ is the code bit tolerant to error and the code bit in a direction of the bit $b_5$ is the code bit less tolerant to error.

The interchange unit 32 may perform the interchanging process to interchange positions of the six code bits $b_0$ to $b_5$ from the memory 31 such that the code bit less tolerant to error out of the six code bits $b_0$ to $b_5$ from the memory 31 is allocated to the strong bit out of the symbol bits $y_0$ to $y_5$ of one symbol of the 64QAM.

Herein, various schemes are suggested by many companies as an interchanging scheme of interchanging the six code bits $b_0$ to $b_5$ from the memory 31 and allocating the same to the six symbol bits $y_0$ to $y_5$ representing one symbol of the 64QAM.

FIG. 22B shows a first interchanging scheme, FIG. 22C shows a second interchanging scheme, and FIG. 22D shows a third interchanging scheme, respectively.

In FIGS. 22B to 22D (also in FIG. 23 to be illustrated later), a line segment connecting the bits $b_i$ and $y_j$ indicates that the code bit $b_i$ is allocated to the symbol bit $y_j$ of the symbol (interchanged to a position of the symbol bit $y_j$).

As the first interchanging scheme in FIG. 22B, it is suggested to adopt any one of three interchanging methods and as the second interchanging scheme in FIG. 22C, it is suggested to adopt any one of two interchanging methods.

As the third interchanging scheme in FIG. 22D, it is suggested to sequentially select from six interchanging methods to use.

Figure 23:
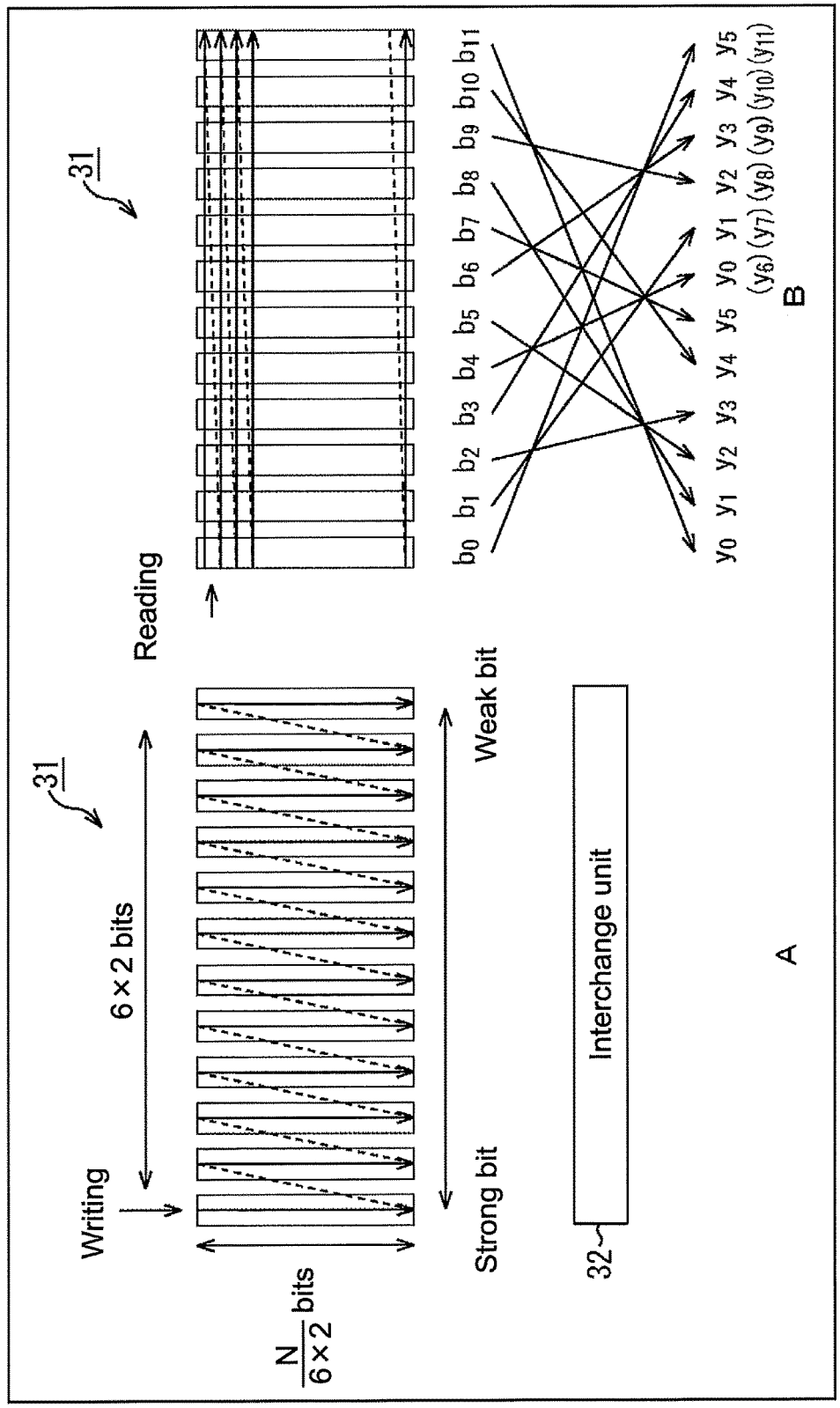
FIG. 23 A view showing a process of a demultiplexer 25.

FIG. 23 shows the configuration example of the demultiplexer 25 in a case in which the modulation scheme is the 64QAM that maps the symbol to any of 64 signal points (therefore, the number of code bits m of the LDPC code mapped onto one symbol is six as in FIG. 22) and the multiple number b is set to 2, and a fourth interchanging scheme.

When the multiple number b is set to 2, the memory 31 has the storage capacity of N/(6×2)×(6×2) bits (in column direction×row direction) and is configured of 12 (=6×2) columns.

FIG. 23A shows the order of writing of the LDPC code to the memory 31.

The demultiplexer 25 writes the code bits of the LDPC code from the top of the column configuring the memory 31 downward (in the column direction) from the left column to the right column as illustrated in FIG. 22.

When the writing of the code bits is finished up to the undermost portion of the rightmost column, the code bits are read in units of 12 bits (mb bits) in the row direction from the first row of all the columns configuring the memory 31 to be supplied to the interchange unit 32.

The interchange unit 32 performs the interchanging process to interchange the positions of the 12 code bits from the memory 31 by the fourth interchanging scheme and outputs the 12 bits obtained as a result as the 12 bits representing two symbols (b symbols) of the 64QAM, that is to say, the six symbol bits $y_0$, $y_1$, $y_2$, $y_3$, $y_4$, and $y_5$ representing one symbol of the 64QAM and the six symbol bits $y_0$, $y_1$, $y_2$, $y_3$, $y_4$, and $y_5$ representing next one symbol.

Herein, FIG. 23B shows the fourth interchanging scheme of the interchanging process by the interchange unit 32 in FIG. 23A.

When the multiple number b is set to 2 (also when this is set to 3), the mb code bits are allocated to mb symbol bits of successive b symbols in the interchanging process. Hereinafter, also in FIG. 23, the i+1-th bit from the highest-order bit of the mb symbol bits of the successive b symbols is represented as the bit (symbol bit) $y_i$ for convenience of description.

An appropriate interchanging method, that is to say, the method of further improving the bit error rate in the AWGN communication channel is different according to the code rate, the code length, the modulation scheme and the like of the LDPC code.

<Parity Interleave>

Next, the parity interleave by the parity interleaver 23 in FIG. 9 is described with reference to FIGS. 24 to 26.

Figure 24:
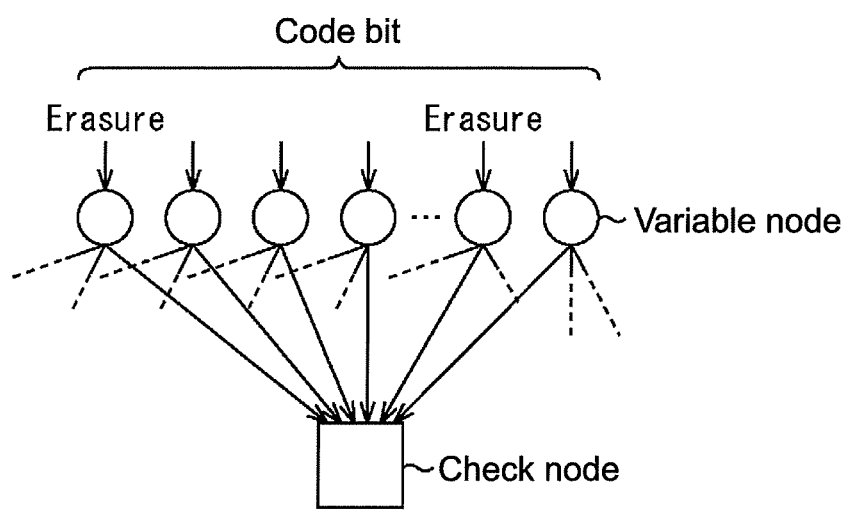
FIG. 24 A view showing the Tanner graph for decoding of the LDPC code.

FIG. 24 shows (a part of) a Tanner graph of the parity check matrix of the LDPC code.

The check node returns the message indicating that the probability that the value is 0 and the probability that the value is 1 are equal to all the variable nodes connected to the check node when the error such as the erasure occurs in a plurality (for example, two) of (code bits corresponding to the) variable nodes connected to the check node at the same time as illustrated in FIG. 24. Therefore, when the erasure and the like occur at the same time in a plurality of variable nodes connected to the same check node, the decoding performance is deteriorated.

The LDPC code specified in the DVB-S.2 standard output by the LDPC encoder 115 in FIG. 8 is the IRA code and the parity matrix $H_T$ of the parity check matrix H has the stepwise structure as illustrated in FIG. 11.

Figure 25:
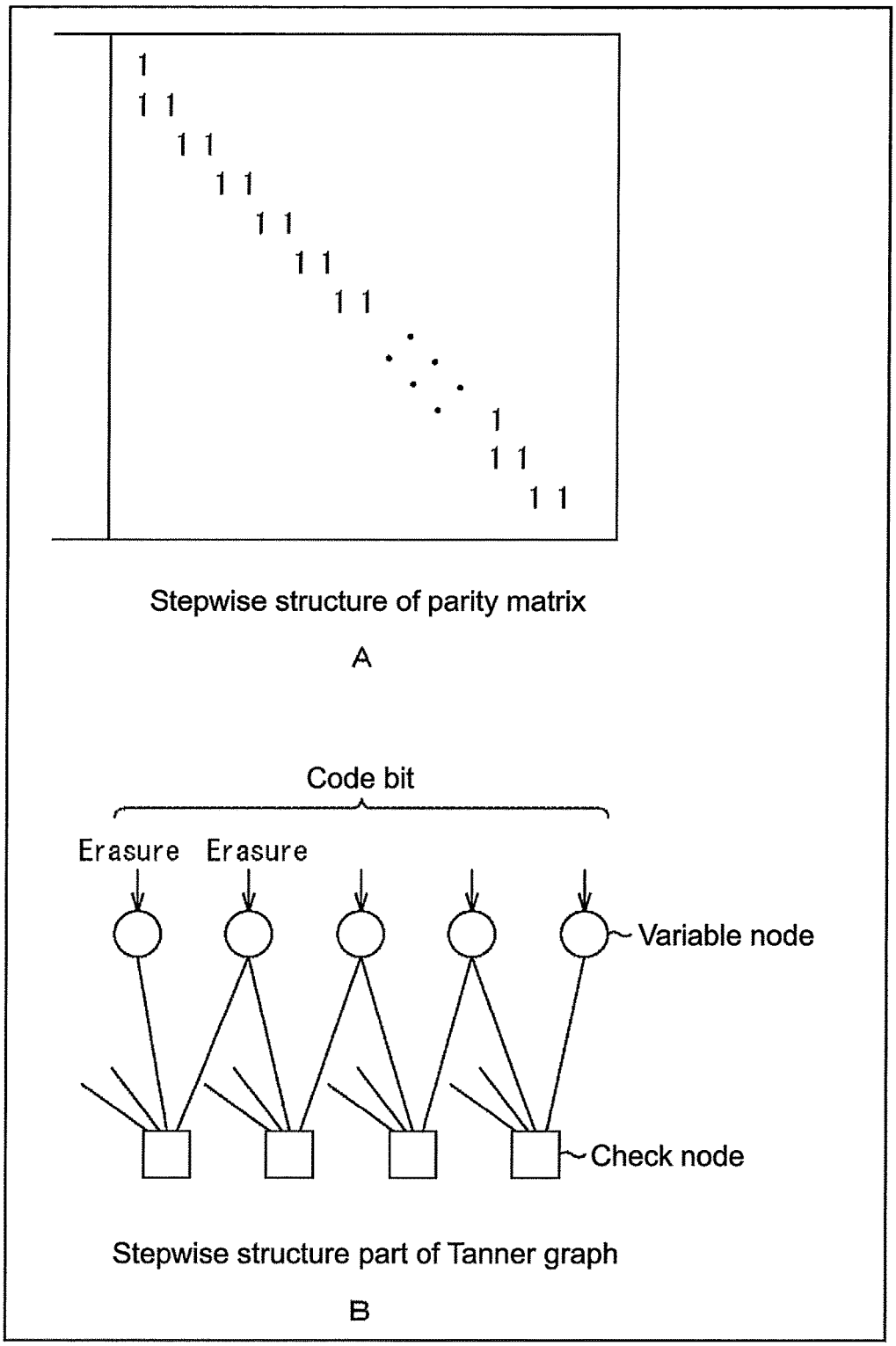
FIG. 25 A view showing a parity matrix $H_T$ having a stepwise structure and the Tanner graph corresponding to the parity matrix $H_T$.

FIG. 25 shows the parity matrix $H_T$ having the stepwise structure and the Tanner graph corresponding to the parity matrix $H_T$.

That is to say, FIG. 25A shows the parity matrix $H_T$ having the stepwise structure and FIG. 25B shows the Tanner graph corresponding to the parity matrix $H_T$ in FIG. 25A.

In the parity matrix $H_T$ having the stepwise structure, the elements of 1 are adjacent to each other in each row (except the first row). Therefore, in the Tanner graph of the parity matrix $H_T$, two adjacent variable nodes corresponding to the columns of the two adjacent elements whose value is 1 of the parity matrix $H_T$ are connected to the same check node.

Therefore, when the error occurs in the parity bits corresponding to the above-described adjacent two variable nodes at the same time due to the burst error, the erasure and the like, the check node connected to the two variable nodes (the variable nodes, which obtain the message using the parity bits) corresponding to the two parity bits in which the error occurs returns the message indicating that the probability that the value is 0 and the probability that the value is 1 are equal to the variable nodes connected to the check node, whereby the decoding performance is deteriorated. When a burst length (the number of parity bits in which the error is successively occurs) increases, the number of check nodes, which return the message of the equal probability, increases and the decoding performance is further deteriorated.

Then, the parity interleaver 23 (FIG. 9) performs the parity interleave to interleave the parity bit of the LDPC code from the LDPC encoder 115 to the position of another parity bit in order to prevent the above-described deterioration in decoding performance.

Figure 26:
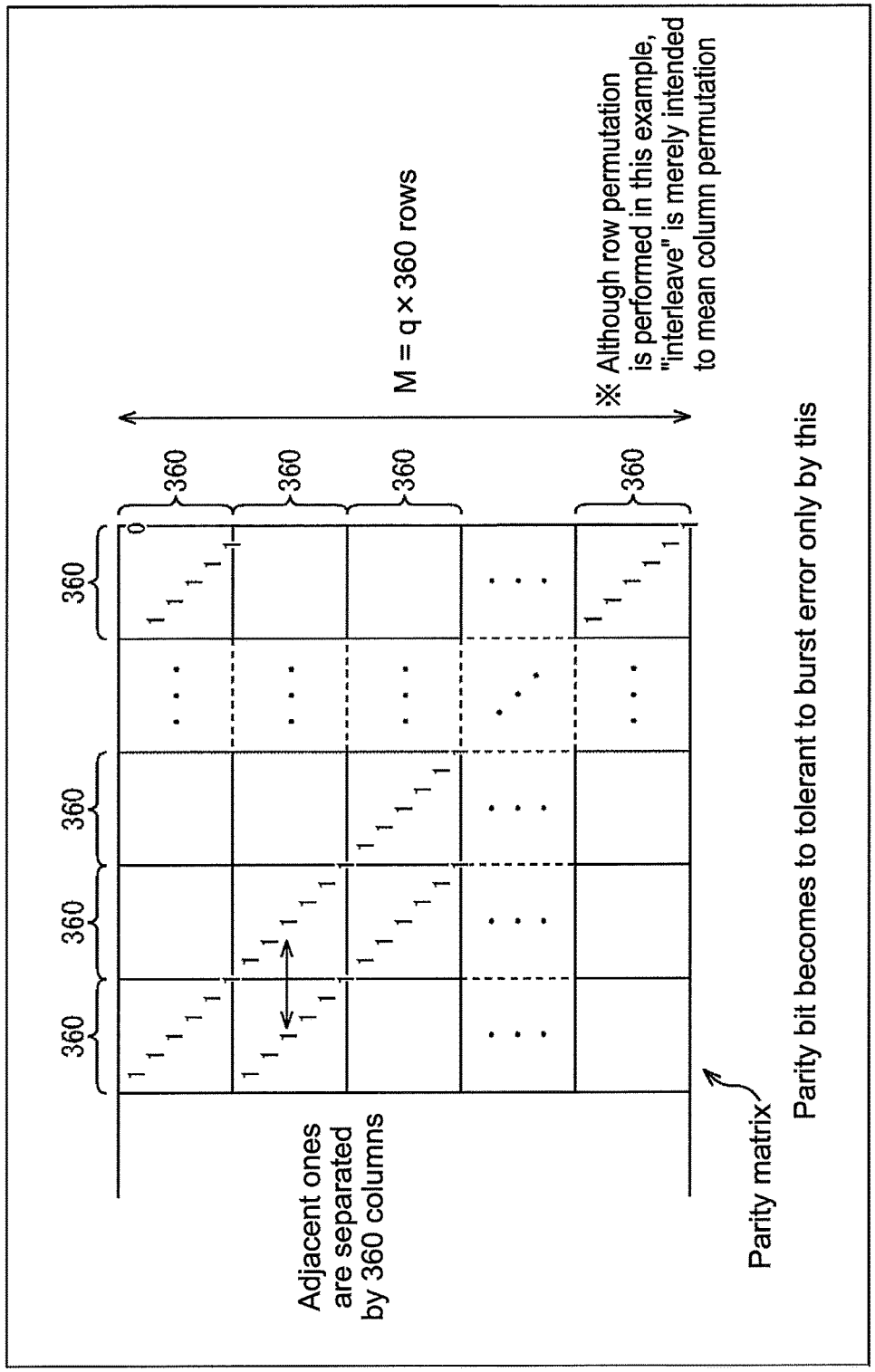
FIG. 26 A view showing the parity matrix $H_T$ of the parity check matrix H corresponding to the LDPC code after parity interleave.

FIG. 26 shows the parity matrix $H_T$ of the parity check matrix H corresponding to the LDPC code after the parity interleave performed by the parity interleaver 23 in FIG. 9.

Herein, the information matrix $H_A$ corresponding to the LDPC code specified in the DVB-S.2 standard output by the LDPC encoder 115 has a cyclic structure.

The term "cyclic structure" is intended to mean a structure in which a certain column is identical to a column obtained by a cyclic shift of another column including a structure in which a position of 1 in each row of P columns is set to a position obtained by the cyclic shift of a first column of the P columns in the column direction by a value proportional to a value q obtained by dividing the parity length M for each P columns, for example. Hereinafter, P in the cyclic structure is appropriately referred to as the number of columns being a unit of the cyclic structure.

There are two types of LDPC codes whose code lengths N are 64800 bits and 16200 bits as the LDPC code specified in the DVB-S.2 standard as illustrated in FIGS. 12 and 13, and the number of columns P being the unit of the cyclic structure is set to 360, which is one of submultiples other than 1 and M out of the submultiples of the parity length M for both of the two LDPC codes.

The parity length M is set to a value other than a prime number represented by an equation $M=q \times P=q \times 360$ using the value q different according to the code rate. Therefore, as the number of columns P being the unit of the cyclic structure, the value q also is another submultiple other than 1 and M out of the submultiples of the parity length M and this may be obtained by dividing the parity length M by the number of columns P being the unit of the cyclic structure (a product of P and q being the submultiples of the parity length M is the parity length M).

When the information length is K, an integer not smaller than 0 and smaller than P is x, and an integer not smaller than 0 and smaller than q is y, the parity interleaver 23 interleaves a K+qx+y+1-th code bit out of the code bits of the N-bit LDPC code to a position of a K+Py+x+1-th code bit as the parity interleave as described above.

Both the K+qx+y+1-th code bit and the K+Py+x+1-th code bit are the code bits after a K+1-th code bit, so that they are the parity bits, therefore, the positions of the parity bits of the LDPC code is moved by the parity interleave.

According to such parity interleave, (the parity bits corresponding to) the variable nodes connected to the same check node are apart from each other by the number of columns P being the unit of the cyclic structure, that is to say, herein 360 bits, so that a situation in which the error occurs in a plurality of variable nodes connected to the same check node at the same time may be avoided in a case in which the burst length is shorter than 360 bits, and as a result, the resistance to burst error may be improved.

The LDPC code after the parity interleave to interleave the K+qx+y+1-th code bit to the position of the K+Py+x+1-th code bit is identical to the LDPC code of the parity check matrix obtained by performing column permutation to change the K+qx+y+1-th column of the original parity check matrix H to the K+qx+x+1-th column (hereinafter, also referred to as a conversion parity check matrix).

Also, a quasi-cyclic structure in units of P columns (360 columns in FIG. 26) appears in the parity matrix of the conversion parity check matrix as illustrated in FIG. 26.

Herein, the term "quasi-cyclic structure" is intended to mean a structure in which a portion except a part has the cyclic structure. In the conversion parity check matrix obtained by applying the column permutation corresponding to the parity interleave to the parity check matrix of the LDPC code specified in the DVB-S.2 standard, one element 1 is lacking (there is an element 0) in a portion of 360 rows×360 columns in a right corner thereof (a shift matrix to be described later), so that this does not have the (complete) cyclic structure and has the so-called quasi-cyclic structure in this point.

The conversion parity check matrix in FIG. 26 is the matrix obtained by applying permutation of the row (row permutation) for allowing the conversion parity check matrix to be configured of a constitutive matrix to be described later to the original parity check matrix H in addition to the column permutation corresponding to the parity interleave.

<Column Twist Interleave>

Next, the column twist interleave as the rearranging process by the column twist interleaver 24 in FIG. 9 is described with reference to FIGS. 27 to 30.

The transmitting device 11 in FIG. 8 transmits one or more code bits of the LDPC code as one symbol. That is to say, when two code bits are made one symbol, for example, the QPSK is used as the modulation scheme, for example, and when four code bits are made one symbol, the 16APSK or the 16QAM is used as the modulation scheme, for example.

In a case in which two or more code bits are transmitted as one symbol, when the erasure and the like occurs in a certain symbol, the error (erasure) occurs in all of the code bits of the symbol.

Therefore, it is required to prevent the variable nodes corresponding to the code bits of one symbol from being connected to the same check node in order to decrease the probability that the erasure occurs in a plurality of (code bits corresponding to the) variable nodes connected to the same check node at the same time in order to improve the decoding performance.

On the other hand, as described above, in the parity check matrix H of the LDPC code specified in the DVB-S.2 standard output by the LDPC encoder 115, the information matrix $H_A$ has the cyclic structure and the parity matrix $H_T$ has the stepwise structure. As illustrated in FIG. 26, in the conversion parity check matrix being the parity check matrix of the LDPC code after the parity interleave, the cyclic structure (correctly, the quasi-cyclic structure as described above) also appears in the parity matrix.

Figure 27:
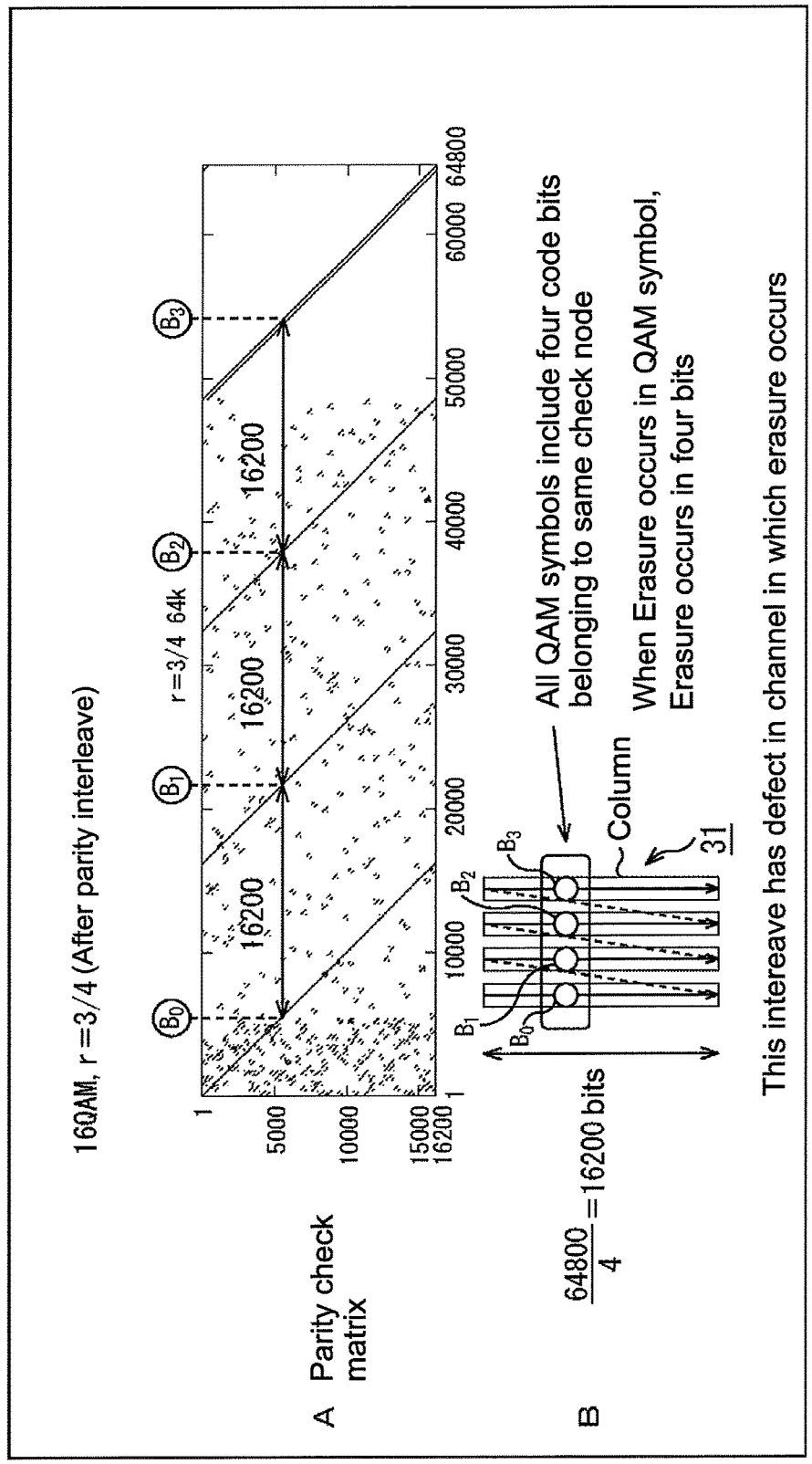
FIG. 27 A view showing a conversion parity check matrix.

FIG. 27 shows the conversion parity check matrix.

That is to say, FIG. 27A shows the conversion parity check matrix of the parity check matrix H of the LDPC code whose code length N is 64800 bits and code rate (r) is 3/4.

In FIG. 27A, in the conversion parity check matrix, a position of the element whose value is 1 is indicated by a dot (·).

FIG. 27B shows the process performed by the demultiplexer 25 (FIG. 9) to the LDPC code of the conversion parity check matrix in FIG. 27A, that is to say, the LDPC code after the parity interleave.

In FIG. 27B, the code bits of the LDPC code after the parity interleave are written in the column direction to four columns configuring the memory 31 of the demultiplexer 25 with the 16APSK or the 16QAM as the modulation scheme that maps the symbol to any of 14 signal points.

The code bits written in the column direction to the four columns configuring the memory 31 are read in units of four bits in the row direction to be made one symbol.

In this case, four code bits $B_0$, $B_1$, $B_2$, and $B_3$, which are made one symbol, might be the code bits corresponding to 1 in an optional row of the conversion parity check matrix in FIG. 23A, and in this case, the variable nodes corresponding to the code bits $B_0$, $B_1$, $B_2$, and $B_3$ are connected to the same check node.

Therefore, when the four code bits $B_0$, $B_1$, $B_2$, and $B_3$ of one symbol are the code bits corresponding to 1 in an optional row of the conversion parity check matrix, if the erasure occurs in the symbol, an appropriate message cannot be obtained in the check node to which the variable nodes corresponding to the code bits $B_0$, $B_1$, $B_2$, and $B_3$ are connected, and as a result, the decoding performance is deteriorated.

As for the code rate other than 3/4, similarly, there is a case in which a plurality of code bits corresponding to a plurality of variable nodes connected to the same check node is made one symbol of the 16APSK or the 16QAM.

Therefore, the column twist interleaver 24 performs the column twist interleave to interleave the code bit of the LDPC code after the parity interleave from the parity interleaver 23 such that a plurality of code bits corresponding to 1 in an optional row of the conversion parity check matrix is not included in one symbol.

Figure 28:
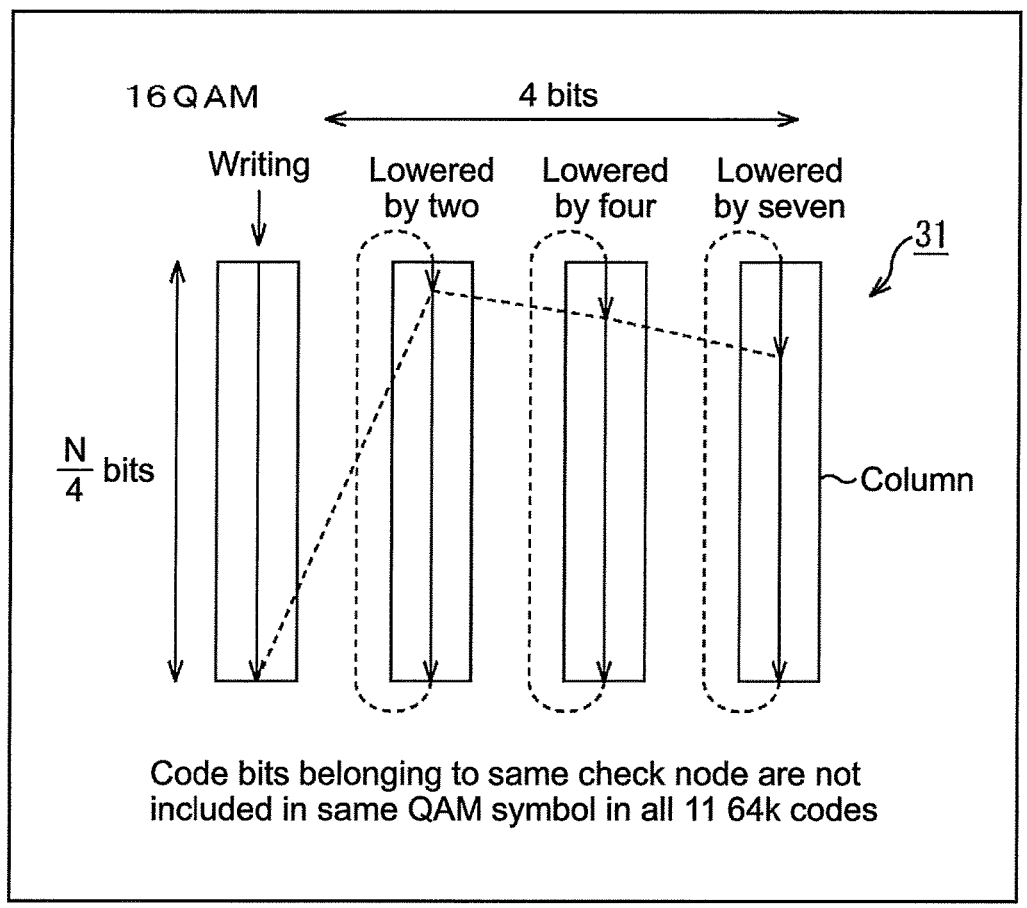
FIG. 28 A view illustrating a process of a column twist interleaver 24.

FIG. 28 is a view illustrating the column twist interleave.

That is to say, FIG. 28 illustrates the memory 31 of the demultiplexer 25 (FIGS. 22 and 23).

The memory 31 has the storage capacity to store the mb bits in the column (vertical) direction and the N/(mb) bits in the row (horizontal) direction and is configured of mb columns as illustrated in FIG. 22. Then, the column twist interleaver 24 performs the column twist interleave by controlling a writing start position when the code bits of the LDPC code are written in the column direction and read in the row direction to/from the memory 31.

That is to say, the column twist interleaver 24 prevents a plurality of code bits, which is made one symbol, read in the row direction from being the code bits corresponding to 1 in an optional row of the conversion parity check matrix (rearranges the code bits of the LDPC code such that a plurality of code bits corresponding to 1 in an optional row of the parity check matrix is not included in the same symbol) by appropriately changing the writing start position at which the writing of the code bits is started for each of a plurality of columns.

Herein, FIG. 28 shows a configuration example of the memory 31 in a case in which the modulation scheme is the 16APSK or the 16QAM and the multiple number b illustrated in FIG. 22 is set to 1. Therefore, the number of code bits m of the LDPC code, which are made one symbol, is four and the memory 31 is configured of four mb) columns.

The column twist interleaver 24 writes the code bits of the LDPC code (in place of the demultiplexer 25 in FIG. 22) from the top of the four columns configuring the memory 31 downward (in the column direction) from a left column to a right column.

When the writing of the code bits is finished up to a rightmost column, the column twist interleaver 24 reads the code bits in units of four bits (mb bits) in the row direction from a first row of all the columns configuring the memory 31 and outputs the same to the interchange unit 32 of the demultiplexer 25 (FIGS. 22 and 23) as the LDPC code after the column twist interleave.

In the column twist interleaver 24, when an address of each position in the column direction is represented by an integer in ascending order while setting the address of a top (uppermost) position of each column to 0, the writing start position is set to a position whose address is 0 for a leftmost column, the writing start position is set to a position whose address is 2 for a second column (from left), the writing start position is set to a position whose address is 4 for a third column, and the writing start position is set to a position whose address is 7 for a fourth column.

As for the column in which the writing start position is located on a position other than the position whose address is 0, when the code bits are written up to the undermost position, it is returned to the top (position whose address is 0) and the writing is performed up to a position just before the writing start position. Thereafter, the writing to the next (right) column is performed.

By performing the above-described column twist interleave, it is possible to avoid a situation in which a plurality of code bits corresponding to a plurality of variable nodes connected to the same check node is made one symbol of the 16APSK or the 16QAM (in which they are included in the same symbol) for the LDPC code specified in the DVB-T.2 standard, and as a result, the decoding performance in the communication channel in which the erasure occurs may be improved.

FIG. 29 shows the number of columns of the memory 31 required for the column twist interleave and the address of the writing start position for each modulation scheme for the LDPC code of each of 11 code rates whose code length N is 64800 specified in the DVB-T.2 standard.

When the multiple number b is set to 1 and when the number of bits m of one symbol is two by adoption of the QPSK, for example, as the modulation scheme, according to FIG. 29, the memory 31 has two columns, which store 2×1(=mb) bits in the row direction, and stores 64800/(2×1) bits in the column direction.

The writing start position of a first column out of the two columns of the memory 31 is set to the position whose address is 0 and the writing start position of a second column is set to the position whose address is 2.

When any of the first to third interchanging schemes in FIG. 22 is adopted as the interchanging scheme of the interchanging process of the demultiplexer 25 (FIG. 9), for example, the multiple number b is set to 1.

When the multiple number is set to 2 and when the number of bits m of one symbol is two by the adoption of the QPSK, for example, as the modulation scheme, according to FIG. 29, the memory 31 has the four columns, which store 2×2 bits in the row direction, and stores 64800/(2×2) bits in the column direction.

The writing start position of the first column out of the four columns of the memory 31 is set to the position whose address is 0, the writing start position of the second column is set to the position whose address is 2, the writing start position of the third column is set to the position whose address is 4, and the writing start position of the fourth column is set to the position whose address is 7.

When the fourth interchanging scheme in FIG. 23 is adopted as the interchanging scheme of the interchanging process of the demultiplexer 25 (FIG. 9), for example, the multiple number b is set to 2.

When the multiple number b is set to 1 and when the number of bits m of one symbol is four by the adoption of the 16QAM, for example, as the modulation scheme, according to FIG. 29, the memory 31 has the four columns, which store 4×1 bits in the row direction, and stores 64800/(4×1) bits in the column direction.

The writing start position of the first column out of the four columns of the memory 31 is set to the position whose address is 0, the writing start position of the second column is set to the position whose address is 2, the writing start position of the third column is set to the position whose address is 4, and the writing start position of the fourth column is set to the position whose address is 7.

When the multiple number is set to 2 and when the number of bits m of one symbol is four by the adoption of the 16QAM, for example, as the modulation scheme, according to FIG. 29, the memory 31 has eight columns, which store 4×2 bits in the row direction, and stores 64800/(4×2) bits in the column direction.

The writing start position of a first column out of the eight columns of the memory 31 is set to the position whose address is 0, the writing start position of a second column is set to the position whose address is 0, the writing start position of a third column is set to the position whose address is 2, the writing start position of a fourth column is set to the position whose address is 4, the writing start position of a fifth column is set to the position whose address is 4, the writing start position of a sixth column is set to a position whose address is 5, the writing start position of a seventh column is set to the position whose address is 7, and the writing start position of an eighth column is set to the position whose address is 7.

When the multiple number b is set to 1 and when the number of bits m of one symbol is six by the adoption of the 64QAM, for example, as the modulation scheme, according to FIG. 29, the memory 31 has six columns, which store 6×1 bits in the row direction, and stores 64800/(6×1) bits in the column direction.

The writing start position of a first column out of the six columns of the memory 31 is set to the position whose address is 0, the writing start position of a second column is set to the position whose address is 2, the writing start position of a third column is set to the position whose address is 5, the writing start position of a fourth column is set to a position whose address is 9, the writing start position of a fifth column is set to a position whose address is 10, and the writing start position of a sixth column is set to a position whose address is 13.

When the multiple number b is set to 2 and when the number of bits m of one symbol is six by the adoption of the 64QAM, for example, as the modulation scheme, according to FIG. 29, the memory 31 has 12 columns, which store 6×2 bits in the row direction, and stores 64800/(6×2) bits in the column direction.

The writing start position of a 1st column out of the 12 columns of the memory 31 is set to the position whose address is 0, the writing start position of a 2nd column is set to the position whose address is 0, the writing start position of a 3rd column is set to the position whose address is 2, the writing start position of a 4th column is set to the position whose address is 2, the writing start position of a 5th column is set to a position whose address is 3, the writing start position of a 6th column is set to the position whose address is 4, the writing start position of a 7th column is set to the position whose address is 4, the writing start position of an 8th column is set to the position whose address is 5, the writing start position of a 9th column is set to the position whose address is 5, the writing start position of a 10th column is set to the position whose address is 7, the writing start position of an 11th column is set to a position whose address is 8, and the writing start position of a 12th column is set to the position whose address is 9.

When the multiple number b is set to 1 and when the number of bits m of one symbol is eight by the adoption of the 256QAM, for example, as the modulation scheme, according to FIG. 29, the memory 31 has the eight columns, which store 8×1 bits in the row direction, and stores 64800/(8×1) bits in the column direction.

The writing start position of the first column out of the eight columns of the memory 31 is set to the position whose address is 0, the writing start position of the second column is set to the position whose address is 0, the writing start position of the third column is set to the position whose address is 2, the writing start position of the fourth column is set to the position whose address is 4, the writing start position of the fifth column is set to the position whose address is 4, the writing start position of the sixth column is set to the position whose address is 5, the writing start position of the seventh column is set to the position whose address is 7, and the writing start position of the eighth column is set to the position whose address is 7.

When the multiple number is set to 2 and when the number of bits m of one symbol is eight by the adoption of the 256QAM, for example, as the modulation scheme, according to FIG. 29, the memory 31 has 16 columns, which store 8×2 bits in the row direction, and stores 64800/(8×2) bits in the column direction.

The writing start position of a 1st column out of the 16 columns of the memory 31 is set to the position whose address is 0, the writing start position of a 2nd column is set to the position whose address is 2, the writing start position of a 3rd column is set to the position whose address is 2, the writing start position of a 4th column is set to the position whose address is 2, the writing start position of a 5th column is set to the position whose address is 2, the writing start position of a 6th column is set to a position whose address is 3, the writing start position of a 7th column is set to the position whose address is 7, the writing start position of an 8th column is set to a position whose address is 15, the writing start position of a 9th column is set to a position whose address is 16, the writing start position of a 10th column is set to a position whose address is 20, the writing start position of an 11th column is set to a position whose address is 22, the writing start position of a 12th column is set to the position whose address is 22, the writing start position of a 13th column is set to a position whose address is 27, the writing start position of a 14th column is set to the position whose address is 27, the writing start position of a 15th column is set to a position whose address is 28, and the writing start position of a 16th column is set to a position whose address is 32.

When the multiple number b is set to 1 and when the number of bits m of one symbol is 10 by the adoption of the 1024QAM, for example, as the modulation scheme, according to FIG. 29, the memory 31 has 10 columns, which store 10×1 bits in the row direction, and stores 64800/(10×1) bits in the column direction.

The writing start position of a 1st column out of the 10 columns of the memory 31 is set to the position whose address is 0, the writing start position of a 2nd column is set to the position whose address is 3, the writing start position of a 3rd column is set to a position whose address is 6, the writing start position of a 4th column is set to the position whose address is 8, the writing start position of a 5th column is set to a position whose address is 11, the writing start position of a 6th column is set to a position whose address is 13, the writing start position of a 7th column is set to the position whose address is 15, the writing start position of an 8th column is set to a position whose address is 17, the writing start position of a 9th column is set to a position whose address is 18, and the writing start position of a 10th column is set to the position whose address is 20.

When the multiple number is set to 2 and when the number of bits m of one symbol is 10 by the adoption of the 1024QAM, for example, as the modulation scheme, according to FIG. 29, the memory 31 has 20 columns, which store 10×2 bits in the row direction, and stores 64800/(10×2) bits in the column direction.

The writing start position of a 1st column out of the 20 columns of the memory 31 is set to the position whose address is 0, the writing start position of a 2nd column is set to a position whose address is 1, the writing start position of a 3rd column is set to the position whose address is 3, the writing start position of a 4th column is set to the position whose address is 4, the writing start position of a 5th column is set to the position whose address is 5, the writing start position of a 6th column is set to the position whose address is 6, the writing start position of a 7th column is set to the position whose address is 6, the writing start position of an 8th column is set to the position whose address is 9, the writing start position of a 9th column is set to the position whose address is 13, the writing start position of a 10th column is set to a position whose address is 14, the writing start position of an 11th column is set to the position whose address is 14, the writing start position of a 12th column is set to the position whose address is 16, the writing start position of a 13th column is set to a position whose address is 21, the writing start position of a 14th column is set to the position whose address is 21, the writing start position of a 15th column is set to a position whose address is 23, the writing start position of a 16th column is set to a position whose address is 25, the writing start position of a 17th column is set to the position whose address is 25, the writing start position of an 18th column is set to a position whose address is 26, the writing start position of a 19th column is set to the position whose address is 28, and the writing start position of a 20th column is set to a position whose address is 30.

When the multiple number b is set to 1 and when the number of bits m of one symbol is 12 by the adoption of the 4096QAM, for example, as the modulation scheme, according to FIG. 29, the memory 31 has the 12 columns, which store 12×1 bits in the row direction, and stores 64800/(12×1) bits in the column direction.

The writing start position of the 1st column out of the 12 columns of the memory 31 is set to the position whose address is 0, the writing start position of the end column is set to the position whose address is 0, the writing start position of the 3rd column is set to the position whose address is 2, the writing start position of the 4th column is set to the position whose address is 2, the writing start position of the 5th column is set to the position whose address is 3, the writing start position of the 6th column is set to the position whose address is 4, the writing start position of the 7th column is set to the position whose address is 4, the writing start position of the 8th column is set to the position whose address is 5, the writing start position of the 9th column is set to the position whose address is 5, the writing start position of the 10th column is set to the position whose address is 7, the writing start position of the 11th column is set to the position whose address is 8, and the writing start position of the 12th column is set to the position whose address is 9.

When the multiple number is set to 2 and when the number of bits m of one symbol is 12 by the adoption of the 4096QAM, for example, as the modulation scheme, according to FIG. 29, the memory 31 has 24 columns, which store 12×2 bits in the row direction, and stores 64800/(12×2) bits in the column direction.

The writing start position of a 1st column out of the 24 columns of the memory 31 is set to the position whose address is 0, the writing start position of a 2nd column is set to the position whose address is 5, the writing start position of a 3rd column is set to the position whose address is 8, the writing start position of a 4th column is set to the position whose address is 8, the writing start position of a 5th column is set to the position whose address is 8, the writing start position of a 6th column is set to the position whose address is 8, the writing start position of a 7th column is set to the position whose address is 10, the writing start position of an 8th column is set to the position whose address is 10, the writing start position of a 9th column is set to the position whose address is 10, the writing start position of a 10th column is set to a position whose address is 12, the writing start position of an 11th column is set to the position whose address is 13, the writing start position of a 12th column is set to the position whose address is 16, the writing start position of a 13th column is set to a position whose address is 17, the writing start position of a 14th column is set to a position whose address is 19, the writing start position of a 15th column is set to the position whose address is 21, the writing start position of a 16th column is set to the position whose address is 22, the writing start position of a 17th column is set to the position whose address is 23, the writing start position of an 18th column is set to the position whose address is 26, the writing start position of a 19th column is set to a position whose address is 37, the writing start position of a 20th column is set to a position whose address is 39, the writing start position of a 21st column is set to a position whose address is 40, the writing start position of a 22nd column is set to a position whose address is 41, the writing start position of a 23rd column is set to the position whose address is 41, and the writing start position of a 24th column is set to the position whose address is 41.

FIG. 30 shows the number of columns of the memory 31 required for the column twist interleave and the address of the writing start position for each modulation scheme for the LDPC code of each of 10 code rates whose code length N is 16200 specified in the DVB-T.2 standard.

When the multiple number b is set to 1 and when the number of bits m of one symbol is two by the adoption of the QPSK, for example, as the modulation scheme, according to FIG. 30, the memory 31 has the two columns, which store 2×1 bits in the row direction, and stores 16200/(2×1) bits in the column direction.

The writing start position of the first column out of the two columns of the memory 31 is set to the position whose address is 0 and the writing start position of the second column is set to the position whose address is 0.

When the multiple number b is set to 2 and when the number of bits m of one symbol is two by the adoption of the QPSK, for example, as the modulation scheme, according to FIG. 30, the memory 31 has the four columns, which store 2×2 bits in the row direction, and stores 16200/(2×2) bits in the column direction.

The writing start position of the first column out of the four columns of the memory 31 is set to the position whose address is 0, the writing start position of the second column is set to the position whose address is 2, the writing start position of the third column is set to the position whose address is 3, and the writing start position of the fourth column is set to the position whose address is 3.

When the multiple number b is set to 1 and when the number of bits m of one symbol is four by the adoption of the 16QAM, for example, as the modulation scheme, according to FIG. 30, the memory 31 has the four columns, which store 4×1 bits in the row direction, and stores 16200/(4×1) bits in the column direction.

The writing start position of the first column out of the four columns of the memory 31 is set to the position whose address is 0, the writing start position of the second column is set to the position whose address is 2, the writing start position of the third column is set to the position whose address is 3, and the writing start position of the fourth column is set to the position whose address is 3.

When the multiple number b is set to 2 and when the number of bits m of one symbol is four by the adoption of the 16QAM, for example, as the modulation scheme, according to FIG. 30, the memory 31 has the eight columns, which store 4×2 bits in the row direction, and stores 16200/(4×2) bits in the column direction.

The writing start position of the first column out of the eight columns of the memory 31 is set to the position whose address is 0, the writing start position of the second column is set to the position whose address is 0, the writing start position of the third column is set to the position whose address is 0, the writing start position of the fourth column is set to the position whose address is 1, the writing start position of the fifth column is set to the position whose address is 7, the writing start position of the sixth column is set to the position whose address is 20, the writing start position of the seventh column is set to the position whose address is 20, and the writing start position of the eighth column is set to the position whose address is 21.

When the multiple number b is set to 1 and when the number of bits m of one symbol is six by the adoption of the 64QAM, for example, as the modulation scheme, according to FIG. 30, the memory 31 has the six columns, which store 6×1 bits in the row direction, and stores 16200/(6×1) bits in the column direction.

The writing start position of the first column out of the six columns of the memory 31 is set to the position whose address is 0, the writing start position of the second column is set to the position whose address is 0, the writing start position of the third column is set to the position whose address is 2, the writing start position of the fourth column is set to the position whose address is 3, the writing start position of the fifth column is set to the position whose address is 7, and the writing start position of the sixth column is set to the position whose address is 7.

When the multiple number b is set to 2 and when the number of bits m of one symbol is six by the adoption of the 64QAM, for example, as the modulation scheme, according to FIG. 30, the memory 31 has the 12 columns, which store 6×2 bits in the row direction, and stores 16200/(6×2) bits in the column direction.

The writing start position of the 1st column out of the 12 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the 6th column is set to the position whose address is 2, the writing start position of the 7th column is set to the position whose address is 3, the writing start position of the 8th column is set to the position whose address is 3, the writing start position of the 9th column is set to the position whose address is 3, the writing start position of the 10th column is set to the position whose address is 6, the writing start position of the 11th column is set to the position whose address is 7, and the writing start position of the 12th column is set to the position whose address is 7.

When the multiple number b is set to 1 and when the number of bits m of one symbol is eight by the adoption of the 256QAM, for example, as the modulation scheme, according to FIG. 30, the memory 31 has the eight columns, which store 8×1 bits in the row direction, and stores 16200/(8×1) bits in the column direction.

The writing start position of the first column out of the eight columns of the memory 31 is set to the position whose address is 0, the writing start position of the second column is set to the position whose address is 0, the writing start position of the third column is set to the position whose address is 0, the writing start position of the fourth column is set to the position whose address is 1, the writing start position of the fifth column is set to the position whose address is 7, the writing start position of the sixth column is set to the position whose address is 20, the writing start position of the seventh column is set to the position whose address is 20, and the writing start position of the eighth column is set to the position whose address is 21.

When the multiple number b is set to 1 and when the number of bits m of one symbol is 10 by the adoption of the 1024QAM, for example, as the modulation scheme, according to FIG. 30, the memory 31 has the 10 columns, which store 10×1 bits in the row direction, and stores 16200/(10×1) bits in the column direction.

The writing start position of the 1st column out of the 10 columns of the memory 31 is set to the position whose address is 0, the writing start position of the 2nd column is set to the position whose address is 1, the writing start position of the 3rd column is set to the position whose address is 2, the writing start position of the 4th column is set to the position whose address is 2, the writing start position of the 5th column is set to the position whose address is 3, the writing start position of the 6th column is set to the position whose address is 3, the writing start position of the 7th column is set to the position whose address is 4, the writing start position of the 8th column is set to the position whose address is 4, the writing start position of the 9th column is set to the position whose address is 5, and the writing start position of the 10th column is set to the position whose address is 7.

When the multiple number b is set to 2 and when the number of bits m of one symbol is 10 by the adoption of the 1024QAM, for example, as the modulation scheme, according to FIG. 30, the memory 31 has the 20 columns, which store 10×2 bits in the row direction, and stores 16200/(10×2) bits in the column direction.

The writing start position of the 1st column out of the 20 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the 6th column is set to the position whose address is 2, the writing start position of the 7th column is set to the position whose address is 2, the writing start position of the 8th column is set to the position whose address is 2, the writing start position of the 9th column is set to the position whose address is 5, the writing start position of the 10th column is set to the position whose address is 5, the writing start position of the 11th column is set to the position whose address is 5, the writing start position of the 12th column is set to the position whose address is 5, the writing start position of the 13th column is set to the position whose address is 5, the writing start position of the 14th column is set to the position whose address is 7, the writing start position of the 15th column is set to the position whose address is 7, the writing start position of the 16th column is set to the position whose address is 7, the writing start position of the 17th column is set to the position whose address is 7, the writing start position of the 18th column is set to the position whose address is 8, the writing start position of the 19th column is set to the position whose address is 8, and the writing start position of the 20th column is set to the position whose address is 10.

When the multiple number b is set to 1 and when the number of bits m of one symbol is 12 by the adoption of the 4096QAM, for example, as the modulation scheme, according to FIG. 30, the memory 31 has the 12 columns, which store 12×1 bits in the row direction, and stores 16200/(12×1) bits in the column direction.

The writing start position of the 1st column out of the 12 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 2, the writing start position of the 5th column is set to the position whose address is 2, the writing start position of the sixth column is set to the position whose address is 2, the writing start position of the seventh column is set to the position whose address is 3, the writing start position of the eighth column is set to the position whose address is 3, the writing start position of the ninth column is set to the position whose address is 3, the writing start position of the tenth column is set to a position whose address is 6, the writing start position of the 11th column is set to the position whose address is 7, and the writing start position of the 12th column is set to the position whose address is 7.

When the multiple number b is set to 2 and when the number of bits m of one symbol is 12 by the adoption of the 4096QAM, for example, as the modulation scheme, according to FIG. 30, the memory 31 has the 24 columns, which store 12×2 bits in the row direction, and stores 16200/(12×2) bits in the column direction.

The writing start position of the 1st column out of the 24 columns of the memory 31 is set to the position whose address is 0, the writing start position of the 2nd column is set to the position whose address is 0, the writing start position of the 3rd column is set to the position whose address is 0, the writing start position of the 4th column is set to the position whose address is 0, the writing start position of the 5th column is set to the position whose address is 0, the writing start position of the 6th column is set to the position whose address is 0, the writing start position of the 7th column is set to the position whose address is 0, the writing start position of the 8th column is set to the position whose address is 1, the writing start position of the 9th column is set to the position whose address is 1, the writing start position of the 10th column is set to the position whose address is 1, the writing start position of the 11th column is set to the position whose address is 2, the writing start position of the 12th column is set to the position whose address is 2, the writing start position of the 13th column is set to the position whose address is 2, the writing start position of the 14th column is set to the position whose address is 3, the writing start position of the 15th column is set to the position whose address is 7, the writing start position of the 16th column is set to the position whose address is 9, the writing start position of the 17th column is set to the position whose address is 9, the writing start position of the 18th column is set to a position whose address is 9, the writing start position of the 19th column is set to the position whose address is 10, the writing start position of the 20th column is set to the position whose address is 10, the writing start position of the 21st column is set to the position whose address is 10, the writing start position of the 22nd column is set to the position whose address is 10, the writing start position of the 23rd column is set to the position whose address is 10, and the writing start position of the 24th column is set to the position whose address is 11.

Figure 31:
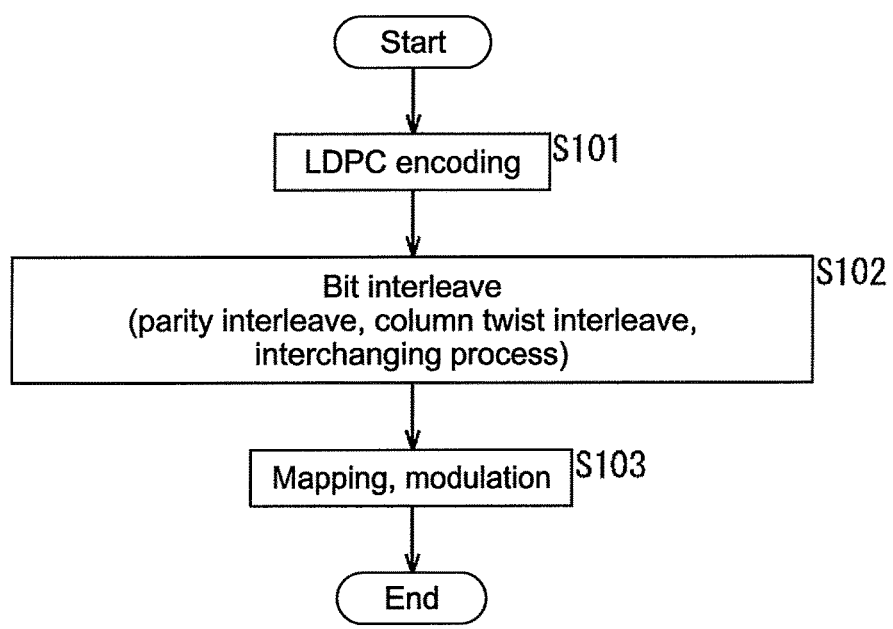
FIG. 31 A flowchart illustrating processes performed by the bit interleaver 116 and a mapper 117.

FIG. 31 is a flowchart illustrating processes performed by the LDPC encoder 115, the bit interleaver 116, and the mapper 117 in FIG. 8.

The LDPC encoder 115 encodes the LDPC target data into the LDPC code at step S101 after waiting for supply of the LDPC target data from the BCH encoder 114 and supplies the LDPC code to the bit interleaver 116, then the process shifts to step S102.

The bit interleaver 116 performs the bit interleave of the LDPC code from the LDPC encoder 115 and supplies the symbol obtained by symbolizing the LDPC code after the bit interleave to the mapper 117 at step S102, then the process shifts to step S103.

That is to say, at step S102, in the bit interleaver 116 (FIG. 9), the parity interleaver 23 performs the parity interleave of the LDPC code from the LDPC encoder 115 and supplies the LDPC code after the parity interleave to the column twist interleaver 24.

The column twist interleaver 24 performs the column twist interleave of the LDPC code from the parity interleaver 23 to supply to the demultiplexer 25.

The demultiplexer 25 performs the interchanging process to interchange the code bits of the LDPC code after the column twist interleave by the column twist interleaver 24 and make the code bits after the interchange the symbol bits of the symbol (bits representing the symbol).

Herein, the interchanging process by the demultiplexer 25 may be performed according to the first to fourth interchanging schemes illustrated in FIGS. 22 and 23 and may be performed according to an allocation rule.

The symbol obtained by the interchanging process by the demultiplexer 25 is supplied from the demultiplexer 25 to the mapper 117.

The mapper 117 maps the symbol from the demultiplexer 25 onto the signal point defined by the modulation scheme of the orthogonal modulation performed by the mapper 117 to perform the orthogonal modulation and supplies the data obtained as a result to the time interleaver 118 at step S103.

As described above, it is possible to improve the resistance to erasure and burst error in a case in which a plurality of code bits of the LDPC code is transmitted as one symbol by performing the parity interleave and the column twist interleave.

Herein, the parity interleaver 23, which is a block to perform the parity interleave, and the column twist interleaver 24, which is a block to perform the column twist interleave, are separately formed in FIG. 9 for convenience of description; however, the parity interleaver 23 and the column twist interleaver 24 may be integrally formed.

That is to say, the parity interleave and the column twist interleave may be performed by the writing and the reading of the code bits to and from the memory and may be represented by a matrix to convert the address at which the code bits are written (write address) to the address at which the code bits are read (read address).

Therefore, by obtaining the matrix obtained by multiplying the matrix representing the parity interleave by the matrix representing the column twist interleave, it is possible to obtain a result of performing the parity interleave and performing the column twist interleave of the LDPC code after the parity interleave by converting the code bits by the matrix.

It is also possible to integrally form the demultiplexer 25 in addition to the parity interleaver 23 and the column twist interleaver 24.

That is to say, the interchanging process performed by the demultiplexer 25 may also be represented by the matrix to convert the write address of the memory 31, which stores the LDPC code, to the read address.

Therefore, by obtaining the matrix obtained by multiplying the matrix representing the parity interleave, the matrix representing the column twist interleave, and the matrix representing the interchanging process together, it is possible to collectively perform the parity interleave, the column twist interleave, and the interchanging process by the matrix.

As for the parity interleave and the column twist interleave, it is possible to perform any one of them or to perform none of them. For example, if the communication channel 13 (FIG. 7) is the satellite circuit such as the DVB-S.2 other than the AWGN where the burst error, the flutter, and the like are not necessarily taken into consideration, the parity interleave and the column twist interleave may not be performed.

Next, simulation of measurement of the bit error rate performed for the transmitting device 11 in FIG. 8 is next described with reference to FIGS. 32 to 34.

The simulation is performed by adopting the communication channel with the flutter in which the D/U is 0 dB.

Figure 32:
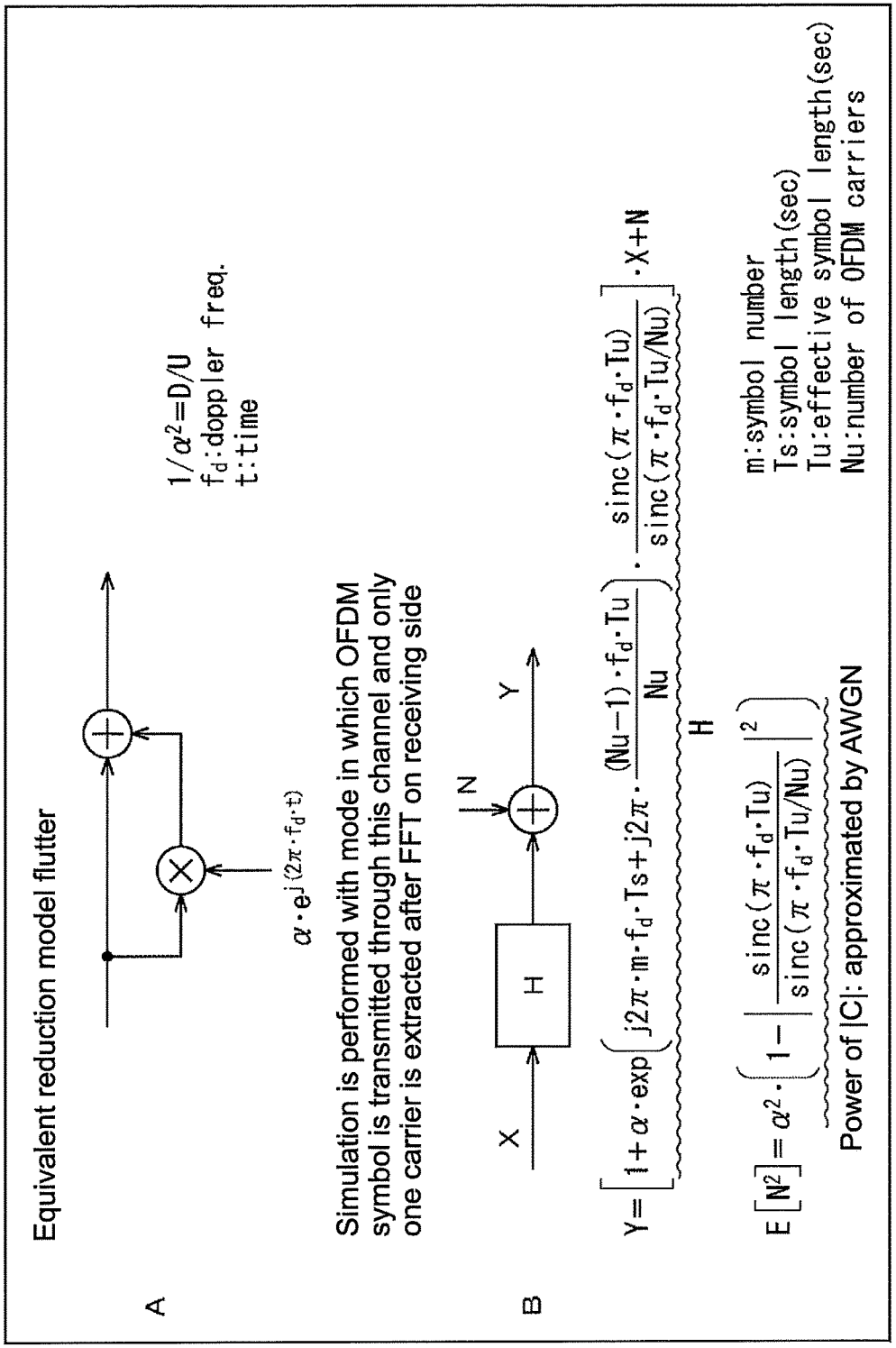
FIG. 32 A view showing a model of a communication channel adopted in simulation.

FIG. 32 illustrates a model of the communication channel adopted in the simulation.

That is to say, FIG. 32A shows a model of the flutter adopted in the simulation.

FIG. 32B shows a model of the communication channel with the flutter illustrated by the model in FIG. 32A.

In FIG. 32B, H represents the model of the flutter in FIG. 32A. In FIG. 32B, N represents ICI (inter carrier interference) and an expected value E $[N^2]$ of power thereof is approximated by the AWGN in the simulation.

Figure 33:
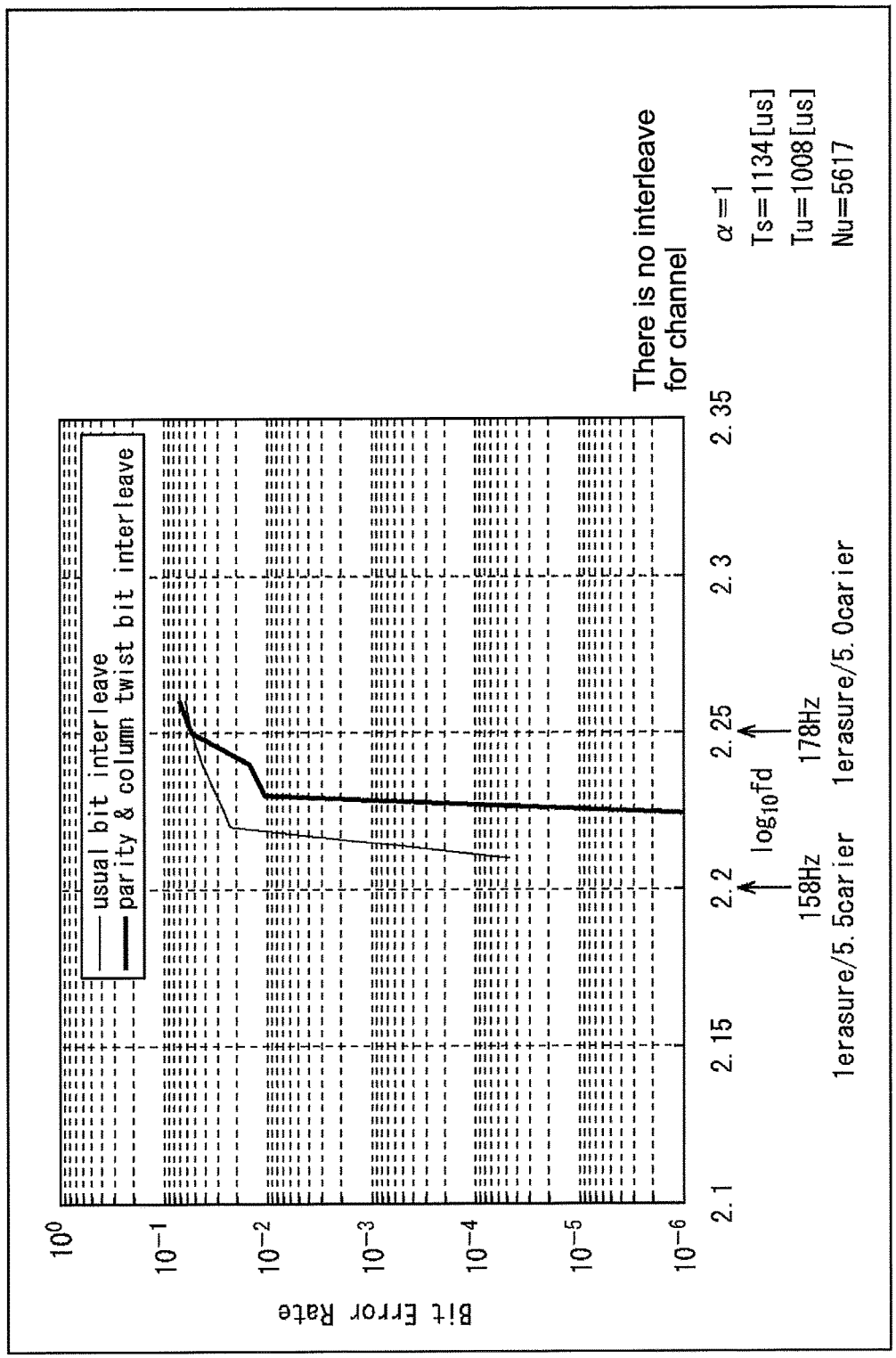
FIG. 33 A view showing relationship between a bit error rate obtained by the simulation and a Doppler frequency $f_d$ of a flutter.
Figure 34:
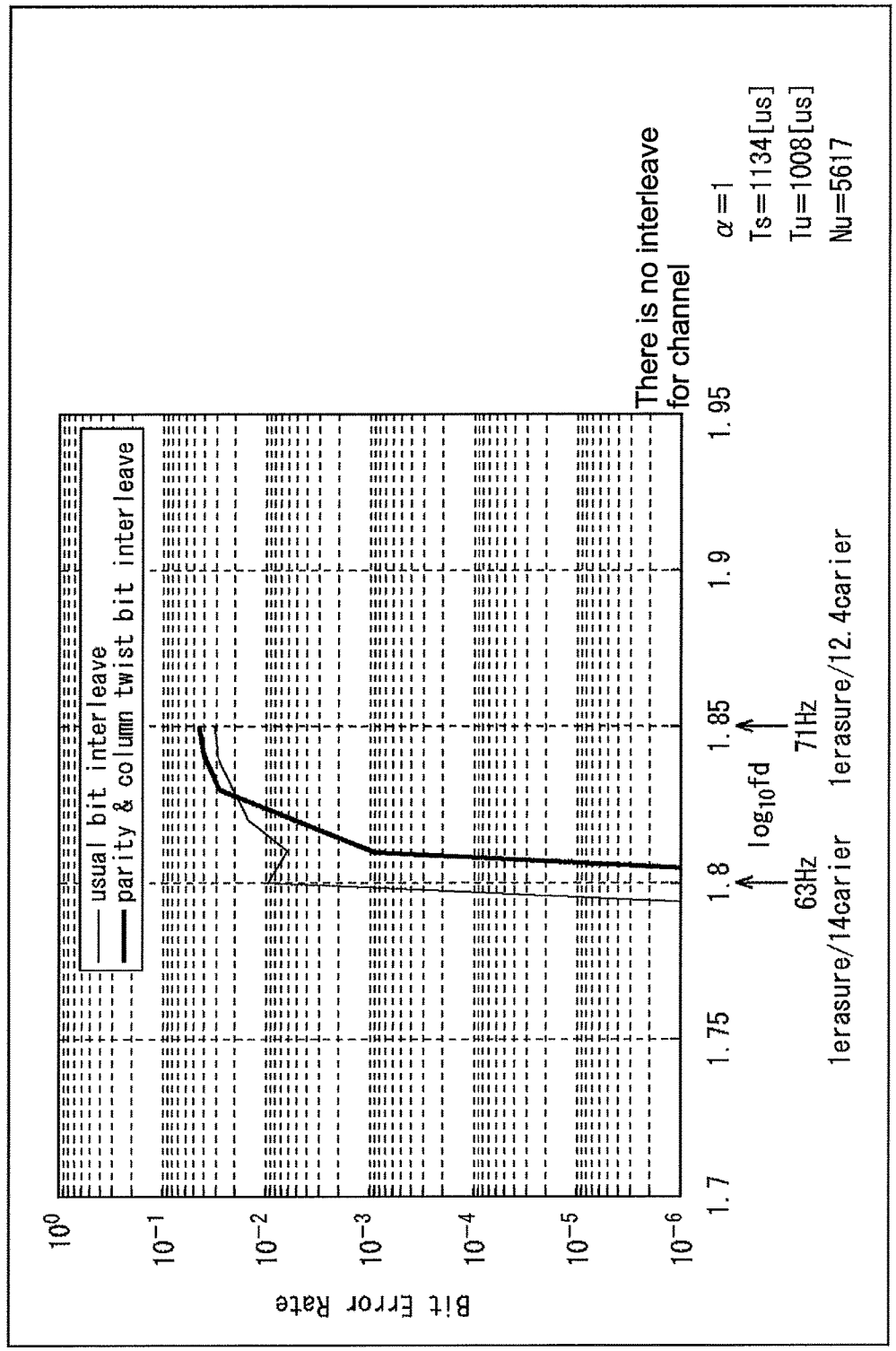
FIG. 34 A view showing the relationship between the bit error rate obtained by the simulation and the Doppler frequency $f_d$ of the flutter.

FIGS. 33 and 34 show relationship between the bit error rate obtained by the simulation and a Doppler frequency $f_d$ of the flutter.

FIG. 33 shows the relationship between the bit error rate and the Doppler frequency $f_d$ when the modulation scheme is the 16QAM, the code rate (r) is (3/4), and the interchanging scheme is the first interchanging scheme. FIG. 34 shows the relationship between the bit error rate and the Doppler frequency $f_d$ when the modulation scheme is the 64QAM, the code rate (r) is (5/6), and the interchanging scheme is the first interchanging scheme.

Further, in FIGS. 33 and 34, a thick line indicates the relationship between the bit error rate and the Doppler frequency $f_d$ when all of the parity interleave, the column twist interleave, and the interchanging process are performed, and a thin line indicates the relationship between the bit error rate and the Doppler frequency $f_d$ when only the interchanging process out of the parity interleave, the column twist interleave, and the interchanging process is performed.

In both of FIGS. 33 and 34, it is understood that the bit error rate is improved (becomes lower) when all of the parity interleave, the column twist interleave, and the interchanging process are performed as compared to a case in which only the interchanging process is performed.

<Configuration Example of LDPC Encoder 115>

Figure 35:
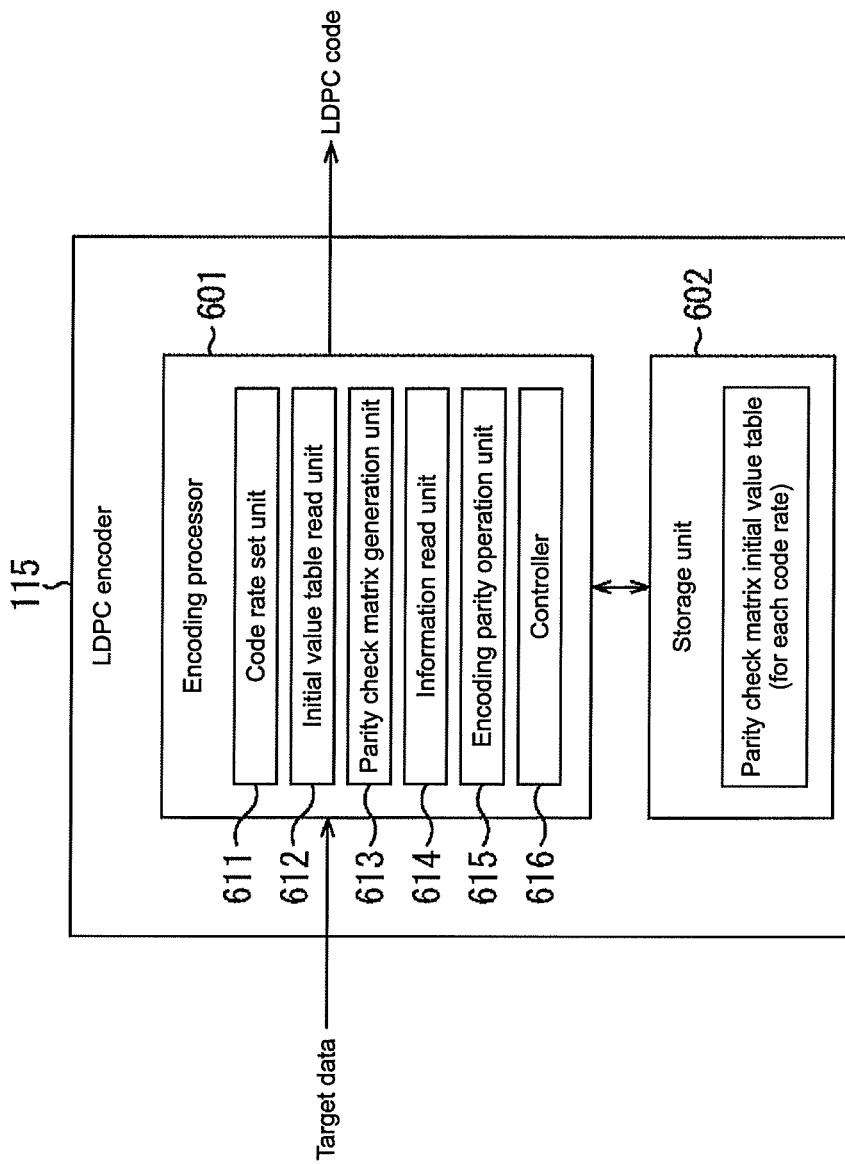
FIG. 35 A block diagram showing a configuration example of an LDPC encoder 115.

FIG. 35 is a block diagram illustrating a configuration example of the LDPC encoder 115 in FIG. 8.

The LDPC encoder 122 in FIG. 8 also is configured in the same manner.

As illustrated in FIGS. 12 and 13, the LDPC codes of the two code lengths N of 64800 bits and 16200 bits are specified in the DVB-S.2 standard.

As for the LDPC code whose code length N is 64800 bits, 11 code rates 1/4, 1/3, 2/5, 1/2, 3/5, 2/3, 3/4, 4/5, 5/6, 8/9, and 9/10 are specified, and as for the LDPC code whose code length N is 16200 bits, 10 code rates 1/4, 1/3, 2/5, 1/2, 3/5, 2/3, 3/4, 4/5, 5/6 and 8/9 are specified (refer to FIGS. 12 and 13).

The LDPC encoder 115 may perform the encoding (error correction encoding) by such LDPC code of each code rate whose code lengths N are 64800 bits or 16200 bits according to the parity check matrix H prepared for each code length N and each code rate, for example.

The LDPC encoder 115 is configured of an encoding processor 601 and a storage unit 602.

The encoding processor 601 is configured of a code rate set unit 611, an initial value table read unit 612, a parity check matrix generation unit 613, an information bit read unit 614, an encoding parity operation unit 615, and a controller 616, and this performs the LDPC encoding of the LDPC target data supplied to the LDPC encoder 115 and supplies the LDPC code obtained as a result to the bit interleaver 116 (FIG. 8).

That is to say, the code rate set unit 611 sets the code length N and the code rate of the LDPC code according to the operation of the operator and the like, for example.

The initial value table read unit 612 reads a parity check matrix initial value table to be described later corresponding to the code length N and the code rate set by the code rate set unit 611 from the storage unit 602.

The parity check matrix generation unit 613 generates the parity check matrix H by arranging the element 1 of the information matrix $H_A$ corresponding to the information length K (=code length N−parity length M) according to the code length N and the code rate set by the code rate set unit 611 with a period of 360 columns (the number of columns P being the unit of the cyclic structure) in the column direction based on the parity check matrix initial value table read by the initial value table read unit 612 and stores the same in the storage unit 602.

The information bit read unit 614 reads (extracts) the information bits as many as the information length K from the LDPC target data supplied to the LDPC encoder 115.

The encoding parity operation unit 615 reads the parity check matrix H generated by the parity check matrix generation unit 613 from the storage unit 602 and calculates the parity bits for the information bits read by the information bit read unit 614 based on a predetermined equation using the parity check matrix H, thereby generating the codeword (LDPC code).

The controller 616 controls each block configuring the encoding processor 601.

A plurality of parity check matrix initial value tables and the like corresponding to a plurality of code rates and the like illustrated in FIGS. 12 and 13 for each of the code lengths N such as 64800 bits and 16200 bits is stored in the storage unit 602, for example. The storage unit 602 temporarily stores the data required in the process of the encoding processor 601.

Figures 36, 37:
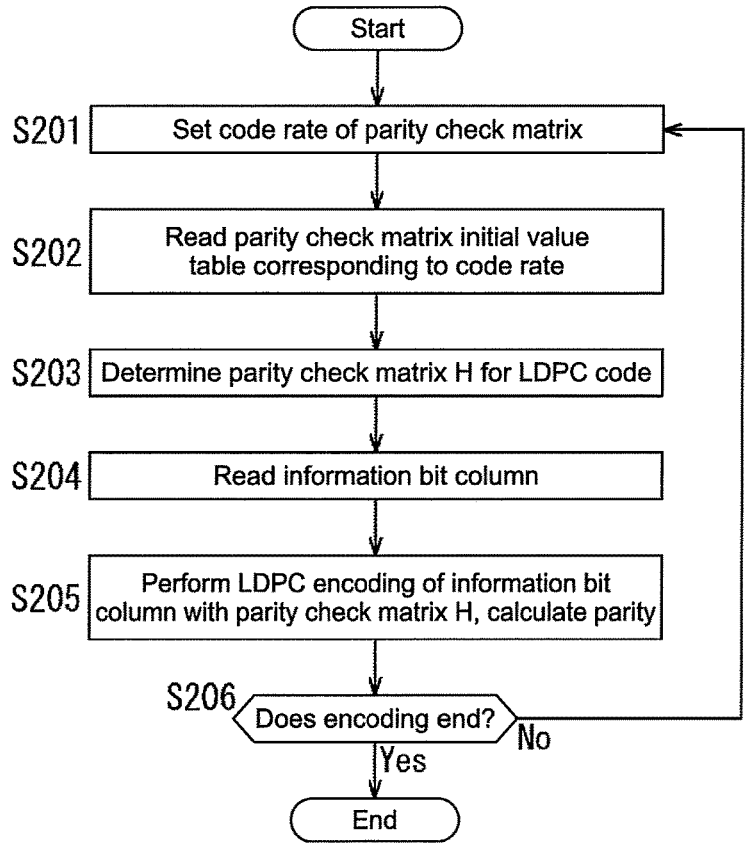
FIG. 36 A flowchart illustrating a process of the LDPC encoder 115.
FIG. 37 A view showing an example of a parity check matrix initial value table in which a code rate is 1/4 and a code length is 16200.

FIG. 36 is a flowchart illustrating the process of the LDPC encoder 115 in FIG. 35.

At step S201, the code rate set unit 611 determines (sets) the code length N and the code rate r with which the LDPC encoding is performed.

At step S202, the initial value table read unit 612 reads the parity check matrix initial value table determined in advance corresponding to the code length N and the code rate r determined by the code rate set unit 611 from the storage unit 602.

At step S203, the parity check matrix generation unit 613 obtains (generates) the parity check matrix H of the LDPC code with the code length N and the code rate r determined by the code rate set unit 611 using the parity check matrix initial value table read by the initial value table read unit 612 from the storage unit 602 and supplies the same to the storage unit 602 to store.

At step S204, the information bit read unit 614 reads the information bits of the information length K (=N×r) corresponding to the code length N and the code rate r determined by the code rate set unit 611 from the LDPC target data supplied to the LDPC encoder 115 and reads the parity check matrix H obtained by the parity check matrix generation unit 613 from the storage unit 602 to supply to the encoding parity operation unit 615.

At step S205, the encoding parity operation unit 615 sequentially calculates the parity bits of the codeword c satisfying equation (8) using the information bits from the information bit read unit 614 and the parity check matrix H.

$$Hc^T = 0 \qquad (8)$$

In equation (8), c represents the row vector as the codeword (LDPC code) and $c^T$ represents transposition of the row vector c.

Herein, as described above, when the part of the information bits and the part of the parity bits of the row vector c as the LDPC code (one codeword) are represented by the row vector A and the row vector T, respectively, the row vector c may be represented by the equation c=[A T] by the row vector A as the information bits and the row vector T as the parity bits.

The parity check matrix H and the row vector c=[A|T] as the LDPC code are required to satisfy the equation $Hc^T=0$ and it is possible to sequentially obtain the row vector T as the parity bits configuring the row vector c=[A|T] satisfying such equation $Hc^T=0$ by setting the element of each row to 0 in order from the element of the first row of the column vector $Hc^T$ in the equation $Hc^T=0$ when the parity matrix $H_T$ of the parity check matrix $H=[H_A|H_T]$ has the stepwise structure illustrated in FIG. 11.

When the encoding parity operation unit 615 obtains the parity bits T for the information bits A, this outputs the codeword c=[A|T] represented by the information bits A and the parity bits T as a result of the LDPC encoding of the information bits A.

Thereafter, at step S206, the controller 616 judges whether to finish the LDPC encoding. At step S206, when it is judged that the LDPC encoding is not finished, that is to say, when there still is the LDPC target data to be LDPC encoded, for example, the process returns to step S201 (or step S204) and the processes at steps S201 (or step S204) to S206 are hereinafter repeated.

When it is judged that the LDPC encoding is finished at step S206, that is to say, there is no LDPC target data to be LDPC encoded, for example, the LDPC encoder 115 finishes the process.

In this manner, the parity check matrix initial value table corresponding to each code length N and each code rate r is prepared, and the LDPC encoder 115 performs the LDPC encoding with a predetermined code length N and a predetermined code rate r using the parity check matrix H generated from the parity check matrix initial value table corresponding to the predetermined code length N and the predetermined code rate r.

<Example of Parity Check Matrix Initial Value Table>

The parity check matrix initial value table is the table indicating the position of the element 1 of the information matrix $H_A$ (FIG. 10) corresponding to the information length K according to the code length N and the code rate r of the LDPC code (LDPC code defined by the parity check matrix H) of the parity check matrix for each 360 columns (the number of columns P being the unit of the cyclic structure) and is created in advance for each parity check matrix H of each code length N and each code rate r.

FIG. 37 is a view illustrating an example of the parity check matrix initial value table.

That is to say, FIG. 37 illustrates the parity check matrix initial value table for the parity check matrix H whose code length N is 16200 bits and code rate (code rate in notation of DVB-T.2) r is 1/4 specified in the DVB.T-2 standard.

The parity check matrix generation unit 613 (FIG. 35) obtains the parity check matrix H in a following manner using the parity check matrix initial value table.

FIG. 38 illustrates a method of obtaining the parity check matrix H from the parity check matrix initial value table.

In other words, the parity check matrix initial value table in FIG. 38 illustrates the parity check matrix initial value table for the parity check matrix H whose code length N is 16200 bits and code rate r is 2/3 specified in the DVB.T-2 standard.

The parity check matrix initial value table is the table indicating the position of the element 1 of the information matrix $H_A$ (FIG. 10) corresponding to the information length K according to the code length N and the code rate r of the LDPC code for each 360 columns (the number of columns P being the unit of the cyclic structure) as described above in which row numbers (the row number of the first row of the parity check matrix H is 0) of the elements of 1 of a 1+360×(i−1)-th column of the parity check matrix H as many as the number of column weights of the 1+360×(i−1)-th column are arranged in an i-th row.

Herein, the parity matrix $H_T$ (FIG. 10) corresponding to the parity length M of the parity check matrix H is determined as illustrated in FIG. 21, so that the information matrix $H_A$ (FIG. 10) corresponding to the information length K of the parity check matrix H is obtained according to the parity check matrix initial value table.

The number of rows k+1 of the parity check matrix initial value table differs according to the information length K.

The information length K and the number of rows k+1 of the parity check matrix initial value table satisfy relationship in equation (9).

$$K=(k+1)\times 360 \tag{9}$$

Herein, 360 in equation (9) is the number of columns P being the unit of the cyclic structure illustrated in FIG. 26.

In the parity check matrix initial value table in FIG. 38, 13 values are arranged in each of first to third rows and 3 values are arranged in each of fourth to k+1-th rows (30th row in FIG. 38).

Therefore, the column weights of the parity check matrix H obtained from the parity check matrix initial value table in FIG. 34 are 13 from the first column to 1+360×(3−1)−1-th column and 3 from the 1+360×(3−1)-th column to a K-th column.

The first row of the parity check matrix initial value table in FIG. 38 is 0, 2084, 1613, 1548, 1286, 1460, 3196, 4297, 2481, 3369, 3451, 4620, and 2622 and this indicates that the element of the rows whose row numbers are 0, 2084, 1613, 1548, 1286, 1460, 3196, 4297, 2481, 3369, 3451, 4620, and 2622 is 1 (and other elements are 0) in the first column of the parity check matrix H.

Also, the second row of the parity check matrix initial value table in FIG. 38 is 1, 122, 1516, 3448, 2880, 1407, 1847, 3799, 3529, 373, 971, 4358, and 3108 and this indicates that the element of the rows whose row numbers are 1, 122, 1516, 3448, 2880, 1407, 1847, 3799, 3529, 373, 971, 4358, and 3108 are 1 in a 361 (=1+360×(2−1))-th column of the parity check matrix H.

As described above, the parity check matrix initial value table indicates the position of the element 1 of the information matrix $H_A$ of the parity check matrix H for each 360 columns.

The column other than the 1+360×(i−1)-th column of the parity check matrix H, that is to say, each column from a 2+360×(i−1)-th column to a 360×i-th column is obtained by periodically performing the cyclic shift to the element 1 of the 1+360×(i−1)-th column determined by the parity check matrix initial value table downward (in a direction toward a lower part of the column) according to the parity length M to arrange.

That is to say, the 2+360×(i−1)-th column is obtained by the cyclic shift of the 1+360×(i−1)-th column downward by M/360 (=q) and a next 3+360×(i−1)-th column is obtained by the cyclic shift of the 1+360×(i−1)-th column downward by 2×M/360 (=2×q) (the cyclic shift of the 2+360×(i−1)-th column downward by M/360(=q)), for example.

Herein, if an i-th row (i-th row from the top) j-th column (j-th column from left) value of the parity check matrix initial value table is represented as $h_{i,j}$ and the row number of a j-th element 1 of a w-th column of the parity check matrix H is represented as $H_{w-j}$, a row number $H_{w-j}$ of the element 1 of the w-th column being the column other than the 1+360×(i−1)-th column of the parity check matrix H may be obtained by equation (10).

$$H_{w-j}=\mathrm{mod}\ \{h_{i,j}+\mathrm{mod}((w-1),P)\times q,M) \tag{10}$$

Herein, mod (x, y) represents a remainder obtained when x is divided by y.

Also, P represents the above-described number of columns being the unit of the cyclic structure, which is set to 360 as described above in the DVB-S.2 standard, the DVB-T.2 standard and the DVB-C.2 standard, for example. Further, q represents a value M/360 obtained by dividing the parity length M by the number of columns P (=360) being the unit of the cyclic structure.

The parity check matrix generation unit 613 (FIG. 35) specifies the row number of the element 1 of the 1+360×(i−1)-th column of the parity check matrix by the parity check matrix initial value table.

Further, the parity check matrix generation unit 613 (FIG. 35) obtains the row number $H_{w-j}$ of the element 1 of the w-th column being the column other than the 1+360×(i−1)-th column of the parity check matrix H according to equation (10) and generates the parity check matrix H in which an element of the row number obtained from above is 1.

<New LDPC Code>

In the future, it is expected that a demand to transmit large capacity data such as high resolution images is increasing. In the transmission of large capacity data, it demands sometimes an LDPC code having a high code rate (low redundancy). Even if the LDPC code having a high code rate is used, a good communication quality is desirably provided.

As the LDPC code having a high code rate capable of providing a good communication quality, an LDPC code (hereinafter also referred to as a "new LDPC code") having the code rate r of 6/15 and the code length N of 16 k bits will be described.

As for the new LDPC code, the parity matrix $H_T$ of the parity check matrix H has the stepwise structure (FIG. 11) as is the case with the LDPC code specified in DVB-S.2 from a viewpoint of maintaining compatibility with DVB-S.2 as far as possible.

Further, as for the new LDPC code, as is the case with the LDPC code specified in DVB-S.2, the information matrix $H_A$ of the parity check matrix H has the cyclic structure and the number of columns P being the unit of the cyclic structure is set to 360.

Figure 40:
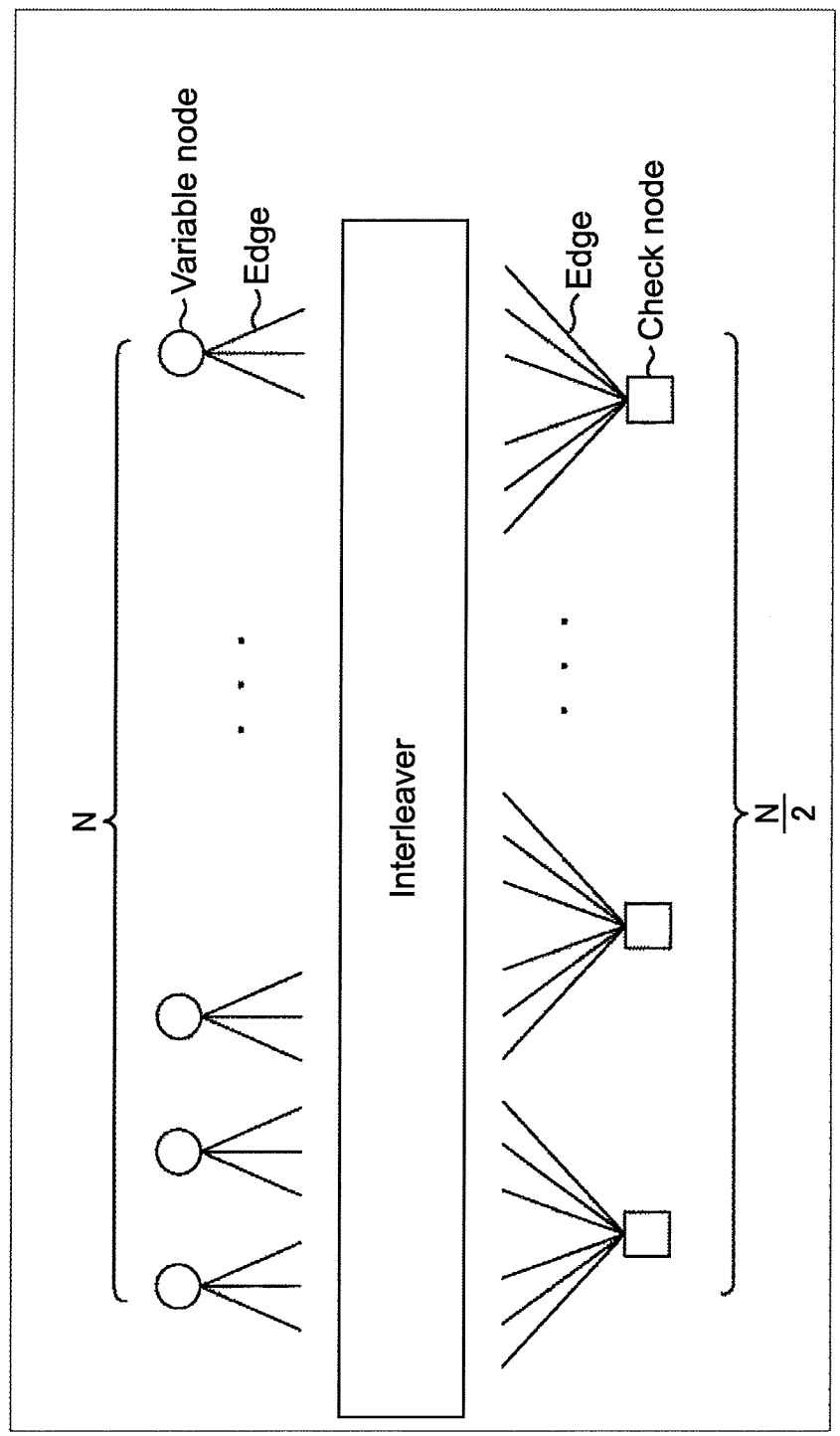
FIG. 40 A view showing an example of the Tanner graph of an ensemble of a degree sequence in which a column weight is 3 and a row weight is 6.
Figure 41:
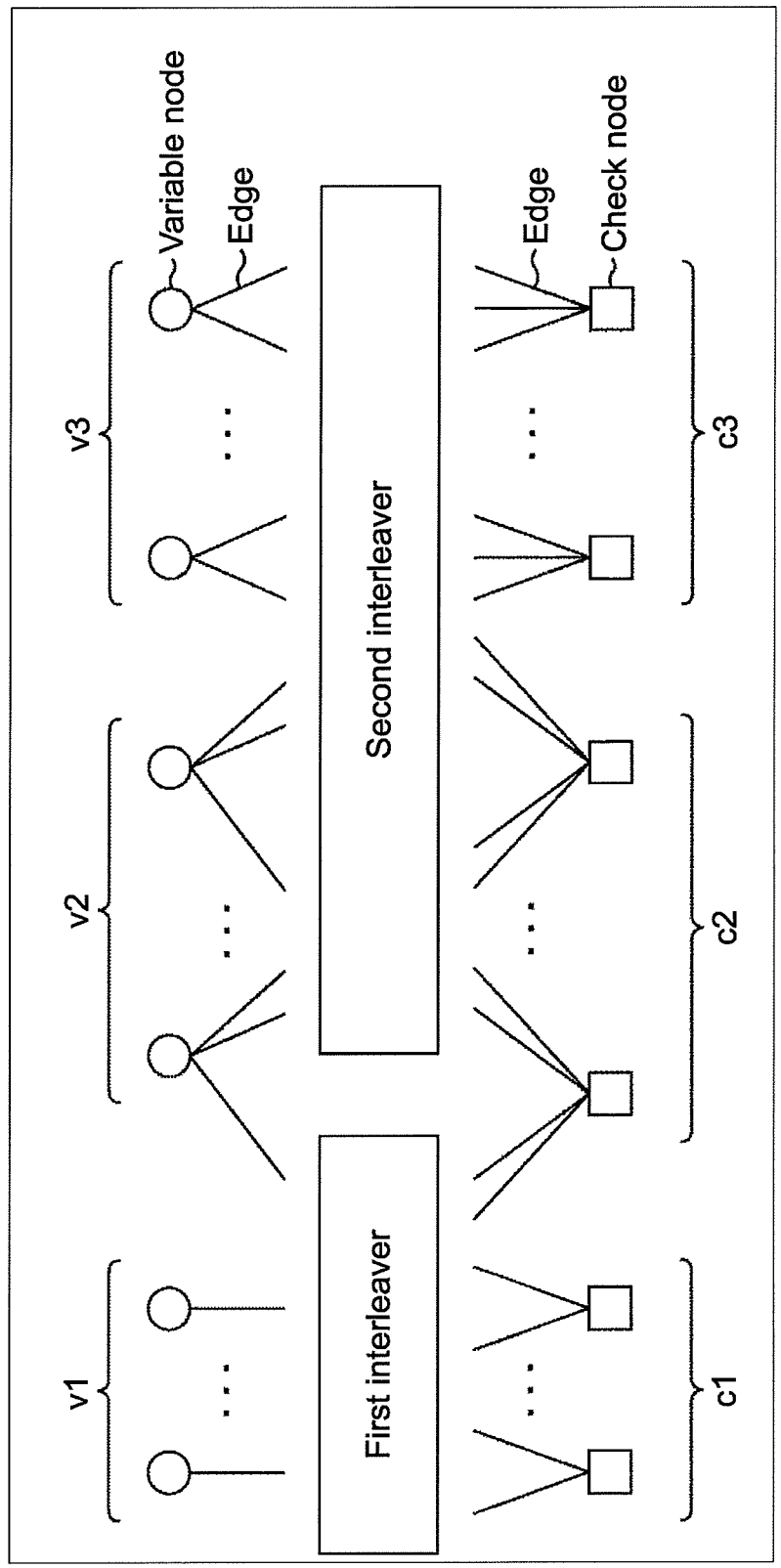
FIG. 41 A view showing an example of the Tanner graph of a multi-edge type ensemble.

FIG. 39, FIG. 40 and FIG. 41 are views showing examples of the parity check matrix initial value table of the new LDPC code.

The LDPC encoder 115 (FIG. 8, FIG. 35) performs the LDPC encoding to provide the new LDPC code using the parity check matrix H obtained from the parity check matrix initial value table shown in FIG. 39.

In this case, the parity check matrix initial value table shown in FIG. 39 is stored in the storage unit 602 of the LDPC encoder 115 (FIG. 8).

The new LDPC code obtained using the parity check matrix H obtained from the parity check matrix initial value table in FIG. 39 is a high-performance LDPC code.

Herein, the term "high-performance LDPC code" is intended to mean the LDPC code obtained from an appropriate parity check matrix H.

The term "appropriate parity check matrix H" is intended to mean the parity check matrix, which satisfies a predetermined condition to make the BER (bit error rate) lower when the LDPC code obtained from the parity check matrix H is transmitted with low Es/No or Eb/No (signal power to noise power ratio per bit).

The appropriate parity check matrix H may be obtained by the simulation of the measurement of the BER at the time when the LDPC code obtained from the various parity check matrices satisfying the predetermined condition is transmitted with the low Es/No, for example.

The predetermined condition, which the appropriate parity check matrix H should satisfy, includes an excellent analysis result obtained by an analyzing method of performance of the code referred to as density evolution, absence of a loop of the elements of 1 referred to as cycle-4 and the like, for example.

Herein, it is known that the decoding performance of the LDPC code is deteriorated when the elements of 1 close up as the cycle-4 in the information matrix $H_A$, so that the absence of the cycle-4 is required as the predetermined condition, which the appropriate parity check matrix H should satisfy.

The predetermined condition, which the appropriate parity check matrix H should satisfy, may be appropriately determined from a viewpoint of improvement in the decoding performance of the LDPC code, facilitation (simplification) of the decoding process of the LDPC code and the like.

FIG. 40 and FIG. 41 are views illustrating the density evolution with which the analysis result as the predetermined condition, which the appropriate parity check matrix H should satisfy, is obtained.

The density evolution is the analyzing method of the code, which calculates an expected value of the error probability for an entire LDPC code (ensemble) whose code length N is ∞ characterized by a degree sequence to be described later.

For example, when a variance value of noise is set to be larger from 0 on the AWGN channel, the expected value of the error probability of a certain ensemble, which is initially 0, is no longer 0 when the variance value of the noise becomes a certain threshold or larger.

According to the density evolution, it is possible to determine whether performance of the ensemble (appropriateness of the parity check matrix) is excellent by comparing the threshold of the variance value of the noise (hereinafter, also referred to as a performance threshold) at which the expected value of the error probability is no longer 0.

It is possible to predict rough performance of a specific LDPC code by determining the ensemble to which the LDPC code belongs and performing the density evolution to the ensemble.

Therefore, when a high-performance ensemble is found, the high-performance LDPC code may be found from the LDPC codes belonging to the ensemble.

Herein, the above-described degree sequence indicates a ratio of the variable node and the check node having the weight of each value to the code length N of the LDPC code.

For example, a regular (3, 6) LDPC code whose code rate is 1/2 belongs to the ensemble characterized by the degree sequence in which the weight (column weight) of all the variable nodes is 3 and the weight (row weight) of all the check nodes is 6.

FIG. 40 shows the Tanner graph of such ensemble.

In the Tanner graph in FIG. 40, there are N (equal to the code length N) variable nodes represented by a circle (○) in the drawing and N/2 (equal to a product obtained by multiplying the code rate 1/2 by the code length N) check nodes represented by a square (□) in the drawing.

Three edges, the number of which is equal to the column weight, are connected to each variable node, so that there are a total of 3N edges connected to the N variable nodes.

Also, six edges the number of which is equal to the row weight, are connected to each check node, so that there are a total of 3N edges connected to the N/2 check nodes.

Further, there is one interleaver in the Tanner graph in FIG. 40.

The interleaver randomly rearranges the 3N edges connected to the N variable nodes and connects the rearranged edges to any of the 3N edges connected to the N/2 check nodes.

There are $(3N)!(=(3N)\times(3N-1)\times \ldots \times 1)$ rearranging patterns of rearranging the 3N edges connected to the N variable nodes by the interleaver. Therefore, the ensemble characterized by the degree sequence in which the weight of all the variable nodes is 3 and the weight of all the check nodes is 6 is a set of (3N)! LDPC codes.

In the simulation for obtaining the high-performance LDPC code (appropriate parity check matrix), a multi-edge type ensemble is used in the density evolution.

In the multi-edge type, the interleaver through which the edge connected to the variable node and the edge connected to the check node pass is divided into a multi-edge one, so that the ensemble is more strictly characterized.

FIG. 41 shows an example of the Tanner graph of the multi-edge type ensemble.

In the Tanner graph in FIG. 41, there are two interleavers, which are a first interleaver and a second interleaver.

In the Tanner graph in FIG. 41, there are v1 variable nodes with one edge connected to the first interleaver and no edge connected to the second interleaver, v2 variable nodes with one edge connected to the first interleaver and two edges connected to the second interleaver, and v3 variable nodes with no edge connected to the first interleaver and two edges connected to the second interleaver.

Further, in the Tanner graph in FIG. 41, there are c1 check nodes with two edges connected to the first interleaver and no edge connected to the second interleaver, c2 check nodes with two edges connected to the first interleaver and two edges connected to the second interleaver, and c3 check nodes with no edge connected to the first interleaver and three edges connected to the second interleaver.

Herein, the density evolution and implementation thereof are described in "On the Design of Low-Density Parity-Check Codes within 0.0045 dB of the Shannon Limit", S. Y. Chung, G. D. Forney, T. J. Richardson, and R. Urbanke, IEEE Communications Leggers, VOL. 5, NO. 2, February 2001, for example.

In the simulation for obtaining (the parity check matrix initial value table of) the new LDPC code, the ensemble in which the performance threshold being Eb/No (signal power to noise power ratio per bit) at which the BER starts to decrease (to be lower) is a predetermined value or smaller is found by multi-edge type density evolution and the LDPC code to decrease the BER is selected as the high-performance LDPC code out of the LDPC codes belonging to the ensemble.

The above-described parity check matrix initial value table of the new LDPC code is the parity check matrix initial value table of the LDPC code having the code rate r of 8/15 and the code length N of 16 k bits determined by the above simulation.

Accordingly, by the new LDPC code obtained from the parity check matrix initial value table, it can confirm that a good communication quality is provided in the data transmission.

Figures 42, 43:
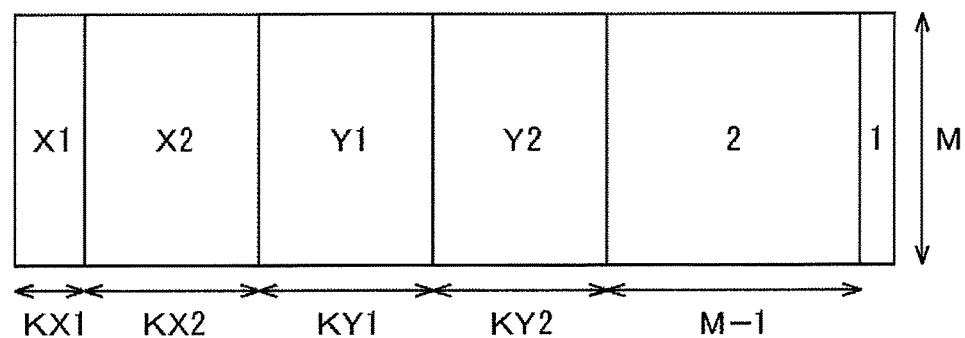
FIG. 42 A view showing a minimum cycle length and a performance threshold of the parity check matrix of the 16 k code whose r=8/15.
FIG. 43 A view illustrating the parity check matrix of the 16 k code whose r=8/15.

FIG. 42 is a view showing a minimum cycle length and a performance threshold of the parity check matrix H obtained from the parity check matrix initial value table of the new LDPC code shown in FIG. 39.

Here, the minimum cycle length (girth) means a minimum value of a length of a loop (loop length) configured of the elements of 1 in the parity check matrix H.

The parity check matrix H obtained from the parity check matrix initial value table of the new LDPC code has the minimum cycle length of six, and there is no cycle-4 (the loop length of four, a loop of the elements of 1).

The performance threshold of the new LDPC code is 0.805765.

FIG. 43 is a view illustrating the parity check matrix H (the parity check matrix H of the new LDPC code) (obtained from the parity check matrix initial value table) in FIG. 39.

The column weight is X1 for first to KX1-th columns of the parity check matrix H of the new LDPC code, the column weight is X2 for next KY2 columns, the column weight is Y1 for next KY2 columns, the column weight is 2 for next M−1 columns, and the column weight is 1 for a last column.

Herein, KX1+KX2+KY1+KY2+M−1+1 is equal to the code length N=16200 bits.

FIG. 44 is a view showing the numbers of columns KX, KY1, KY2, and M, and the column weights X1, X2, Y1, and Y2 in FIG. 43 for each code matrix H of the new LDPC code.

As for the parity check matrix H of the new LDPC code, as is the case with the parity check matrix illustrated in FIGS. 12 and 13, the column weight of the column closer to the top (left) column tends to be larger, so that the code bit closer to the top code bit of the new LDPC code tends to be more tolerant to error (have resistance to error).

Figure 45:
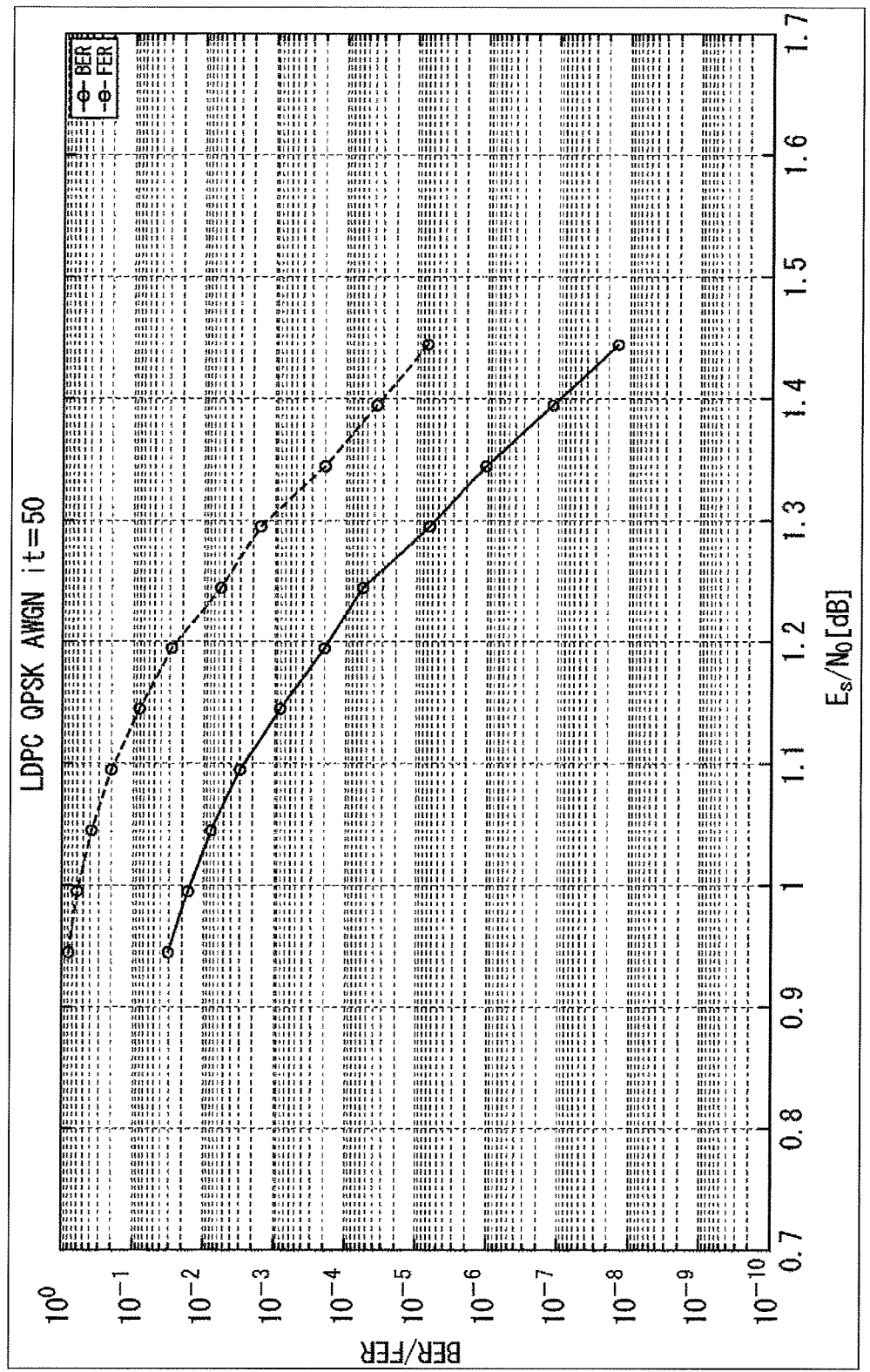
FIG. 45 A view showing a simulation result of measurement of BER/FER.

FIG. 45 is a view showing a simulation result of the BER/FER of the new LDPC code in FIG. 39.

In the simulation, the AWGN communication channel (channel) is supposed, the BPSK is adopted as the modulation scheme and 50 times is adopted as the number of times of repetitive decoding C(it).

In FIG. 45, Es/No is plotted along the abscissa and the BER/FER is plotted along the ordinate. A solid line represents the BER, and a dotted line represents the FER.

According to FIG. 45, as for the new LDPC code, excellent BER/FER are obtained. Accordingly, it can confirm that a good communication quality is provided in the data transmission using the new LDPC code.

<Configuration Example of Receiving Device 12>

Figure 46:
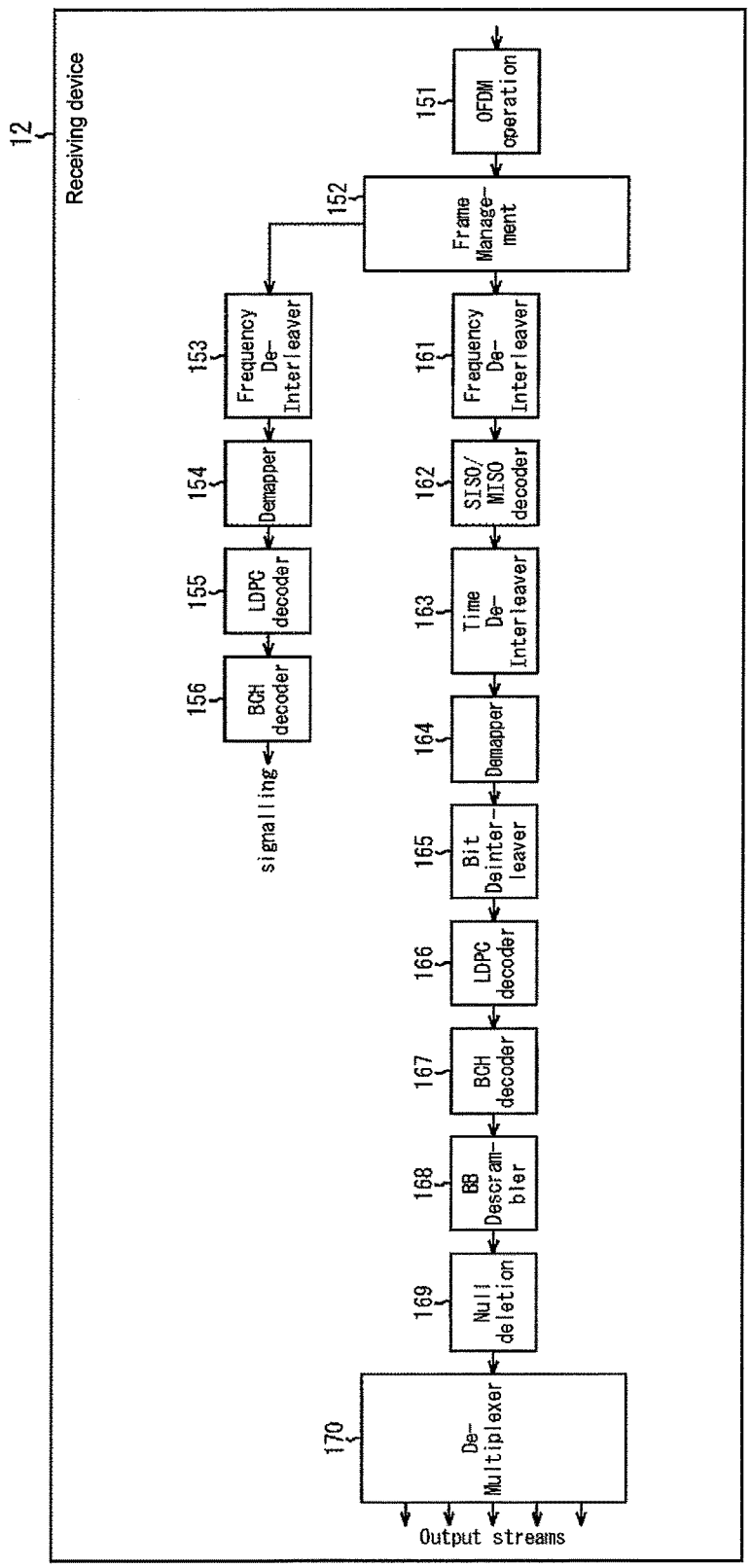
FIG. 46 A block diagram showing a configuration example of a receiving device 12.

FIG. 46 is a block diagram illustrating a configuration example of the receiving device 12 in FIG. 7.

An OFDM operation 151 receives the OFDM signal from the transmitting device 11 (FIG. 7) and performs signal processing of the OFDM signal. The data obtained by the signal processing by the OFDM operation 151 is supplied to a frame management 152.

The frame management 152 performs processing of the frame (frame interpretation) configured of the data supplied from the OFDM operation 151 and supplies the symbol of the target data and the symbol of the control data obtained as a result to frequency deinterleavers 161 and 153.

The frequency deinterleaver 153 performs frequency deinterleave in the symbol unit for the data from the frame management 152 to supply to a demapper 154.

The demapper 154 demaps (performs signal point constellation decoding) the data (data on the constellation) from the frequency deinterleaver 153 based on the symbol arrangement (constellation) determined by the orthogonal modulation performed at the transmitting device 11 to perform the orthogonal demodulation thereof and supplies the data ((likelihood) of the LDPC code) obtained as a result to a LDPC decoder 155.

The LDPC decoder 155 performs LDPC decoding of the LDPC code from the demapper 154 and supplies the LDPC target data (herein, a BCH code) obtained as a result to a BCH decoder 156.

The BCH decoder 156 performs BCH decoding of the LDPC target data from the LDPC decoder 155 and outputs the control data (signaling) obtained as a result.

On the other hand, the frequency deinterleaver 161 performs the frequency deinterleave in the symbol unit for the data from the frame management 152 to supply to a SISO/MISO decoder 162.

The SISO/MISO decoder 162 performs time-space decoding of the data from the frequency deinterleaver 161 to supply to a time deinterleaver 163.

The time deinterleaver 163 performs time deinterleave of the data from the SISO/MISO decoder 162 in the symbol unit to supply to a demapper 164.

The demapper 164 demaps (performs signal point constellation decoding) the data (data on the constellation) from the time deinterleaver 163 based on the symbol point arrangement (constellation) determined by the orthogonal modulation performed at the transmitting device 11 to perform the orthogonal demodulation thereof and supplies the data obtained as a result to a bit deinterleaver 165.

The bit deinterleaver 165 performs bit deinterleave of the data from the demapper 164 and supplies (the likelihood of) the LDPC code obtained as a result to an LDPC decoder 166.

The LDPC decoder 166 performs the LDPC decoding of the LDPC code from the bit deinterleaver 165 and supplies the LDPC target data (herein, the BCH code) obtained as a result to a BCH decoder 167.

The BCH decoder 167 performs the BCH decoding of the LDPC target data from the LDPC decoder 155 and supplies the data obtained as a result to a BB descrambler 168.

The BB descrambler 168 applies a BB descramble to the data from the BCH decoder 167 and supplies the data obtained as a result to a null deletion 169.

The null deletion 169 deletes the null inserted by the padder 112 in FIG. 8 from the data from the BB descrambler 168 and supplies the same to a demultiplexer 170.

The demultiplexer 170 separates one or more streams (target data) multiplexed into the data from the null deletion 169 and outputs the same as output streams.

The receiving device 12 may be configured without including some of the blocks shown in FIG. 46. In other words, if the transmitting device 11 (FIG. 8) is configured without including the time interleaver 118, the SISO/MISO encoder 119, the frequency interleaver 120, and frequency interleaver 124, for example, the receiving device 12 may be configured without including the time deinterleaver 163, the SISO/MISO decoder 162, the frequency deinterleaver 161, and frequency deinterleaver 153 that are the blocks corresponding to the time interleaver 118, the SISO/MISO encoder 119, the frequency interleaver 120, and frequency interleaver 124 of the transmitting device 11, respectively.

Figure 47:
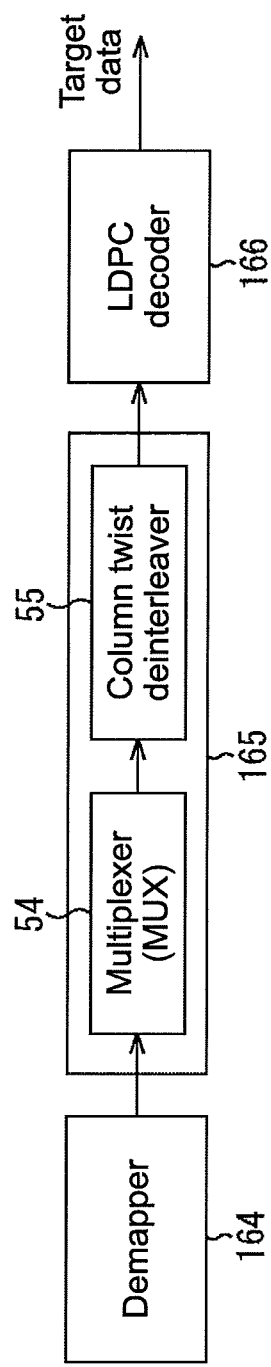
FIG. 47 A block diagram showing a configuration example of a bit deinterleaver 165.

FIG. 47 is a block diagram showing a configuration example of the bit deinterleaver 165 in FIG. 46.

The bit deinterleaver 165 configured of a multiplexer (MUX) 54 and a column twist deinterleaver 55 and performs the (bit) deinterleave of the symbol bits of the data from the demapper 164 (FIG. 46).

That is to say, the multiplexer 54 performs an inverse interchanging process corresponding to the interchanging process performed by the demultiplexer 25 in FIG. 9 (an inverse process of the interchanging process), that is to say, the inverse interchanging process to return the positions of (the likelihood of) the code bits of the LDPC code interchanged by the interchanging process to the original positions to the symbol bits of the symbol from the demapper 164 and supplies the LDPC code obtained as a result to the column twist deinterleaver 55.

The column twist deinterleaver 55 performs column twist deinterleave (inverse process of the column twist interleave) corresponding to the column twist interleave as the rearranging process performed by the column twist interleaver 24 in FIG. 9 to the LDPC code from the multiplexer 54, that is to say, the column twist deinterleave, for example, as an inverse rearranging process to return the code bits of the LDPC code, the arrangement of which is changed by the column twist interleave as the rearranging process, to the original arrangement.

Specifically, the column twist deinterleaver 55 writes/reads the code bits of the LDPC code to/from the memory for the deinterleave configured in the same manner as the memory 31 illustrated in FIG. 28 and the like, thereby performing the column twist deinterleave.

In the column twist deinterleaver 55, the writing of the code bits is performed in the row direction of the memory for the deinterleave using the read address at the time of the reading of the code bits from the memory 31 as the write address. Also, the reading of the code bits is performed in the column direction of the memory for the deinterleave using the write address at the time of the writing of the code bits to the memory 31 as the read address.

The LDPC code obtained as a result of the column twist deinterleave is supplied from the column twist deinterleaver 55 to the LDPC decoder 166.

If the parity interleave, the column twist interleave, and the interchanging process are applied to the LDPC code supplied from the demapper 164 to the bit deinterleaver 165, the bit deinterleaver 165 may perform all of parity deinterleave (inverse process of the parity interleave, that is to say, the parity deinterleave to return the code bits of the LDPC code, the arrangement of which is changed by the parity interleave, to the original arrangement is not performed) corresponding to the parity interleave, the inverse interchanging corresponding to the interchanging process, and the column twist deinterleave corresponding to the column twist interleave.

Note that the bit deinterleaver 165 in FIG. 47 includes the multiplexer 54 that performs the inverse interchanging process corresponding to the interchanging process, and the column twist deinterleaver 55 that performs the column twist deinterleave corresponding to the column twist interleave, but includes no block for performing parity deinterleave corresponding to the parity interleave, and the parity deinterleave is not performed.

Therefore, the LDPC code, to which the inverse interchanging process and the column twist deinterleave are applied and the parity deinterleave is not applied, is supplied from (the column twist deinterleaver 55 of) the bit deinterleaver 165 to the LDPC decoder 166.

The LDPC decoder 166 performs the LDPC decoding of the LDPC code from the bit deinterleaver 165 using the conversion parity check matrix obtained by at least applying the column permutation corresponding to the parity interleave to the parity check matrix H used by the LDPC encoder 115 in FIG. 8 in the LDPC encoding and outputs the data obtained as a result as a decoding result of the LDPC target data.

Figure 48:
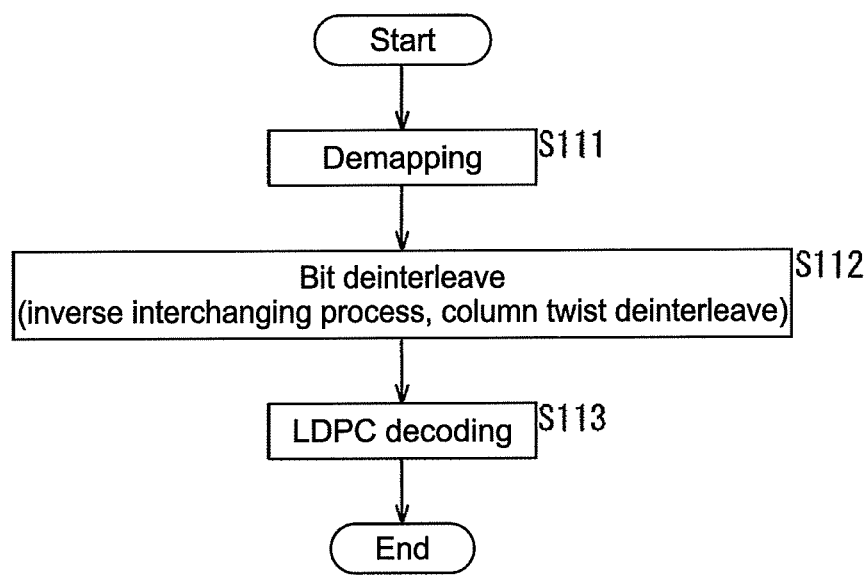
FIG. 48 A flowchart illustrating processes performed by a demapper 164, the bit deinterleaver 165, and an LDPC decoder 166.

FIG. 48 is a flowchart illustrating processes performed by the demapper 164, the bit deinterleaver 165, and the LDPC decoder 166 in FIG. 47.

At step S111, the demapper 164 demaps the data from the time deinterleaver 163 (data mapped onto the signal point on the constellation) to perform the orthogonal demodulation and supplies the same to the bit deinterleaver 165, then the process shifts to S112.

At step S112, the bit deinterleaver 165 performs the deinterleave (bit deinterleave) from the demapper 164 and the process shifts to step S113.

That is to say, at step S112, the multiplexer 54 performs the inverse interchanging process of the data (corresponding to the symbol bits of the symbol) from the demapper 164 and supplies the code bits of the LDPC code obtained as a result to the column twist deinterleaver 55.

The column twist deinterleaver 55 performs the column twist deinterleave to the LDPC code from the multiplexer 54 and supplies (the likelihood of) the LDPC code obtained as a result to the LDPC decoder 166.

At step S113, the LDPC decoder 166 performs the LDPC decoding of the LDPC code from the column twist deinterleaver 55 using the conversion parity check matrix H used by the LDPC encoder 115 in FIG. 8 in the LDPC encoding, i.e., using the conversion parity check matrix obtained by at least applying the column permutation corresponding to the parity interleave to the parity check matrix H and outputs the data obtained as a result to the BCH decoder 167 as the decoding result of the LDPC target data.

Figure 49:
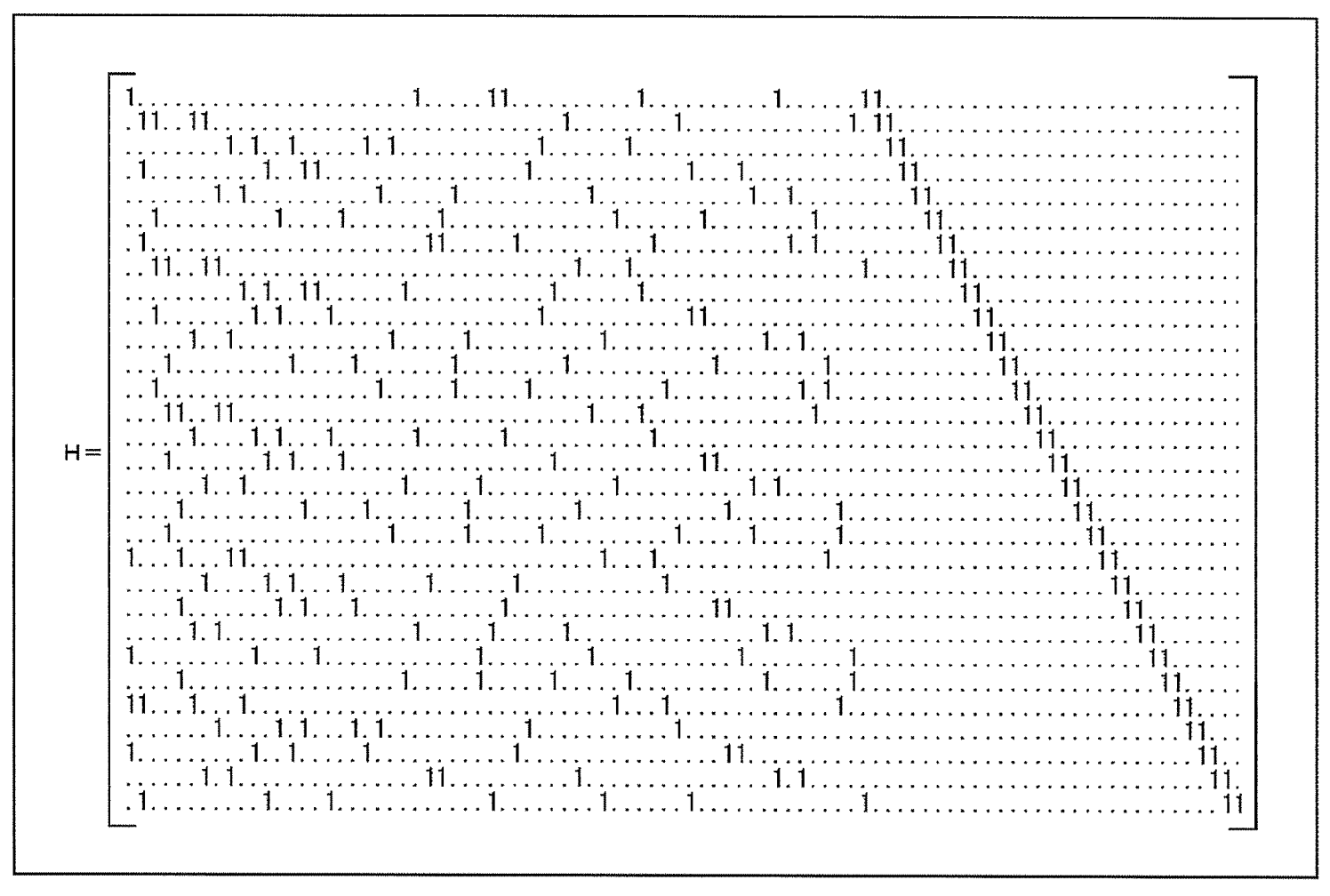

Although the multiplexer 54, which performs the inverse interchanging process, and the column twist deinterleaver 55, which performs the column twist deinterleave, are separately formed also in FIG. 49 as in FIG. 9 for convenience of description, the multiplexer 54 and the column twist deinterleaver 55 may be integrally formed.

When the column twist interleave is not performed by the bit interleaver 116 in FIG. 9, it is not required to provide the column twist deinterleaver 55 in the bit deinterleaver 165 in FIG. 47.

Next, the LDPC decoding performed by the LDPC decoder 166 in FIG. 46 is further described.

The LDPC decoder 166 in FIG. 46 performs the LDPC decoding of the LDPC code to which the inverse interchanging process and the column twist deinterleave are applied and the parity interleave is not applied from the column twist deinterleaver 55 using the conversion parity check matrix obtained by at least applying the column permutation corresponding to the parity interleave to the parity check matrix H used by the LDPC encoder 115 in FIG. 8 in the LDPC encoding as described above.

Herein, the LDPC decoding capable of limiting an operation frequency within a sufficiently feasible range while limiting a circuit size by performing the LDPC decoding using the conversion parity check matrix is conventionally suggested (refer to U.S. Pat. No. 4,224,777, for example).

Therefore, the LDPC decoding using the conversion parity check matrix conventionally suggested is first described with reference to FIGS. 49 to 52.

FIG. 49 illustrates an example of the parity check matrix H of the LDPC code whose code length N is 90 and code rate is 2/3.

In FIG. 49 (also in FIGS. 50 and 51 to be described later), 0 is represented by a period (·).

In the parity check matrix H in FIG. 49, the parity matrix has the stepwise structure.

Figure 50:
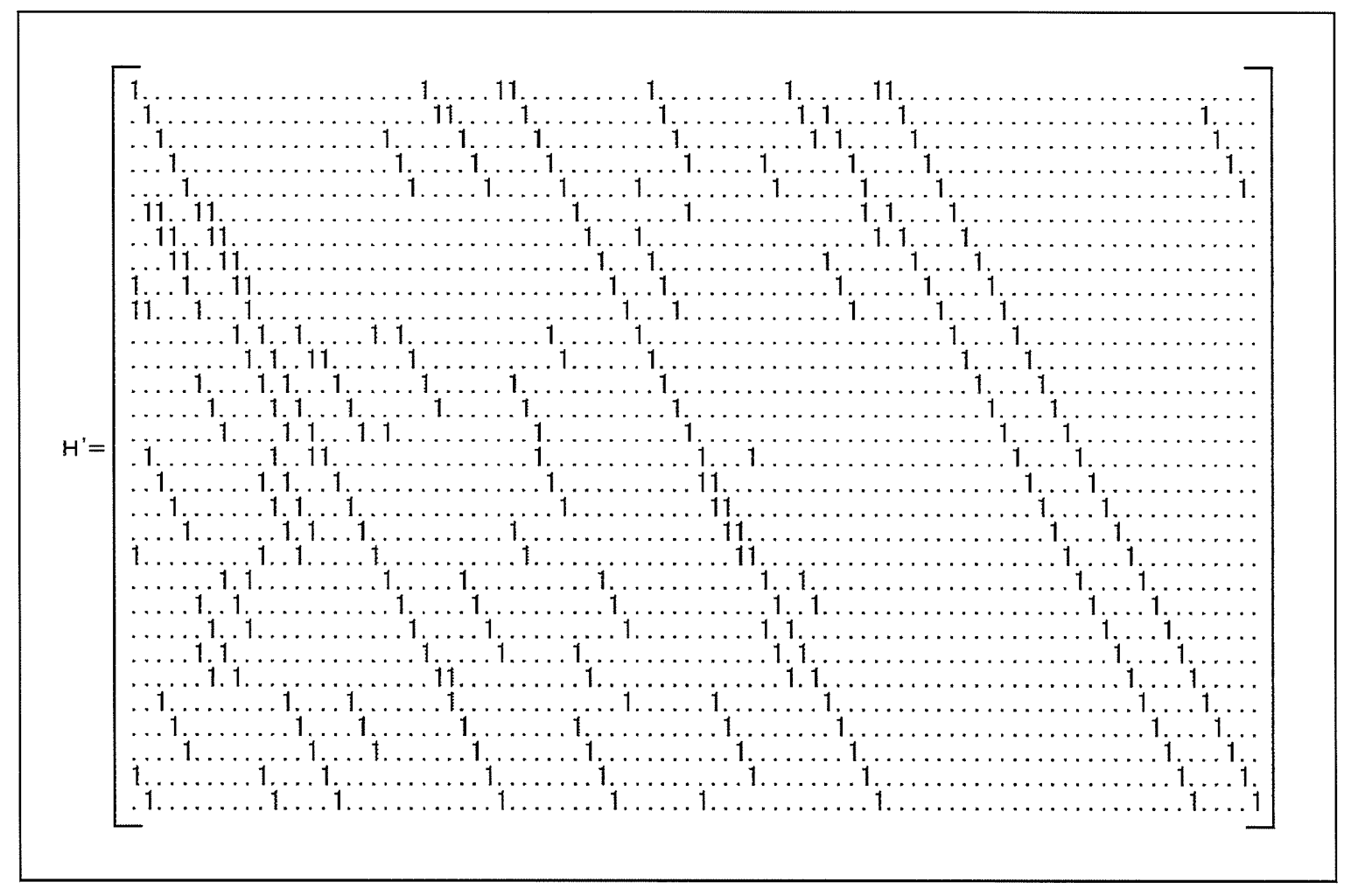

FIG. 50 illustrates a parity check matrix H' obtained by applying the row permutation in equation (11) and the column permutation in equation (12) to the parity check matrix H in FIG. 49.

Row permutation: $6s+t+$first row$-> t+s+$first row (11)

Column permutation: $6x+y+61$th row$-> 5y+x+61$th row (12)

In equations (11) and (12), s, t, x, and y are integers within a range satisfying $0 \leq s < 5$, $0 \leq t < 6$, $0 \leq x < 5$, and $0 \leq t < 6$, respectively.

According to the row permutation in equation (11), it is permutated such that 1st, 7th, 13th, 19th, and 25th rows, which leave a remainder of 1 when divided by 6, are made 1st, 2nd, 3rd, 4th, and 5th rows, and 2nd, 8th, 14th, 20th, and 26th rows, which leave a remainder of 2 when divided by 6, are made 6th, 7th, 8th, 9th, and 10th rows, respectively.

Also, according to the column permutation in equation (12), it is permutated such that 61st, 67th, 73rd, 79th, and 85th columns, which leave a remainder of 1 when divided by 6, are made 61st, 62nd, 63rd, 64th, and 65th columns, and 62nd, 68th, 74th, 80th, and 86th columns, which leave a remainder of 2 when divided by 6, are made 66th, 67th, 68th, 69th, and 70th columns, respectively, for the 61st and subsequent columns (parity matrix).

The matrix obtained by performing the row permutation and the column permutation of the parity check matrix H in FIG. 49 in this manner is the parity check matrix H' in FIG. 50.

Herein, the row permutation of the parity check matrix H does not affect the arrangement of the code bits of the LDPC code.

The column permutation in equation (12) corresponds to the parity interleave when the information length K, the number of columns P being the unit of the cyclic structure, and the submultiple q M/P) of the parity length M (herein, 30) of the above-described parity interleave to interleave the K+qx+y+1-th code bit to the position of the K+Py+x+1-th code bit are set to 60, 5, and 6, respectively.

Accordingly, the parity check matrix H' in FIG. 50 is the conversion parity check matrix obtained by at least applying the column permutation that the K+qx+y+1-th column is permutated with the K+Py+x+1-th column of the parity check matrix H in FIG. 49 (hereinafter, appropriately referred to as the original parity check matrix).

By multiplying the parity check matrix H' in FIG. 50 by the LDPC code of the parity check matrix H in FIG. 49 to which the same permutation as equation (12) is applied, a 0 vector is output. That is to say, when a row vector obtained by applying the column permutation in equation (12) to the row vector c as the LDPC code (one codeword) of the original parity check matrix H is represented as c', $Hc^T$ becomes the 0 vector from the nature of the parity check matrix, so that H'c'T naturally becomes the 0 vector.

From above, the conversion parity check matrix H' in FIG. 50 is the parity check matrix of the LDPC code c' obtained by applying the column permutation in equation (12) to the LDPC code c of the original parity check matrix H.

Therefore, by applying the column permutation in equation (12) to the LDPC code c of the original parity check matrix H, decoding (LDPC decoding) the LDPC code c' after the column permutation using the conversion parity check matrix H' in FIG. 50, and applying inverse permutation in the column permutation in equation (12) to the decoding result, it is possible to obtain the decoding result similar to that in a case in which the LDPC code of the original parity check matrix H is decoded using the parity check matrix H.

Figure 51:
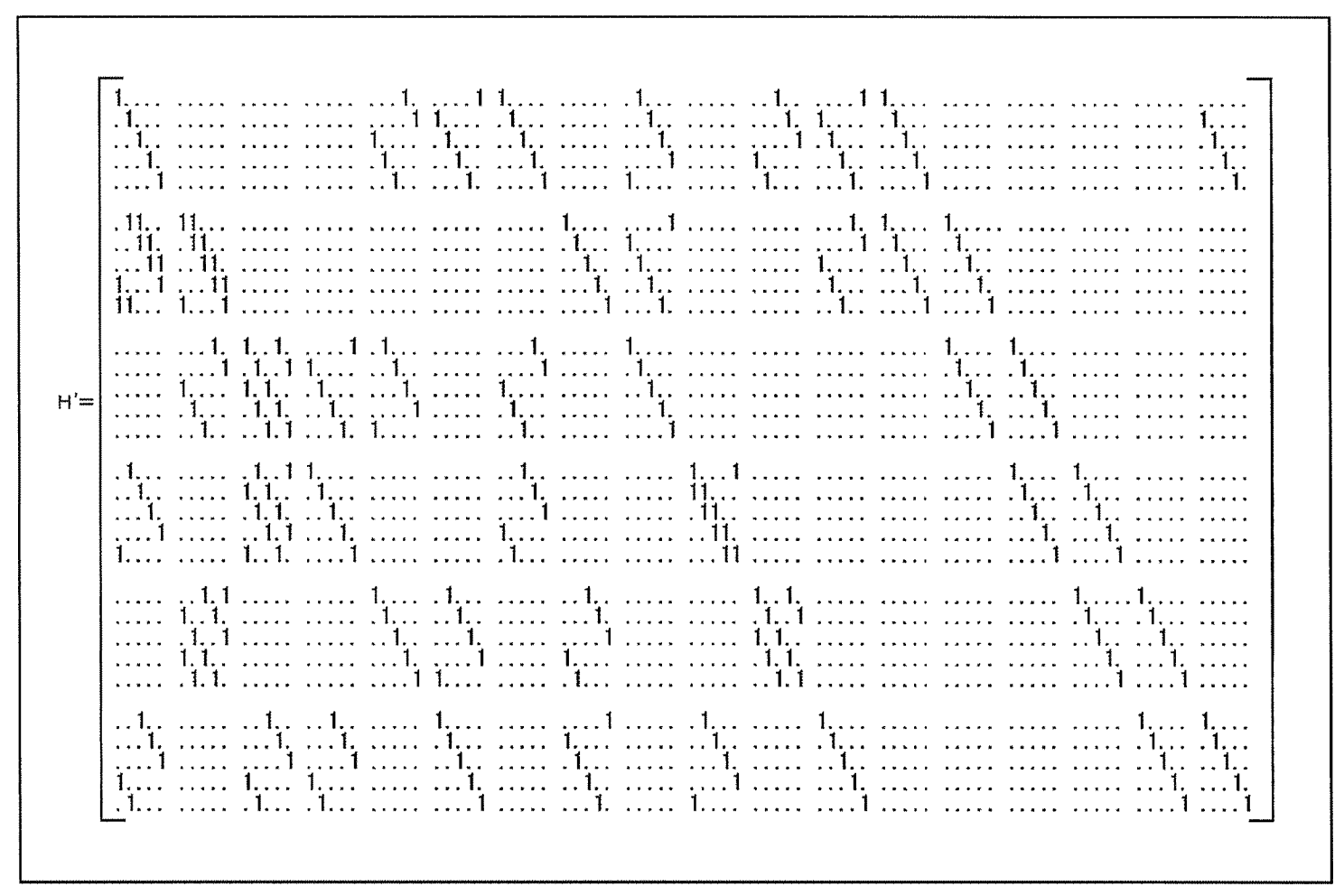

FIG. 51 shows the conversion parity check matrix H' in FIG. 50 with an interval between the units of 5×5 matrix.

In FIG. 51, the conversion parity check matrix H' is represented by a combination of the 5×5 (=P×P) unit matrix, a matrix in which one or more 1 of the unit matrix is set to 0 (hereinafter, appropriately referred to as a quasi-unit matrix), a matrix obtained by the cyclic shift of the unit matrix or the quasi-unit matrix (hereinafter, appropriately referred to as a shift matrix), a sum of two or more of the unit matrix, the quasi-unit matrix, and the shift matrix (hereinafter, appropriately referred to as a sum matrix), and a 5×5 0 matrix.

It may be said that the conversion parity check matrix H' in FIG. 51 is configured of the 5×5 unit matrix, quasi-unit matrix, shift matrix, sum matrix, and 0 matrix. Therefore, the 5×5 matrices (the unit matrix, the quasi-unit matrix, the shift matrix, the sum matrix, and the 0 matrix) constitute the conversion parity check matrix H' are hereinafter appropriately referred to as constitutive matrices.

An architecture to simultaneously perform P check node operations and P variable node operations may be used to decode the LDPC code of the parity check matrix represented by a P×P constitutive matrix.

Figure 52:
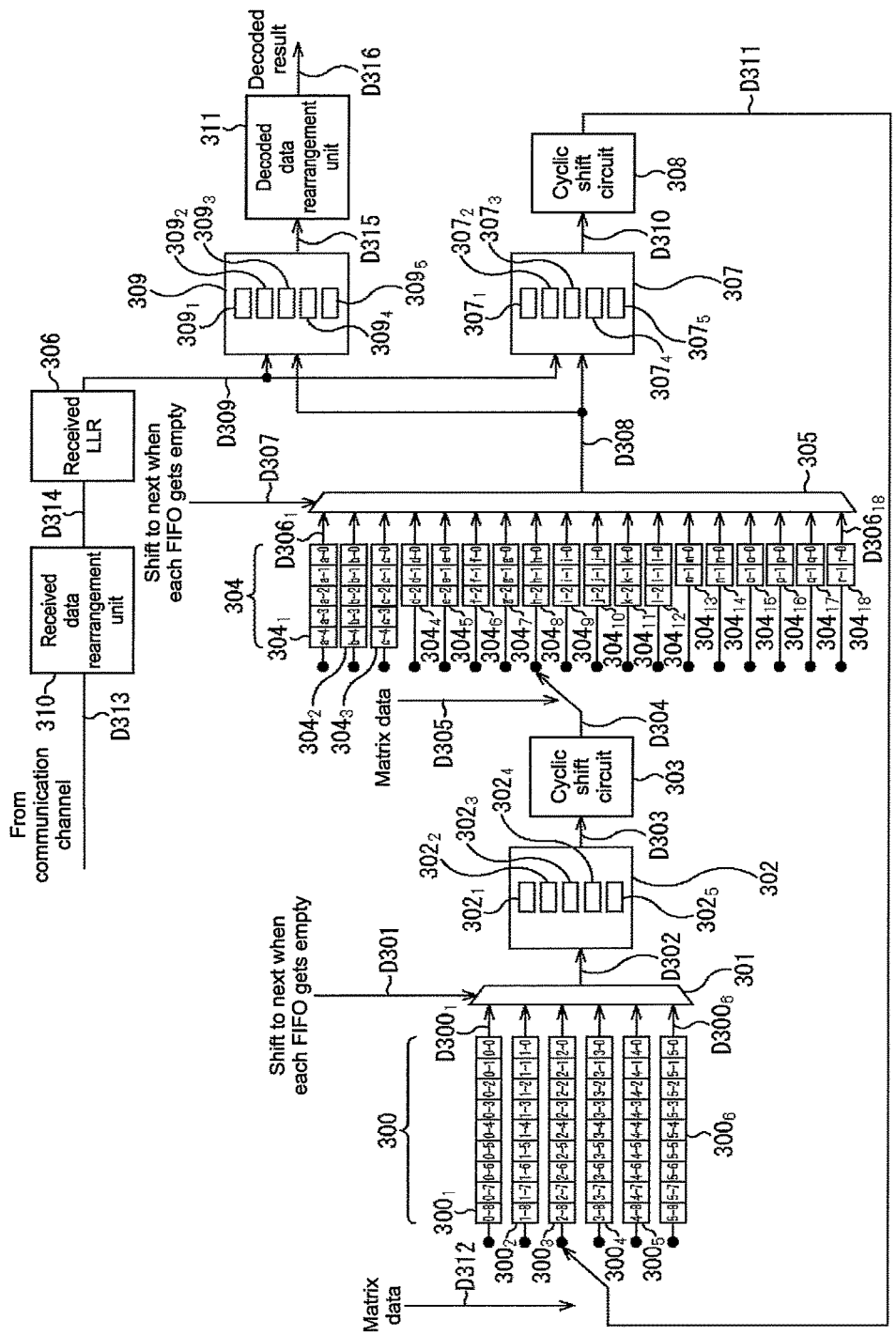
FIG. 52 A block diagram showing a configuration example of a decoding device, which collectively performs P node operations.

FIG. 52 is a block diagram showing a configuration example of the decoding device, which performs such decoding.

That is to say, FIG. 52 shows the configuration example of the decoding device, which decodes the LDPC code using the conversion parity check matrix H' in FIG. 51 obtained by at least applying the column permutation in equation (12) to the original parity check matrix H in FIG. 49.

The decoding device in FIG. 52 is configured of an edge data storage memory 300 configured of 6 FIFOs $300_1$ to $300_6$, a selector 301, which selects from the FIFOs $300_1$ to $300_6$, a check node calculation unit 302, two cyclic shift circuits 303 and 308, an edge data storage memory 304 configured of 18 FIFOs $304_1$ to $304_{18}$, a selector 305, which selects from the FIFOs $304_1$ to $304_{18}$, a received data memory 306, which stores received data, a variable node calculation unit 307, a decoded word calculation unit 309, a received data rearrangement unit 310, and a decoded data rearrangement unit 311.

A method of storing the data in the edge data storage memories 300 and 304 is first described.

The edge data storage memory 300 is configured of six FIFOs $300_1$ to $300_6$, the number of which is obtained by dividing the number of rows 30 of the conversion parity check matrix H' in FIG. 51 by the number of rows (the number of columns P being the unit of the cyclic structure) 5 of the constitutive matrix. The FIFOs $300y$ (y=1, 2, ..., 6) are formed of a plurality of stages of storage regions and messages corresponding to five edges, the number of which is equal to the number of rows and the number of columns of the constitutive matrix (the number of columns P being the unit of the cyclic structure), may be read and written at the same time from and to the storage region of each stage. The number of stages of the storage regions of the FIFO $300y$ (y=1, 2, ... 6) is set to nine being a maximum number of 1 in the row direction of the conversion parity check matrix in FIG. 51 (Hamming weight).

The data corresponding to the position of 1 from first to fifth rows of the conversion parity check matrix H' in FIG. 51 (a message $v_i$ from the variable node) is stored in the FIFO $300_1$ in a form closed up in a horizontal direction for each row (ignoring 0). That is to say, when the j-th row i-th column is represented as (j, i), the data corresponding to the position of 1 of the 5×5 unit matrix from (1, 1) to (5, 5) of the conversion parity check matrix H' is stored in the storage region of a first stage of the FIFO $300_1$. The data corresponding to the position of 1 of the shift matrix from (1, 21) to (5, 25) of the conversion parity check matrix H' (shift matrix obtained by the cyclic shift of the 5×5 unit matrix by three rightward) is stored in the storage region of a second stage. The data is similarly stored in the storage regions of third to eighth stages in association with the conversion parity check matrix H. Then, the data corresponding to the position of 1 of the shift matrix (shift matrix obtained by replacement of 1 in the first row of the 5×5 unit matrix with 0 and the cyclic shift thereof by one leftward) from (1, 86) to (5, 90) of the conversion parity check matrix H' is stored in the storage region of a ninth stage.

The data corresponding to the position of 1 from 6th to 10th rows of the conversion parity check matrix H' in FIG. 51 is stored in the FIFO $300_2$. That is to say, the data corresponding to the position of 1 of a first shift matrix configuring the sum matrix from (6, 1) to (10, 5) of the conversion parity check matrix H' (the sum matrix obtained by summing the first shift matrix obtained by the cyclic shift of the 5×5 unit matrix by one rightward and a second shift matrix obtained by the cyclic shift thereof by two rightward) is stored in the storage region of a first stage of the FIFO $300_2$. The data corresponding to the position of 1 of the second shift matrix configuring the sum matrix from (6, 1) to (10, 5) of the conversion parity check matrix H' is stored in the storage region of a second stage.

That is to say, as for the constitutive matrix whose weight is 2 or larger, the data corresponding to the position of 1 of the unit matrix, the quasi-unit matrix, and the shift matrix whose weight is 1 (message corresponding to the edge belonging to the unit matrix, the quasi-unit matrix, or the shift matrix) when the constitutive matrix is represented as the sum of a plurality of the P×P unit matrix whose weight is 1, the quasi-unit matrix in which one or more of the elements 1 of the unit matrix is set to 0, and the shift matrix obtained by the cyclic shift of the unit matrix or the quasi-unit matrix is stored in the same address (same FIFO out of the FIFOs $300_1$ to $300_6$).

The data is hereinafter stored in association with the conversion parity check matrix H' also in the storage regions of third to ninth stages.

The data is stored in association with the conversion parity check matrix H' also in the FIFOs $300_3$ to $300_6$.

The edge data storage memory 304 is configured of 18 FIFOs $304_1$ to $304_{18}$, the number of which is obtained by dividing the number of columns 90 of the conversion parity check matrix H' by the number of columns 5 of the constitutive matrix (the number of columns P being the unit of the cyclic structure). The FIFO $304x$ (x=1, 2, ..., 18) is formed of a plurality of stages of storage regions, and the messages corresponding to the five edges, the number of which is the number of rows and the number of columns of the conversion constitutive matrix (the number of columns P being the unit of the cyclic structure) may be simultaneously read and written from and to the storage region of each stage.

In the FIFO $304_1$, the data corresponding to the position of 1 from first to fifth columns of the conversion parity check matrix H' in FIG. 51 (message $u_j$ from the check node) is stored in a form closed up in a vertical direction for each column (ignoring 0). That is to say, the data corresponding to the position of 1 of the 5×5 unit matrix from (1, 1) to (5, 5) of the conversion parity check matrix H' is stored in the storage region of a first stage of the FIFO $304_1$. The data corresponding to the position of 1 of the first shift matrix configuring the sum matrix from (6, 1) to (10, 5) of the conversion parity check matrix H' (the sum matrix obtained by summing the first shift matrix obtained by the cyclic shift of the 5×5 unit matrix by one rightward and the second shift matrix obtained by the cyclic shift thereof by two rightward) is stored in the storage region of the second stage. The data corresponding to the position of 1 of a second shift matrix configuring the sum matrix from (6, 1) to (10, 5) of the conversion parity check matrix H' is stored in the storage region of a third stage.

That is to say, as for the constitutive matrix whose weight is 2 or larger, the data corresponding to the position of 1 of the unit matrix, the quasi-unit matrix, and the shift matrix whose weight is 1 (the message corresponding to the edge belonging to the unit matrix, the quasi-unit matrix, or the shift matrix) when the constitutive matrix is represented as the sum of a plurality of the P×P unit matrix whose weight is 1, the quasi-unit matrix in which one or more of the elements 1 of the unit matrix is set to 0, and the shift matrix obtained by the cyclic shift of the unit matrix or the quasi-unit matrix is stored in the same address (same FIFO out of the FIFOs $304_1$ to $304_{18}$).

Hereinafter, the data is stored in the storage regions of fourth and fifth stages in association with the conversion parity check matrix H'. The number of stages of the storage regions of the FIFO $304_1$ is five being the maximum number of the number of 1 in the row direction from the first to fifth columns of the conversion parity check matrix H' (Hamming weight).

The data is similarly stored in association with the conversion parity check matrix H' in the FIFOs $304_2$ and $304_3$, the length (the number of stages) of which is five. The data is similarly stored in association with the conversion parity check matrix H' in the FIFOs $304_4$ to $304_{12}$, the length of which is three. The data is similarly stored in association with the conversion parity check matrix H' in the FIFOs $304_{13}$ to $304_{18}$, the length of which is two.

Next, operation of the decoding device in FIG. 52 is described.

The edge data storage memory 300 configured of the six FIFOs $300_1$ to $300_6$ selects the FIFO in which the data is stored from the FIFOs $300_1$ to $300_6$ according to information (matrix data) D312 indicating the row of the conversion parity check matrix H' in FIG. 51 to which five messages D311 supplied from the cyclic shift circuit 308 in a preceding stage belong and collectively stores the five messages D311 in the selected FIFO in sequence. When reading the data, the edge data storage memory 300 reads five messages $D300_1$ from the FIFO $300_1$ in sequence to supply to the selector 301 in a subsequent stage. The edge data storage memory 300 reads the message also from the FIFOs $300_2$ to $300_6$ in sequence after finishing reading the message from the FIFO $300_1$ to supply to the selector 301.

The selector 301 selects the five messages from the FIFO from which the data is currently read out of the FIFOs $300_1$ to $300_6$ according to a select signal D301 and supplies the same as a message D302 to the check node calculation unit 302.

The check node calculation unit 302 configured of five check node calculators $302_1$ to $302_5$ performs the check node operation according to equation (7) using the messages D302 ($D302_1$ to $D302_5$) supplied through the selector 301 (message $v_i$ in equation (7)) and supplies five messages D303 ($D303_1$ to $D303_5$) obtained as a result of the check node operation (message $u_j$ in equation (7)) to the cyclic shift circuit 303.

The cyclic shift circuit 303 performs the cyclic shift of the five messages $D303_1$ to $D303_5$ obtained by the check node calculation unit 302 based on information (matrix data) D305 indicating a value by which the cyclic shift of the original unit matrix in the conversion parity check matrix H' is performed to obtain the corresponding edge and supplies a result to the edge data storage memory 304 as a message D304.

The edge data storage memory 304 configured of 18 FIFOs $304_1$ to $304_{18}$ selects the FIFO in which the data is stored from the FIFOs $304_1$ to $304_{18}$ according to the information D305 indicating the row of the conversion parity check matrix H' to which the five messages D304 supplied from the cyclic shift circuit 303 in the preceding stage belongs and collectively stores the five messages D304 in the selected FIFO in sequence. When reading the data, the edge data storage memory 304 reads the five messages $D306_1$ in sequence from the FIFO $304_1$ to supply to the selector 305 in the subsequent stage. The edge data storage memory 304 reads the message in sequence also from the FIFOs $304_2$ to $304_{18}$ after finishing reading the data from the FIFO $304_1$ to supply to the selector 305.

The selector 305 selects the five messages from the FIFO from which the data is currently read out of the FIFOs $304_1$ to $304_{18}$ according to a select signal D307 and supplies the same to the variable node calculation unit 307 and the decoded word calculation unit 309 as a message D308.

On the other hand, the received data rearrangement unit 310 rearranges an LDPC code D313 received through the communication channel 13 corresponding to the parity check matrix H in FIG. 49 by the column permutation in equation (12) and supplies the same to the received data memory 306 as received data D314. The received data memory 306 calculates a received LLR (log likelihood ratio) from the received data D314 supplied from the received data rearrangement unit 310 to store and collectively supplies the five received LLRs to the variable node calculation unit 307 and the decoded word calculation unit 309 as received value D309.

The variable node calculation unit 307 configured of five variable node calculators $307_1$ to $307_5$ performs the variable node operation according to equation (1) using the messages D308 ($D308_1$ to $D308_5$) supplied through the selector 305 (message $u_j$ in equation (1)) and the five received values D309 supplied from the received data memory 306 (received value $u_{0i}$ in equation (1)) and supplies messages D310 ($D310_1$ to $D310_5$) obtained as a result of the operation (message $v_i$ in equation (1)) to the cyclic shift circuit 308.

The cyclic shift circuit 308 performs the cyclic shift of the messages $D310_1$ to $D310_5$ calculated by the variable node calculation unit 307 based on the information indicating the value by which the cyclic shift of the original unit matrix in the conversion parity check matrix H' is performed to obtain the corresponding edge and supplies a result to the edge data storage memory 300 as a message D311.

Single decoding of the LDPC code may be performed by single round of the above-described operation. The decoding device in FIG. 52 decodes the LDPC code a predetermined number of times, and then obtains a final decoding result by the decoded word calculation unit 309 and the decoded data rearrangement unit 311 to output.

That is to say, the decoded word calculation unit 309 configured of five decoded word calculators $309_1$ to $309_5$ calculates the decoding result (decoded word) based on equation (5) as a final stage of a plurality of times of decoding using the five messages D308 ($D308_1$ to $D308_5$) (message $u_j$ in equation (5)) output by the selector 305 and the five received values D309 (received value $u_0$ in equation (5)) supplied from the received data memory 306 and supplies decoded data D315 obtained as a result to the decoded data rearrangement unit 311.

The decoded data rearrangement unit 311 applies the inverse permutation of the column permutation in equation (12) to the decoded data D315 supplied from the decoded word calculation unit 309, thereby rearranging an order thereof and outputs the same as a final decoded result D316.

As described above, by applying any one or both of the row permutation and the column permutation to the parity check matrix (original parity check matrix) and converting the same to the parity check matrix (conversion parity check matrix) represented by the combination of the P×P unit matrix, the quasi-unit matrix in which one or more of the elements of 1 of the unit matrix is set to 0, the shift matrix obtained by the cyclic shift of the unit matrix or the quasi-unit matrix, the sum matrix obtained by summing a plurality of the unit matrix, the quasi-unit matrix, and the shift matrix, and the P×P 0 matrix, that is to say, the combination of the constitutive matrices, it becomes possible to adopt the architecture to simultaneously perform the P check node operations and the P variable node operations as the decoding of the LDPC code where P is fewer than the numbers of the columns and rows in the parity. When it adopts the architecture to simultaneously perform the P check node operations and the P variable node operations as the decoding of the LDPC code where P is fewer than the numbers of the columns and rows in the parity check matrix, the operation frequency may be limited within the feasible range to perform a great number of times of repetitive decoding, as compared to a case that the node operations are performed at the same time for the same numbers of the numbers of the columns and rows in the parity check matrix.

The LDPC decoder 166, which configures the receiving device 12 in FIG. 46, performs the LDPC decoding by simultaneously performing the P check node operations and the P variable node operations as is the case with the decoding device in FIG. 52.

That is to say, in order to simplify the description, supposing that the parity check matrix of the LDPC code output by the LDPC encoder 115 configuring the transmitting device 11 in FIG. 8 is the parity check matrix H in which the parity matrix has the stepwise structure illustrated in FIG. 49, for example, the parity interleaver 23 of the transmitting device 11 performs the parity interleave to interleave the K+qx+y+1-th code bit to the position of the K+Py+x+1-th code bit by setting the information length K, the number of columns being the unit of the cyclic structure, and the submultiple q (=M/P) of the parity length M to 60, 5, and 6, respectively.

The parity interleave corresponds to the column permutation in equation (12) as described above, so that the LDPC decoder 166 is not required to perform the column permutation in equation (12).

Therefore, in the receiving device 12 in FIG. 46, as described above, the LDPC code to which the parity deinterleave is not applied, that is to say, the LDPC code in a state in which the column permutation in equation (12) is performed is supplied from the column twist deinterleaver 55 to the LDPC decoder 166, and the LDPC decoder 166 performs the process similar to that of the decoding device in FIG. 52 except that this does not perform the column permutation in equation (12).

Figure 53:
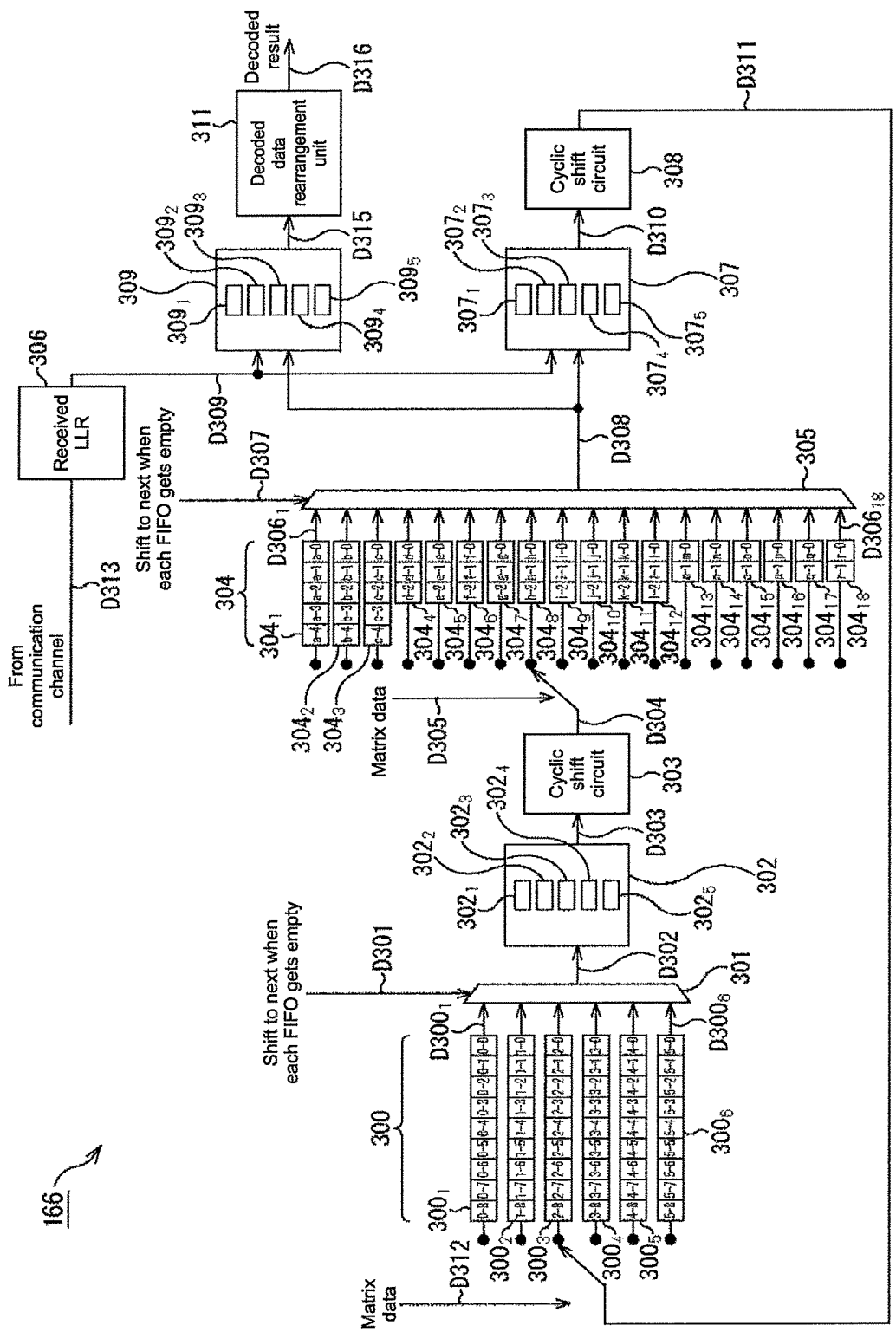
FIG. 53 A block diagram showing a configuration example of the LDPC decoder 166.

That is to say, FIG. 53 shows a configuration example of the LDPC decoder 166 in FIG. 46.

In FIG. 53, the LDPC decoder 166 is configured as the decoding device in FIG. 52 except that the received data rearrangement unit 310 in FIG. 52 is not provided, and this performs the process similar to that of the decoding device in FIG. 52 except that the column permutation in equation (12) is not performed, so that the description thereof is omitted.

As described above, the LDPC decoder 166 may be configured without the received data rearrangement unit 310, so that a scale thereof may be made smaller than that of the decoding device in FIG. 52.

Although the code length N, the information length K, the number of columns (the number of rows and the number of columns of the constitutive matrix) being the unit of the cyclic structure P, and the submultiple q (=M/P) of the parity length M are set to 90, 60, 5, and 6, respectively, in FIGS. 49 to 53 in order to simplify the description, the code length N, the information length K, the number of columns P being the unit of the cyclic structure, and the submultiple q M/P) are not limited to the above-described values.

That is to say, in the transmitting device 11 in FIG. 8, the LDPC encoder 115 outputs the LDPC code of the code length of 64800, 16200 and the like, the information length K of N−Pq (=N−M), the number of columns P being the unit of the cyclic structure of 360, and the submultiple q of M/P, for example, the LDPC decoder 166 in FIG. 53 may also be applied to a case in which the LDPC decoding is performed by simultaneously performing the P check node operations and the P variable node operations to such LDPC code.

Figure 54:
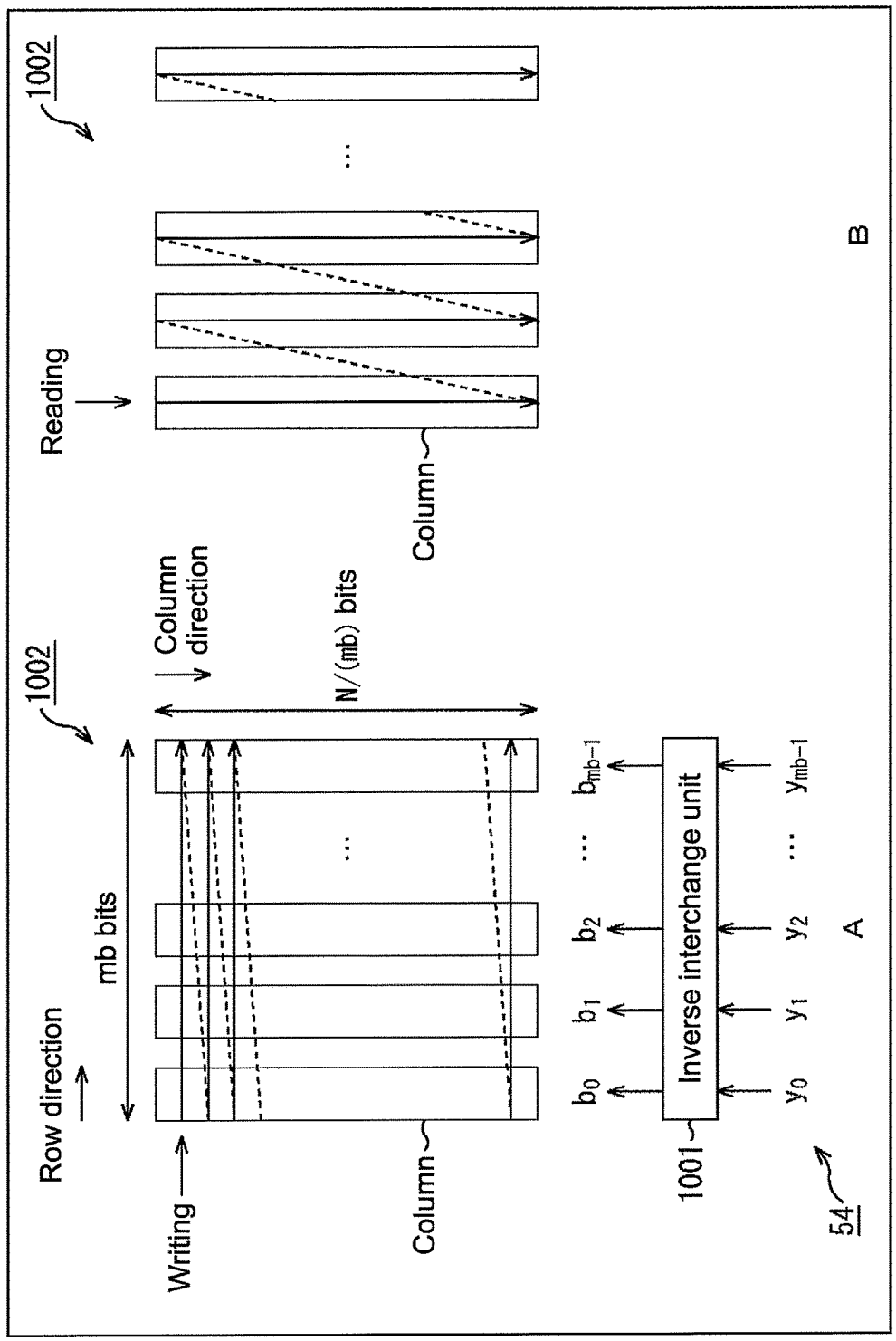
FIG. 54 A view illustrating a process of a multiplexer 54 configuring the bit deinterleaver 165.

FIG. 54 is a view illustrating the process of the multiplexer 54 configuring the bit deinterleaver 165 in FIG. 47.

That is to say, FIG. 54A shows a functional configuration example of the multiplexer 54.

The multiplexer 54 is configured of an inverse interchange unit 1001 and a memory 1002.

The multiplexer 54 performs the inverse interchanging process (inverse process of the interchanging process) corresponding to the interchanging process performed by the demultiplexer 25 of the transmitting device 11, that is to say, the inverse interchanging process to return the positions of the code bits (symbol bits) of the LDPC code interchanged by the interchanging process to the original position of the symbol bits of the symbol supplied from the demapper 164 in the preceding stage and supplies the LDPC code obtained as a result to the column twist deinterleaver 55 in the subsequent stage.

That is to say, in the multiplexer 54, mb symbol bits $y_0$, $y_1, \ldots, y_{mb-1}$ of the b symbols are supplied to the inverse interchange unit 1001 in units of (consecutive) b symbols.

The inverse interchange unit 1001 performs the inverse interchanging to return the mb symbol bits $y_0$ to $y_{mb-1}$ to the original arrangement of the mb code bits $b_0, b_1, \ldots, b_{mb-1}$ (arrangement of the code bits $b_0$ to $b_{mb-1}$ before the interchanging by the interchange unit 32 configuring the demultiplexer 25 on the transmitting device 11 side is performed) and outputs the mb code bits $b_0$ to $b_{mb-1}$ obtained as a result.

The memory 1002 has the storage capacity to store the mb bits in the row (horizontal) direction and store the N/(mb) bits in the column (vertical) direction as the memory 31 configuring the demultiplexer 25 on the transmitting device 11 side. That is to say, the memory 1002 is configured of the mb columns, which store the N/(mb) bits.

The code bits of the LDPC code output by the inverse interchange unit 1001 are written to the memory 1002 in a direction in which the code bits are read from the memory 31 of the demultiplexer 25 of the transmitting device 11 and the code bits written to the memory 1002 are read in a direction in which the code bits are written to the memory 31.

That is to say, in the multiplexer 54 of the receiving device 12, as illustrated in FIG. 54A, the code bits of the LDPC code output by the inverse interchange unit 1001 are sequentially written in the row direction in units of mb bits from a first row downward in the memory 1002.

When the writing of the code bits as many as one code length is finished, the multiplexer 54 reads the code bits in the column direction from the memory 1002 to supply to the column twist deinterleaver 55 in the subsequent stage.

Herein, FIG. 54B is a view illustrating the reading of the code bits from the memory 1002.

The multiplexer 54 reads the code bits of the LDPC code from the top of the column configuring the memory 1002 downward (in the column direction) from a left column to a right column.

Figure 55:
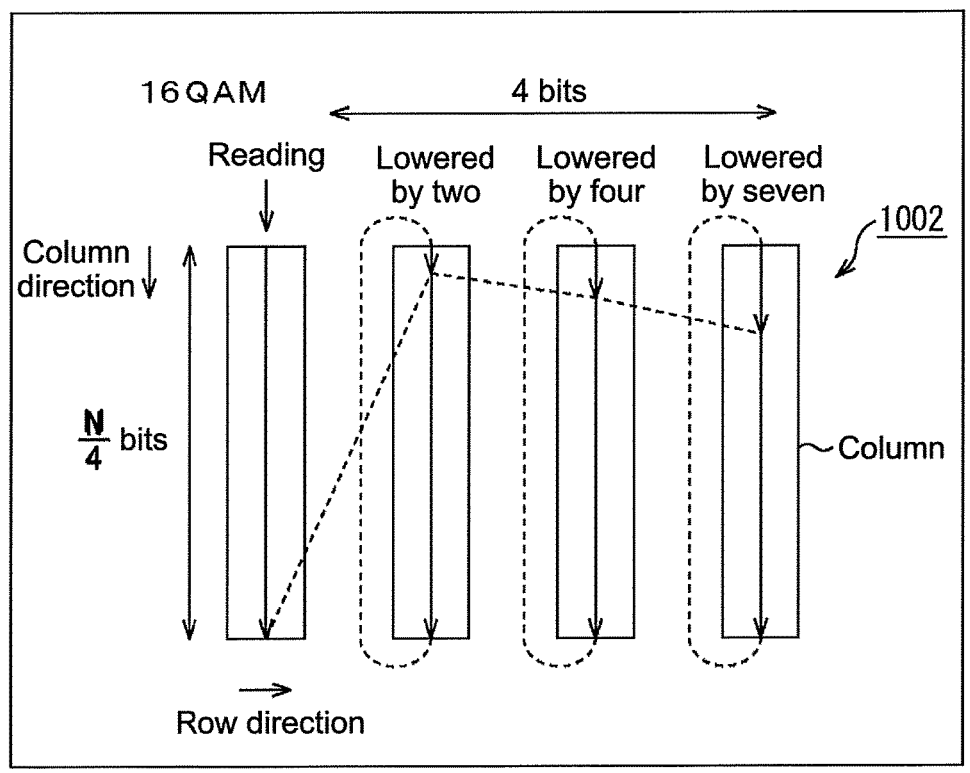
FIG. 55 A view illustrating a process of a column twist deinterleaver 55.

FIG. 55 is a view illustrating the process of the column twist deinterleaver 55 configuring the bit deinterleaver 165 in FIG. 47.

That is to say, FIG. 55 shows a configuration example of the memory 1002 of the multiplexer 54.

The memory 1002 has the storage capacity to store the mb bits in the column (vertical) direction and the N/(mb) bits in the row (horizontal) direction and is configured of the mb columns.

The column twist deinterleaver 55 controls a reading start position when the code bits of the LDPC code are written in the row direction and read in the column direction to/from the memory 1002, thereby performing the column twist deinterleave.

That is to say, the column twist deinterleaver 55 performs the inverse rearranging process to return the arrangement of the code bits rearranged by the column twist interleave to the original arrangement by appropriately changing the reading start position at which the reading of the code bits is started for each of a plurality of columns.

Herein, FIG. 55 shows the configuration example of the memory 1002 in a case in which the modulation scheme is the 16APSK or the 16QAM and the multiple number b is set to 1 illustrated in FIG. 28. Therefore, the number of bits m of one symbol is four and the memory 1002 is configured of four (=mb) columns.

The column twist deinterleaver 55 sequentially writes the code bits of the LDPC code output by the interchange unit 1001 in the row direction from the first row of the memory 1002 downward in place of the multiplexer 54.

When the writing of the code bits as many as one code length is finished, the column twist deinterleaver 55 reads the code bits from the top of the memory 1002 downward (in the column direction) from the left column to the right column.

The column twist deinterleaver 55 reads the code bits from the memory 1002 while making the writing start position at which the column twist interleaver 24 on the transmitting device 11 side writes the code bits as the reading start position of the code bits.

That is to say, when an address of each position in the column direction is represented by an integer in ascending order while setting the address of a top (uppermost) position of each column to 0, in the column twist deinterleaver 55, the reading start position is set to a position whose address is 0 for a leftmost column, the reading start position is set to a position whose address is 2 for a second column (from left), the reading start position is set to a position whose address is 4 for a third column, and the reading start position is set to a position whose address is 7 for a fourth column when the modulation scheme is the 16APSK or the 16QAM and the multiple number b is set to 1.

For the column in which the reading start position is located on a position other than the position whose address is 0, when the code bits are read up to an undermost position, it is returned to the top (position whose address is 0) and the reading is performed up to a position just before the reading start position. Then, the reading from the next (right) column is performed.

The arrangement of the code bits rearranged by the column twist interleave is returned to the original arrangement by the above-described column twist deinterleave.

Figure 56:
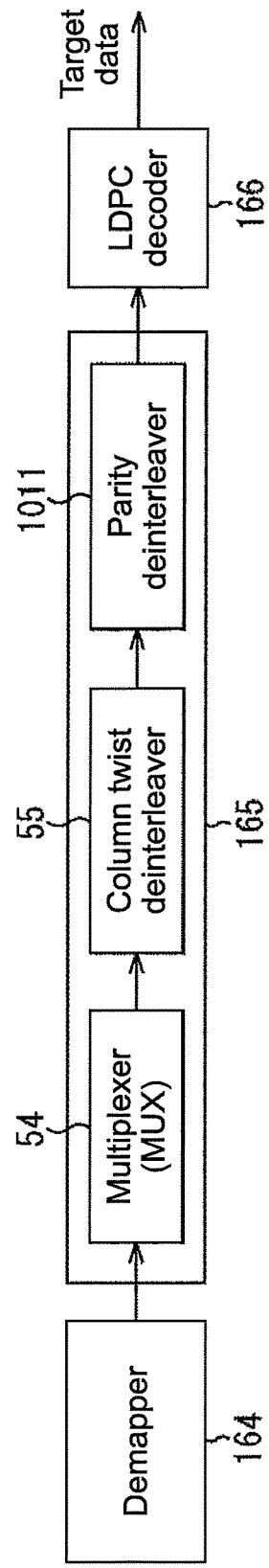
FIG. 56 A block diagram showing another configuration example of the bit deinterleaver 165.

FIG. 56 is a block diagram illustrating another configuration example of the bit deinterleaver 165 in FIG. 46.

In the drawing, the same reference numeral is assigned to a part corresponding to that in FIG. 47 and the description thereof is hereinafter appropriately omitted.

That is to say, the bit deinterleaver 165 in FIG. 56 is configured in the same manner as that in FIG. 47 except that a parity deinterleaver 1011 is newly provided.

In FIG. 56, the bit deinterleaver 165 configured of the multiplexer (MUX) 54, the column twist deinterleaver 55, and the parity deinterleaver 1011 performs the bit deinterleave of the code bits of the LDPC code from the demapper 164.

That is to say, the multiplexer 54 performs the inverse interchanging process corresponding to the interchanging process performed by the demultiplexer 25 of the transmitting device 11 (inverse process of the interchanging process) of the LDPC code from the demapper 164, that is to say, the inverse interchanging process to return the positions of the code bits interchanged by the interchanging process to the original position and supplies the LDPC code obtained as a result to the column twist deinterleaver 55.

The column twist deinterleaver 55 applies the column twist deinterleave corresponding to the column twist interleave as the rearranging process performed by the column twist interleaver 24 of the transmitting device 11 to the LDPC code from the multiplexer 54.

The LDPC code obtained as a result of the column twist deinterleave is supplied from the column twist deinterleaver 55 to the parity deinterleaver 1011.

The parity deinterleaver 1011 applies the parity deinterleave (inverse process of the parity interleave) corresponding to the parity interleave performed by the parity interleaver 23 of the transmitting device 11, that is to say, the parity deinterleave to return the code bits of the LDPC code, the arrangement of which is changed by the parity interleave, to the original arrangement to the code bits after the column twist deinterleave by the column twist deinterleaver 55.

The LDPC code obtained as a result of the parity deinterleave is supplied from the parity deinterleaver 1011 to the LDPC decoder 166.

Therefore, in the bit deinterleaver 165 in FIG. 56, the LDPC code to which the inverse interchanging process, the column twist deinterleave, and the parity deinterleave are applied, that is to say, the LDPC code obtained by the LDPC encoding according to the parity check matrix H is supplied to the LDPC decoder 166.

The LDPC decoder 166 performs the LDPC decoding of the LDPC code from the bit deinterleaver 165 using the parity check matrix H used by the LDPC encoder 115 of the transmitting device 11. That is to say, the LDPC decoder 166 performs the LDPC decoding of the LDPC code from the bit deinterleaver 165 using the parity check matrix H itself used by the LDPC encoder 115 of the transmitting device 11 in the LDPC encoding or the conversion parity check matrix obtained by at least applying the column permutation corresponding to the parity interleave to the parity check matrix H.

Herein, in FIG. 56, since the LDPC code obtained by the LDPC encoding according to the parity check matrix H is supplied from (the parity deinterleaver 1011 of) the bit deinterleaver 165 to the LDPC decoder 166, the LDPC decoder 166 may be configured of the decoding device, which performs the LDPC decoding by a full serial decoding scheme to sequentially perform the operation of the message (check node message and the variable node message) one node after another, and the decoding device, which performs the LDPC decoding by a full parallel decoding scheme to simultaneously perform the operation of the message (in parallel) for all the nodes, for example, when the LDPC decoding of the LDPC code is performed using the parity check matrix H itself used by the LDPC encoder 115 of the transmitting device 11 in the LDPC encoding.

Also, when the LDPC decoder 166 performs the LDPC decoding of the LDPC code using the conversion parity check matrix obtained by at least performing the column permutation corresponding to the parity interleave of the parity check matrix H used by the LDPC encoder 115 of the transmitting device 11 in the LDPC encoding, the LDPC decoder 166 may be configured of the decoding device of the architecture to simultaneously perform the P (or submultiple of P other than 1) check node operations and variable node operations being the decoding device (FIG. 52) including the received data rearrangement unit 310 to rearrange the code bits of the LDPC code by applying the column permutation similar to the column permutation for obtaining the conversion parity check matrix to the LDPC code.

Although the multiplexer 54, which performs the inverse interchanging process, the column twist deinterleaver 55, which performs the column twist deinterleave, and the parity deinterleaver 1011, which performs the parity deinterleave, are separately formed for convenience of description in FIG. 56, two or more of the multiplexer 54, the column twist deinterleaver 55, and the parity deinterleaver 1011 may be integrally formed as the parity interleaver 23, the column twist interleaver 24, and the demultiplexer 25 of the transmitting device 11.

If the transmitting device 11 (FIG. 8) is configured without including the parity interleaver 23 and the column twist interleaver 24, the bit deinterleaver 165 may be configured without including the column twist deinterleaver 55 and the parity deinterleaver 1011, in FIG. 56.

In this case, the LDPC decoder 166 may be configured of the decoding device, which performs the LDPC decoding by a full serial decoding scheme using the parity check matrix H itself, the decoding device, which performs the LDPC decoding by a full parallel decoding scheme using the parity check matrix H itself, and the decoding device having the received data rearrangement unit 310 that simultaneously performs the P check node operations and the P variable node operations, which performs the LDPC decoding using the parity check matrix H' (FIG. 52).

The bit interleaver 116 (FIG. 8) of the transmitting device 11 performs other bit interleave (including interleave per block, when a predetermined number of bits of the LDPC code is the block) instead of the column twist interleave and the interchanging process.

If other bit interleave is performed in the bit interleaver 116 of the transmitting device 11 instead of the column twist interleave and the interchanging process, the bit deinterleaver 165 (FIG. 47) of the receiving device 12 performs deinterleave to return other bit interleave performed by the bit interleaver 116 of the transmitting device 11 to the original instead of the column twist interleave and the interchanging process.

<Configuration Example of Receiving System>

Figure 57:
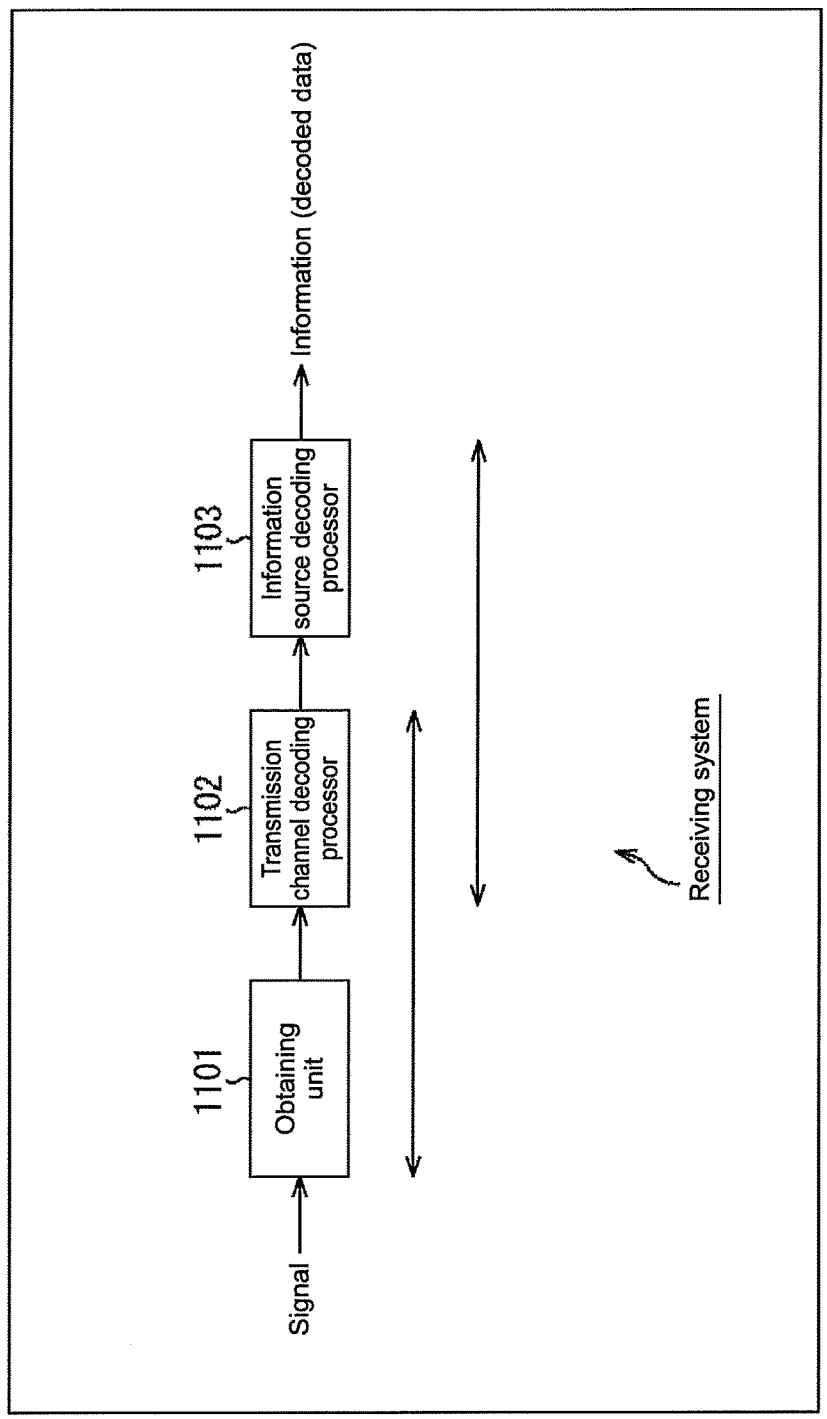
FIG. 57 A block diagram showing a first configuration example of a receiving system to which the receiving device 12 may be applied.

FIG. 57 is a block diagram showing a first configuration example of a receiving system to which the receiving device 12 may be applied.

In FIG. 57, the receiving system is configured of an obtaining unit 1101, a transmission channel decoding processor 1102, and an information source decoding processor 1103.

The obtaining unit 1101 obtains a signal including the LDPC code obtained by at least the LDPC encoding of the LDPC target data such as the image data and the audio data of the program through a transmission channel (communication channel) (not shown) such as digital terrestrial broadcasting, digital satellite broadcasting, and a network such as a CATV network, the Internet and the like, for example, to supply to the transmission channel decoding processor 1102.

Herein, if the signal obtained by the obtaining unit 1101 is broadcasted from a broadcasting station through the terrestrial wave, a satellite wave, the CATV (cable television) network and the like, for example, the obtaining unit 1101 is configured of a tuner, an STB (set top box) and the like. When the signal obtained by the obtaining unit 1101 is multicast-transmitted from a web server such as IPTV (Internet protocol television), for example, the obtaining unit 1101 is configured of a network I/F (interface) such as an NIC (network interface card), for example.

The transmission channel decoding processor 1102 corresponds to the receiving device 12. The transmission channel decoding processor 1102 applies a transmission channel decoding process at least including a process to correct the error occurring in the transmission channel to the signal obtained by the obtaining unit 1101 through the transmission channel and supplies the signal obtained as a result to the information source decoding processor 1103.

That is to say, the signal obtained by the obtaining unit 1101 through the transmission channel is the signal obtained by at least the error correction encoding for correcting the error occurring in the transmission channel and the transmission channel decoding processor 1102 applies the transmission channel decoding process such as an error correction process, for example, to such signal.

Herein, the error correction encoding includes the LDPC encoding, BCH encoding and the like, for example. Herein, the LDPC encoding is at least performed as the error correction encoding.

Also, the transmission channel decoding process may include demodulation of a modulated signal and the like.

The information source decoding processor 1103 applies an information source decoding process at least including a process to expand compressed information to original information to the signal to which the transmission channel decoding process is applied.

That is to say, there is a case in which compression encoding to compress the information is applied to the signal obtained by the obtaining unit 1101 through the transmission channel so as to decrease a data volume of the image and the audio as the information, and in this case, the information source decoding processor 1103 applies the information source decoding process such as the process to expand the compressed information to the original information (expanding process) to the signal to which the transmission channel decoding process is applied.

If the compression encoding is not applied to the signal obtained by the obtaining unit 1101 through the transmission channel, the information source decoding processor 1103 does not perform the process to expand the compressed information to the original information.

Herein, the expanding process includes MPEG decoding and the like, for example. Also, the transmission channel decoding process might include descrambling and the like in addition to the expanding process.

In the receiving system configured as above, the obtaining unit 1101 applies the compression encoding such as MPEG encoding to the data of the image and the audio, for example, and obtains the signal to which the error correction encoding such as the LDPC encoding is applied through the transmission channel to supply to the transmission channel decoding processor 1102.

The transmission channel decoding processor 1102 applies the process similar to that performed by the receiving device 12 and the like to the signal from the obtaining unit 1101 as the transmission channel decoding process, for example, and the signal obtained as a result is supplied to the information source decoding processor 1103.

The information source decoding processor 1103 applies the information source decoding process such as the MPEG decoding to the signal from the transmission channel decoding processor 1102 and outputs the image or the audio obtained as a result.

The receiving system in FIG. 57 as described above may be applied to a television tuner and the like, which receives television broadcasting as the digital broadcasting, for example.

It is possible to form each of the obtaining unit 1101, the transmission channel decoding processor 1102, and the information source decoding processor 1103 as one independent device (hardware (IC (integrated circuit) and the like) or a software module).

Also, as for the obtaining unit 1101, the transmission channel decoding processor 1102, and the information source decoding processor 1103, it is possible to form a set of the obtaining unit 1101 and the transmission channel decoding processor 1102, a set of the transmission channel decoding processor 1102 and the information source decoding processor 1103, and a set of the obtaining unit 1101, the transmission channel decoding processor 1102, and the information source decoding processor 1103 as one independent device.

Figure 58:
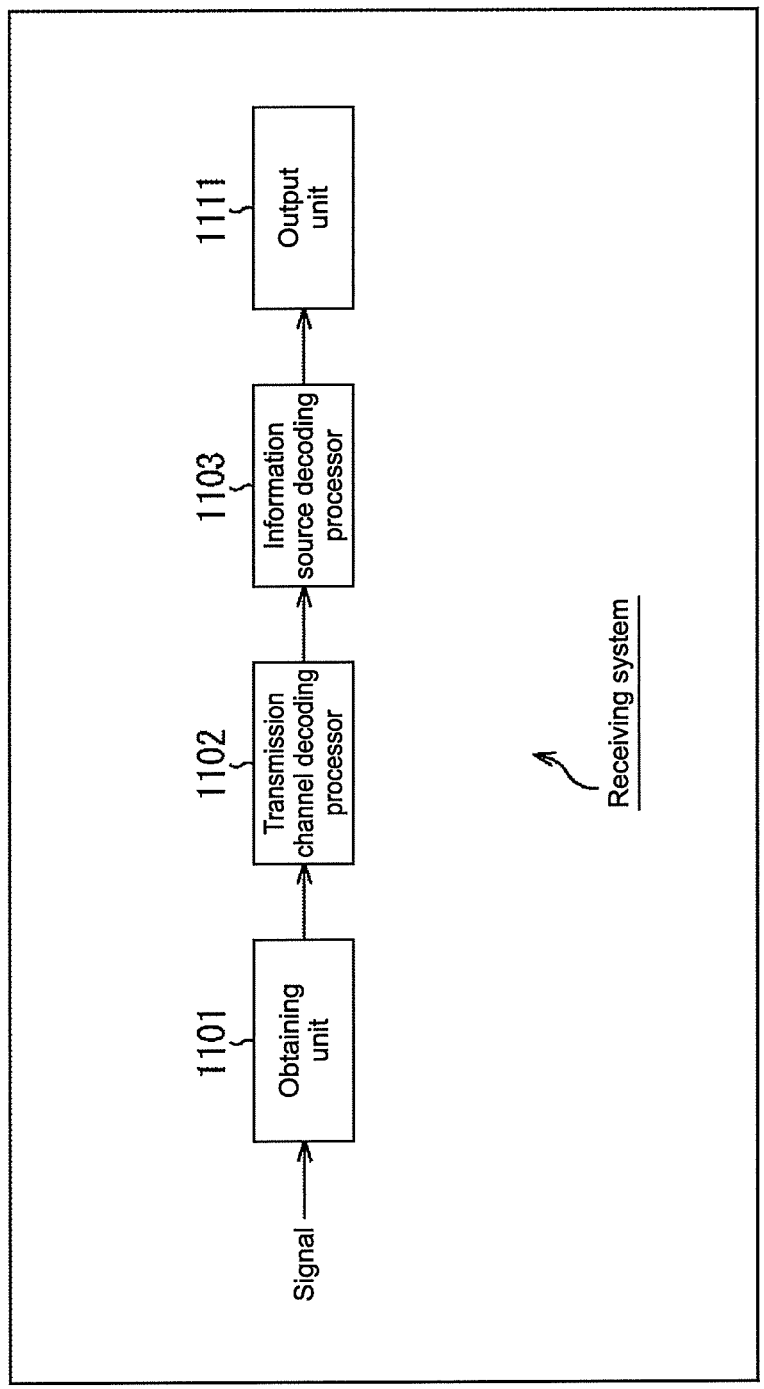
FIG. 58 A block diagram showing a second configuration example of the receiving system to which the receiving device 12 may be applied.

FIG. 58 is a block diagram illustrating a second configuration example of the receiving system to which the receiving device 12 may be applied.

Meanwhile, in the drawing, the same reference numeral is assigned to a part corresponding to that in FIG. 57 and the description thereof is hereinafter appropriately omitted.

The receiving system in FIG. 58 is the same as that in FIG. 57 in that this includes the obtaining unit 1101, the transmission channel decoding processor 1102, and the information source decoding processor 1103 and is different from that in FIG. 57 in that an output unit 1111 is newly provided.

The output unit 1111 is a display device, which displays the image, and a speaker, which outputs the audio, for example, and this outputs the image, the audio and the like as the signal output from the information source decoding processor 1103. That is to say, the output unit 1111 displays the image or outputs the audio.

The receiving system in FIG. 58 as described above may be applied to a TV (television receiver), which receives the television broadcasting as the digital broadcasting, a radio receiver, which receives radio broadcasting, and the like, for example.

If the compression encoding is not applied to the signal obtained by the obtaining unit 1101, the signal output by the transmission channel decoding processor 1102 is supplied to the output unit 1111.

Figure 59:
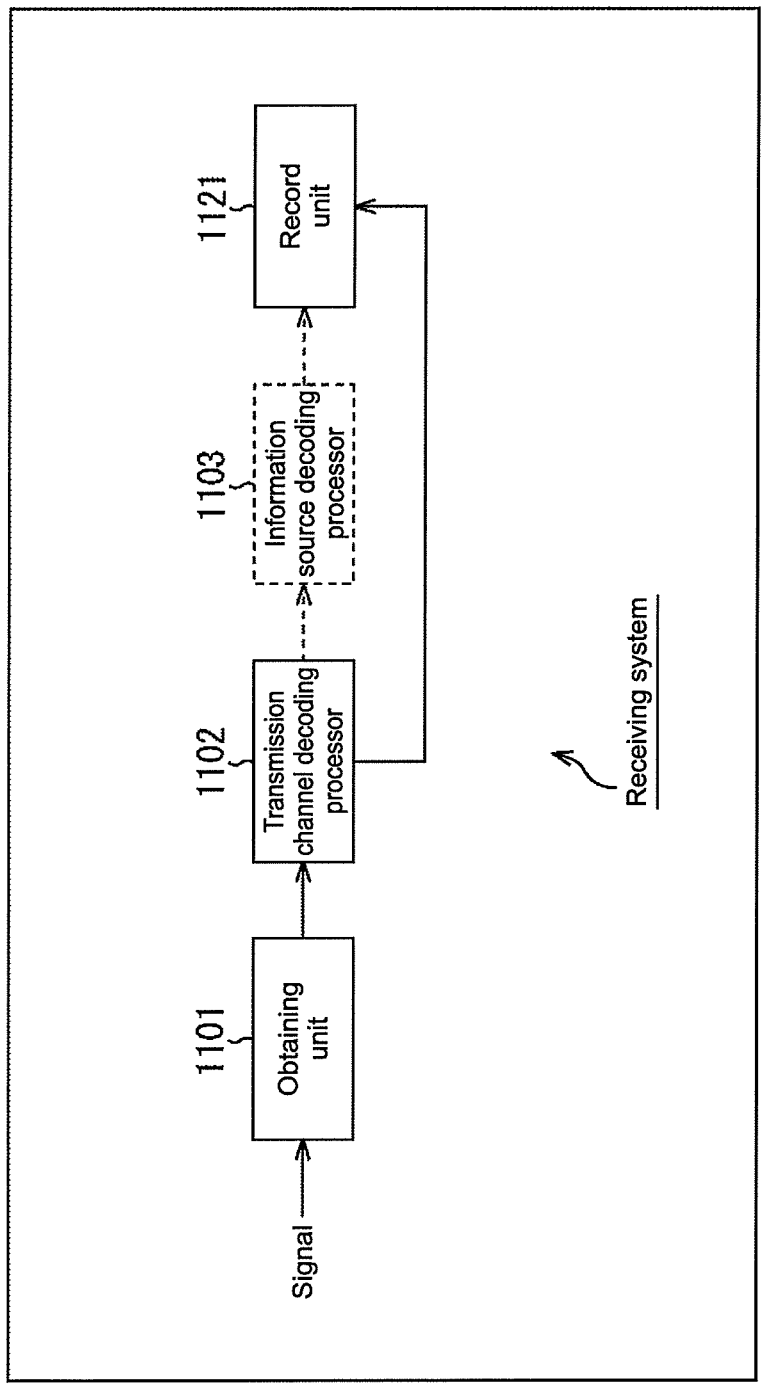
FIG. 59 A block diagram showing a third configuration example of the receiving system to which the receiving device 12 may be applied.

FIG. 59 is a block diagram showing a third configuration example of the receiving system to which the receiving device 12 may be applied.

In the drawing, the same reference numeral is assigned to a part corresponding to that in FIG. 57 and the description thereof is hereinafter appropriately omitted.

The receiving system in FIG. 59 is the same as that in FIG. 57 in that this includes the obtaining unit 1101 and the transmission channel decoding processor 1102.

However, the receiving system in FIG. 59 is different from that in FIG. 57 in that the information source decoding processor 1103 is not provided and a record unit 1121 is newly provided.

The record unit 1121 records (stores) the signal output from the transmission channel decoding processor 1102 (for example, a TS packet of MPEG TS) in a recording (storage) medium such as an optical disk, a hard disk (magnetic disk), and a flash memory.

The receiving system in FIG. 59 as described above may be applied to a recorder and the like, which records the television broadcasting.

In FIG. 59, the receiving system may be provided with the information source decoding processor 1103 and the information source decoding processor 1103 may record the signal to which the information source decoding process is applied, that is to say, the image and the audio obtained by the decoding in the record unit 1121.

[One Embodiment of Computer]

A series of processes described above may be performed by hardware or by software. When a series of processes is performed by the software, a program, which configures the software, is installed on a multi-purpose computer and the like.

Figure 60:
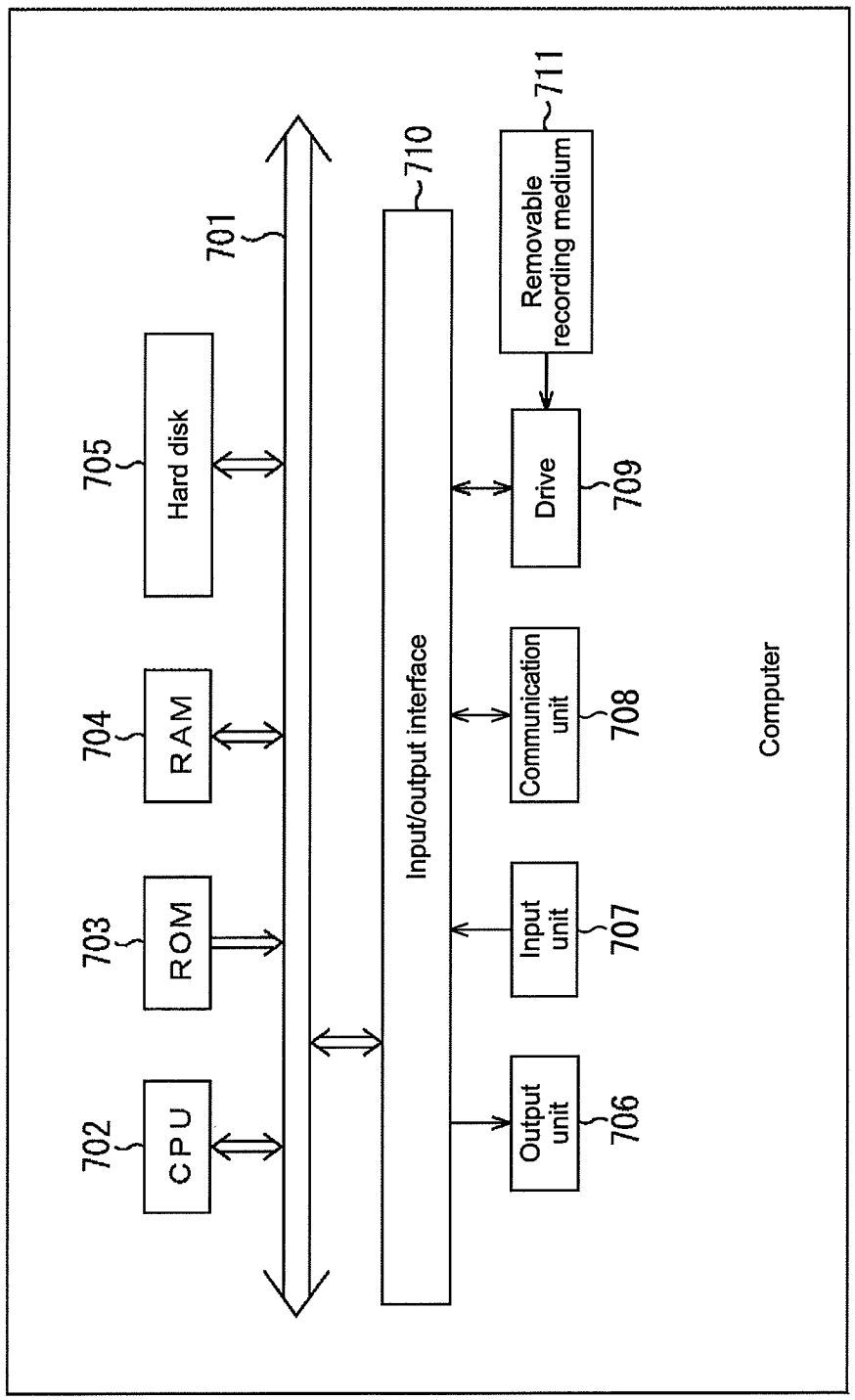
FIG. 60 A block diagram showing a configuration example of one embodiment of a computer to which the present technology is applied.

FIG. 60 shows a configuration example of one embodiment of the computer on which the program, which executes a series of processes described above, is installed.

The program may be recorded in advance in a hard disk 705 and a ROM 703 as a recording medium stored in the computer.

Alternatively, the program may be temporarily or permanently stored (recorded) in a removable recording medium 711 such as a flexible disk, a CD-ROM (compact disc read only memory), an MO (magnetooptical) disk, a DVD (digital versatile disc), the magnetic disk, and a semiconductor memory. Such removable recording medium 711 may be provided as so-called packaged software.

In addition to installation from the above-described removable recording medium 711 on the computer, the program may be transferred from a downloading site to the computer by wireless through a satellite for the digital satellite broadcasting or transferred to the computer by wire through the network such as a LAN (local area network) and the Internet, and the computer may receive the program transferred in this manner by a communication unit 708 to install on an internal hard disk 705.

The computer has a CPU (central processing unit) 702 built-in. An input/output interface 710 is connected to the CPU 702 through a bus 701 and, when an instruction is input through the input/output interface 710 by operation and the like of the input unit 707 configured of a keyboard, a mouse, a microphone and the like by a user, the CPU 702 executes the program stored in the ROM (read only memory) 703 according to the same. Alternately, the CPU 702 loads the program stored in the hard disk 705, the program transferred from the satellite or the network to be received by the communication unit 708 and installed on the hard disk 705, or the program read from the removable recording medium 711 mounted on a drive 709 to be installed on the hard disk 705 on a RAM (random access memory) 704 to execute. According to this, the CPU 702 performs the process according to the above-described flowchart or the process performed by the configuration of the above-described block diagram. Then, the CPU 702 outputs a processing result from an output unit 706 configured of an LCD (liquid crystal display), a speaker and the like, or transmits the same from a communication unit 708, or records the same in the hard disk 705 through the input/output interface 710, for example, as needed.

Herein, in this specification, a processing step to write the program to allow the computer to perform various processes is not necessarily required to be processed in chronological order along order described in the flowchart and this also includes the process executed in parallel or individually executed (for example, a parallel process or a process by an object).

Also, the program may be processed by one computer or distributedly processed by a plurality of computers. Further, the program may be transferred to a remote computer to be executed.

Herein, in this specification, the system means an assembly of a plurality of constituents (devices, modules (components) and the like), and all constituents may or may not be within the same housing. Accordingly, the system is any of a plurality of devices housed in separate housings and connected via a network, and one device including a plurality of modules housed in one housing.

Also, the embodiment of the present technology is not limited to the above-described embodiment and various modifications may be made without departing from the scope of the present technology.

For example, the present technology may take a cloud computing configuration that one function is shared by a plurality of devices via a network, and is processed collaboratively.

Each step described in the above-described flow charts may be executed in one device, or may be shared by and executed on a plurality of devices.

If one step includes a plurality of processes, a plurality of processes included in one step may be executed in one device, or may be shared by and executed on a plurality of devices.

For example, (the parity check matrix initial value table of) the above-described new LDPC code may be through the communication channel 13 (FIG. 7), any of which is a satellite circuit, a terrestrial wave, and a cable (wire circuit). Furthermore, the new LDPC code may be used for data transmission other than the digital broadcasting.

Effects described herein are not limited only to be illustrative, there may be effects other than those described herein.

DESCRIPTION OF REFERENCE NUMERALS 11 transmitting device
12 receiving device
23 parity interleaver
24 column twist interleaver
5 demultiplexer
31 memory
32 interchange unit
54 multiplexer
55 column twist interleaver
111 mode adaptation/multiplexer
112 padder
113 BB scrambler
114 BCH encoder
115 LDPC encoder
116 bit interleaver
117 mapper
118 time interleaver
119 SISO/MISO encoder
120 frequency interleaver
121 BCH encoder
122 LDPC encoder
123 mapper
124 frequency interleaver
131 frame builder & resource allocation
132 OFDM generation
151 OFDM processor
152 frame management
153 frequency deinterleaver
154 demapper
155 LDPC decoder
156 BCH decoder
161 frequency deinterleaver
162 SISO/MISO decoder
163 time deinterleaver
164 demapper
165 bit deinterleaver
166 LDPC decoder
167 BCH decoder
168 BB descrambler
169 null deletion
170 demultiplexer
300 edge data storage memory
301 selector
302 check node calculation unit
303 cyclic shift circuit
304 edge data storage memory
305 selector
306 received data memory
307 variable node calculation unit
308 cyclic shift circuit
309 decoded word calculation unit
310 received data rearrangement unit
311 decoded data rearrangement unit
601 encoding processor
602 storage unit
611 code rate set unit
612 initial value table read unit
613 parity check matrix generation unit
614 information bit read unit
615 encoding parity operation unit
616 controller
701 bus
702 CPU
703 ROM
704 RAM
705 hard disk
706 output unit
707 input unit
708 communication unit
709 drive
710 input/output interface
711 removable recording medium
1001 inverse interchange unit
1002 memory
1011 parity deinterleaver
1101 obtaining unit
1101 transmitting channel decoding processor
1103 information source decoding processor
1111 output unit
1121 record unit

The invention claimed is:

1. A transmitting device for generating a terrestrial digital television broadcast signal, the device decreasing a signal-to-noise power ratio per symbol for a selected bit error rate of the generated terrestrial digital television broadcast signal and/or expanding reception range of the terrestrial digital television broadcast signal at which the data is decodable by a receiving device for presentation to a user, the device comprising:
   circuitry configured to
      receive data to be transmitted in a terrestrial digital television broadcast signal;
      perform low density parity check (LDPC) encoding on input bits of the received data according to a parity check matrix of an LDPC code whose code length is 16200 bits and code rate is 8/15 to generate an LDPC code word, the LDPC code enabling error correction processing to correct errors generated in a transmission path of the terrestrial digital television broadcast signal, wherein the LDPC code word includes information bits and parity
bits, the parity bits being processed by the receiving
device to recover information bits corrupted by transmission path errors, the parity check matrix including an information matrix
part corresponding to the information bits and a parity
matrix part corresponding to the parity bits, the information matrix part being represented by a parity
check matrix initial value table, and the parity check matrix initial value table, having each
row indicating positions of elements '1' in corresponding 360 columns of the information matrix part as a
subset of information bits used in calculating the parity
bits in the LDPC encoding, is as follows 5 519 825 1871 2098 2478 2659 2820 3200 3294 3650
3804 3949 4426 4460 4503 4568 4590 4949 5219 5662
5738 5905 5911 6160 6404 6637 6708 6737 6814 7263
7412

81 391 1272 1633 2062 2882 3443 3503 3535 3908 4033
4163 4490 4929 5262 5399 5576 5768 5910 6331 6430
6844 6867 7201 7274 7290 7343 7350 7378 7387 7440
7554

105 975 3421 3480 4120 4444 5957 5971 6119 6617 6761
6810 7067 7353

6 138 485 1444 1512 2615 2990 3109 5604 6435 6513
6632 6704 7507

20 858 1051 2539 3049 5162 5308 6158 6391 6604 6744
7071 7195 7238

1140 5838 6203 6748

6282 6466 6481 6638

2346 2592 5436 7487

2219 3897 5896 7528

2897 6028 7018

1285 1863 5324

3075 6005 6466

5 6020 7551

2121 3751 7507

4027 5488 7542

2 6012 7011

3823 5531 5687

1379 2262 5297

1882 7498 7551

3749 4806 7227

2 2074 6898

17 616 7482

9 6823 7480

5195 5880 7559; and a terrestrial broadcast transmitter configured to transmit
the digital television broadcast signal including the
LDPC code word.

2. The transmitting device according to claim 1, wherein if a row of the parity check matrix initial table is represented by i and a parity length of the LDPC code word is represented by M, a 2+360×(i−1)-th column of the parity check matrix is obtained by a cyclic shift of a 1+360×(i−1)-th column of the parity check matrix indicating a position of an element 1 in the parity check matrix initial value table downward by q=M/360.

3. The transmitting device according to claim 1, wherein for the 1+360×(i−1)-th column of the parity check matrix,
an i-th row of the parity check matrix initial value table represents a row number of an element 1 of the 1+360× (i−1)-th column of the parity check matrix, and
for each column from the 2+360×(i−1)-th column to a 360×i-th column being a column other than the 1+360× (i−1)-th column of the parity check matrix, if an i-th row, j-th column value of the parity check matrix initial value table is represented as $h_{i,j}$ and a row number of a j-th element 1 of a w-th column of the parity check matrix H is represented as $H_{w-j}$, a row number $H_{w-j}$ of an element 1 of the w-th column being the column other than the 1+360×(i−1)-th column of the parity check matrix is represented by equation $H_{w-j} = \mod\{h_{i,j} + \mod((w-1), 360) \times M/360, M\}$.

4. The transmitting device according to claim 1, further comprising a parity interleaver configured to interleave only parity bits of the LDPC code word.

5. The transmitting device according to claim 1, wherein the parity check matrix has no cycle-4.

6. The transmitting device according to claim 1, wherein the parity check matrix of the LDPC code belongs to an ensemble in which a performance threshold being signal power/noise power at which a bit error rate starts to decrease is a predetermined value or smaller is found by multi-edge type density evolution.

7. A method for generating a terrestrial digital television broadcast signal, the method decreasing a signal-to-noise power ratio per symbol for a selected bit error rate of the generated terrestrial digital television broadcast signal and/or expanding reception range of the terrestrial digital television broadcast signal at which the data is decodable by a receiving device for presentation to a user, the method comprising:

receiving data to be transmitted in a terrestrial digital television broadcast signal;

performing low density parity check (LDPC) encoding, in an LDPC encoding circuitry, on input bits of the received data according to a parity check matrix of an LDPC code whose code length is 16200 bits and code rate is 8/15 to generate an LDPC code word, the LDPC code enabling error correction processing to correct errors generated in a transmission path of the terrestrial digital television broadcast signal, wherein the LDPC code word includes information bits and parity bits, the parity bits being processed by the receiving device to recover information bits corrupted by transmission path errors, the parity check matrix including an information matrix part corresponding to the information bits and a parity matrix part corresponding to the parity bits, the information matrix part being represented by a parity check matrix initial value table, and the parity check matrix initial value table, having each row indicating positions of elements '1' in corresponding 360 columns of the information matrix part as a subset of information bits used in calculating the parity bits in the LDPC encoding, is as follows 5 519 825 1871 2098 2478 2659 2820 3200 3294 3650
3804 3949 4426 4460 4503 4568 4590 4949 5219 5662
5738 5905 5911 6160 6404 6637 6708 6737 6814 7263
7412

81 391 1272 1633 2062 2882 3443 3503 3535 3908 4033
4163 4490 4929 5262 5399 5576 5768 5910 6331 6430
6844 6867 7201 7274 7290 7343 7350 7378 7387 7440
7554

105 975 3421 3480 4120 4444 5957 5971 6119 6617 6761
6810 7067 7353

6 138 485 1444 1512 2615 2990 3109 5604 6435 6513
6632 6704 7507

20 858 1051 2539 3049 5162 5308 6158 6391 6604 6744
7071 7195 7238

1140 5838 6203 6748

6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559; and
transmitting by a terrestrial broadcast transmitter, the digital television broadcast signal including the LDPC code word.

8. A receiving device for use in an environment where a signal-to-noise power ratio per symbol for a selected bit error rate of the received terrestrial digital television broadcast signal can be reduced and/or a reception range of a terrestrial digital television broadcast signal can be expanded, the receiving device comprising:
   a tuner configured to receive a terrestrial digital television broadcast signal including a low density parity check (LDPC) code word; and
   circuitry configured to:
      decode the LDPC code word; and
      process the decoded LDPC code word for presentation to a user, wherein
      input bits of data to be transmitted in the terrestrial digital television broadcast signal are LDPC encoded according to a parity check matrix initial value table of an LDPC code
      having a code length of 16200 bits and a code rate of 8/15 to generate the LDPC code word, the LDPC code enabling error correction processing to correct errors generated in a transmission path of the terrestrial digital television broadcast signal,
the LDPC code word includes information bits and a parity bits, the parity bits being processed by the receiving device to recover information bits corrupted by transmission path errors, and
the parity check matrix initial value table of the LDPC code according to which the input bits are LDPC encoded is as follows,
5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412
81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554
105 975 3421 3480 4120 4444 5957 5971 6119 6617 6761 6810 7067 7353
6 138 485 1444 1512 2615 2990 3109 5604 6435 6513 6632 6704 7507
20 858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

9. The receiving device according to claim 8, wherein
the LDPC code word is generated based on a parity check matrix of a LDPC code,
the parity check matrix includes an information matrix part corresponding to the information bits and a parity matrix part corresponding to the parity bits, the information matrix part being represented by the parity check matrix initial value table, and
the parity check matrix initial value table having each row indicating positions of elements '1' in corresponding 360 columns of the information matrix part as a subset of information bits used in calculating the parity bits in the LDPC encoding.

10. The receiving device according to claim 9, wherein if a row of the parity check matrix initial table is represented by i and a parity length of the LDPC code word is represented by M, a 2+360×(i−1)-th column of the parity check matrix is obtained by a cyclic shift of a 1+360×(i−1)-th column of the parity check matrix indicating a position of an element 1 in the parity check matrix initial value table downward by q=M/360.

11. The receiving device according to claim 9, wherein
for the 1+360×(i−1)-th column of the parity check matrix, an i-th row of the parity check matrix initial value table represents a row number of an element 1 of the 1+360×(i−1)-th column of the parity check matrix, and
for each column from the 2+360×(i−1)-th column to a 360×i-th column being a column other than the 1+360×(i−1)-th column of the parity check matrix,
   if an i-th row, j-th column value of the parity check matrix initial value table is represented as $h_{i,j}$ and a row number of a j-th element 1 of a w-th column of the parity check matrix H is represented as $H_{w-j}$,
   a row number $H_{w-j}$ of an element 1 of the w-th column being the column other than the 1+360×(i−1)-th column of the parity check matrix is represented by equation $H_{w-j}=\mod\{h_{i,j}+\mod((w-1), 360)\times M/360, M\}$.

12. The receiving device according to claim 9, wherein the parity check matrix has no cycle-4.

13. The receiving device according to claim 9, wherein the parity check matrix of the LDPC code belongs to an ensemble in which a performance threshold being signal power/noise power at which a bit error rate starts to decrease is a predetermined value or smaller is found by multi-edge type density evolution.

14. A method for use by a receiving device in an environment where a signal-to-noise power ratio per symbol for a selected bit error rate of a terrestrial digital television broadcast signal can be reduced and/or a reception range of a terrestrial digital television broadcast signal can be expanded, the method comprising:

receiving, by a tuner, a terrestrial digital television broadcast signal including a low density parity check (LDPC) code word;

decoding, by decoding circuitry, the LDPC code word; and processing the decoded LDPC code word for presentation to a user, wherein input bits of data to be transmitted in the terrestrial digital television broadcast signal are LDPC encoded according to a parity check matrix initial value table of an LDPC code having a code length of 16200 bits and a code rate of 8/15 to generate the LDPC code word, the LDPC code enabling error correction processing to correct errors generated in a transmission path of the terrestrial digital television broadcast signal, the LDPC code word includes information bits and parity bits, the parity bits being processed by the receiving device to recover information bits corrupted by transmission path errors, and the parity check matrix initial value table of the LDPC code according to which the input bits are LDPC encoded is as follows, 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412

81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554

105 975 3421 3480 4120 4444 5957 5971 6119 6617 6761 6810 7067 7353

6 138 485 1444 1512 2615 2990 3109 5604 6435 6513 6632 6704 7507

20 858 1051 2539 3049 5162 5308 6158 6391 6604 6744 7071 7195 7238

1140 5838 6203 6748

6282 6466 6481 6638

2346 2592 5436 7487

2219 3897 5896 7528

2897 6028 7018

1285 1863 5324

3075 6005 6466

5 6020 7551

2121 3751 7507

4027 5488 7542

2 6012 7011

3823 5531 5687

1379 2262 5297

1882 7498 7551

3749 4806 7227

2 2074 6898

17 616 7482

9 6823 7480

5195 5880 7559.

15. The method according to claim 14, wherein the LDPC code word is generated based on a parity check matrix of a LDPC code, the parity check matrix includes an information matrix part corresponding to the information bits and a parity matrix part corresponding to the parity bits, the information matrix part being represented by the parity check matrix initial value table, and the parity check matrix initial value table having each row indicating positions of elements '1' in corresponding 360 columns of the information matrix part as a subset of information bits used in calculating the parity bits in the LDPC encoding.

16. The method according to claim 15, wherein if a row of the parity check matrix initial table is represented by i and a parity length of the LDPC code word is represented by M, a $2+360\times(i-1)$-th column of the parity check matrix is obtained by a cyclic shift of a $1+360\times(i-1)$-th column of the parity check matrix indicating a position of an element 1 in the parity check matrix initial value table downward by $q=M/360$.

17. The method according to claim 15, wherein for the $1+360\times(i-1)$-th column of the parity check matrix, an i-th row of the parity check matrix initial value table represents a row number of an element 1 of the $1+360\times(i-1)$-th column of the parity check matrix, and for each column from the $2+360\times(i-1)$-th column to a $360\times i$-th column being a column other than the $1+360\times(i-1)$-th column of the parity check matrix, if an i-th row, j-th column value of the parity check matrix initial value table is represented as $h_{i,j}$ and a row number of a j-th element 1 of a w-th column of the parity check matrix H is represented as $H_{w-j}$, a row number $H_{w-j}$ of an element 1 of the w-th column being the column other than the $1+360\times(i-1)$-th column of the parity check matrix is represented by equation $H_{w-j}=\mod\{h_{i,j}+\mod((w-1), 360)\times M/360, M\}$.

18. The method according to claim 15, wherein the parity check matrix has no cycle-4.

19. The method according to claim 15, wherein the parity check matrix of the LDPC code belongs to an ensemble in which a performance threshold being signal power/noise power at which a bit error rate starts to decrease is a predetermined value or smaller is found by multi-edge type density evolution.

20. A non-transitory computer readable medium including computer executable instructions which, when executed by a computer, cause the computer to perform a method for use by a receiving device in an environment where a signal-to-noise power ratio per symbol for a selected bit error rate of a terrestrial digital television broadcast signal can be reduced and/or a reception range of a terrestrial digital television broadcast signal can be expanded, the method comprising:

receiving a terrestrial digital television broadcast signal including a low density parity check (LDPC) code word;

decoding the LDPC code word; and processing the decoded LDPC code word for presentation to a user, wherein input bits of data to be transmitted in the terrestrial digital television broadcast signal are LDPC encoded according to a parity check matrix initial value table of an LDPC code having a code length of 16200 bits and a code rate of 8/15 to generate the LDPC code word, the LDPC code enabling error correction processing to correct errors generated in a transmission path of the terrestrial digital television broadcast signal, wherein the LDPC code word includes information bits and parity bits, the parity bits being processed by the receiving device to recover information bits corrupted by transmission path errors, and the parity check matrix initial value table of the LDPC code according to which the input bits are LDPC encoded is as follows, 5 519 825 1871 2098 2478 2659 2820 3200 3294 3650 3804 3949 4426 4460 4503 4568 4590 4949 5219 5662 5738 5905 5911 6160 6404 6637 6708 6737 6814 7263 7412
81 391 1272 1633 2062 2882 3443 3503 3535 3908 4033 4163 4490 4929 5262 5399 5576 5768 5910 6331 6430 6844 6867 7201 7274 7290 7343 7350 7378 7387 7440 7554
105 975 3421 3480 4120 4444 5957 5971 6119 6617 6761 6810 7067 7353
6 138 485 1444 1512 2615 2990 3109 5604 6435 6513 6632 6704 7507
20 858 1051 2539 3049 5162 5308 6158 6391 6604 6744 7071 7195 7238
1140 5838 6203 6748
6282 6466 6481 6638
2346 2592 5436 7487
2219 3897 5896 7528
2897 6028 7018
1285 1863 5324
3075 6005 6466
5 6020 7551
2121 3751 7507
4027 5488 7542
2 6012 7011
3823 5531 5687
1379 2262 5297
1882 7498 7551
3749 4806 7227
2 2074 6898
17 616 7482
9 6823 7480
5195 5880 7559.

* * * * *